(12) United States Patent
Son et al.

(10) Patent No.: US 11,282,897 B2
(45) Date of Patent: Mar. 22, 2022

(54) DISPLAY DEVICE INCLUDING PHOTO CHROMIC MATERIAL IN LIGHT EMITTING LAYER

(71) Applicant: LG Display Co., Ltd., Seoul (KR)

(72) Inventors: YoungHoon Son, Paju-si (KR); JoonYoung Heo, Paju-si (KR); YongMin Park, Paju-si (KR); HyunMin Park, Paju-si (KR)

(73) Assignee: LG DISPLAY CO., LTD, Seoul (KR)

( * ) Notice: Subject to any disclaimer, the term of this patent is extended or adjusted under 35 U.S.C. 154(b) by 17 days.

(21) Appl. No.: 16/525,379

(22) Filed: Jul. 29, 2019

(65) Prior Publication Data
US 2020/0043987 A1    Feb. 6, 2020

(30) Foreign Application Priority Data
Jul. 31, 2018   (KR) .......................... 10-2018-0089113

(51) Int. Cl.
*H01L 27/32* (2006.01)
*H01L 51/52* (2006.01)
*H01L 51/50* (2006.01)

(52) U.S. Cl.
CPC ...... *H01L 27/3213* (2013.01); *H01L 51/5056* (2013.01); *H01L 51/5072* (2013.01); *H01L 51/5206* (2013.01); *H01L 51/5221* (2013.01)

(58) Field of Classification Search
CPC .......... H01L 27/32; H01L 51/50; H01L 51/52
See application file for complete search history.

(56) References Cited

U.S. PATENT DOCUMENTS

| | | | |
|---|---|---|---|
| 2007/0053202 A1* | 3/2007 | Sera ...................... | H01L 51/524 362/559 |
| 2007/0160778 A1* | 7/2007 | Matsumori ............ | C09K 19/02 428/1.2 |
| 2007/0200495 A1* | 8/2007 | Kai ...................... | H01L 27/3213 313/506 |
| 2010/0117519 A1* | 5/2010 | Begley ................ | H01L 51/0056 313/504 |
| 2010/0117936 A1* | 5/2010 | Lhee ................... | H01L 27/3211 345/76 |
| 2012/0235135 A1* | 9/2012 | Abe ....................... | C09K 11/06 257/40 |

(Continued)

FOREIGN PATENT DOCUMENTS

KR    2018-0045361 A    5/2018

OTHER PUBLICATIONS

Takagi et al., "Metal patterning using maskless vacuum evaporation process based on selective deposition of photochromic diarylethene", Applied Physics Letters, American Institute of Physics, ISSN 0003-6951, Year 2008, vol. 93, Issue 21, pp. 213304, Published Nov. 26, 2008.

(Continued)

*Primary Examiner* — Sheng-Bai Zhu
(74) *Attorney, Agent, or Firm* — Polsinelli PC

(57) ABSTRACT

A display device comprises a first substrate having a plurality of subpixels; a lower electrode disposed in each of the plurality of subpixels on the first substrate; a light emitting layer provided on the lower electrode; and an upper electrode disposed on the light emitting layer, wherein the light emitting layer includes a photoisomerized material.

27 Claims, 35 Drawing Sheets

(56) References Cited

U.S. PATENT DOCUMENTS

| | | | | |
|---|---|---|---|---|
| 2012/0242218 A1* | 9/2012 | Yoshinaga | ........... | H01L 27/3213 313/504 |
| 2014/0117338 A1* | 5/2014 | Cho | .................... | H01L 51/5044 257/40 |
| 2014/0120645 A1* | 5/2014 | Paek | ................... | H01L 27/3246 438/35 |
| 2014/0225118 A1* | 8/2014 | Uetake | .................. | H01L 27/322 257/72 |
| 2014/0326965 A1* | 11/2014 | Cho | .................... | H01L 27/3279 257/40 |
| 2014/0367653 A1* | 12/2014 | Sim | ..................... | H01L 51/5024 257/40 |
| 2015/0198807 A1* | 7/2015 | Hirai | .................... | G02B 27/017 345/8 |
| 2016/0247863 A1* | 8/2016 | Choung | .............. | H01L 27/3211 |
| 2017/0077193 A1* | 3/2017 | Li | ......................... | C09K 11/06 |
| 2018/0151824 A1* | 5/2018 | Park | ..................... | H01L 27/3206 |
| 2019/0181345 A1 | 6/2019 | Hwang et al. | | |

OTHER PUBLICATIONS

Tsujioka et al., "Light-controlled metal deposition on photochromic polymer films", Journal of materials chemistry, Royal Society of Chemistry, ISSN 0959-9428, Year 2010, vol. 20, Issue 43, pp. 9623-9627.

Nakamura et al., "Photochromism of diarylethene: Effect of polymer environment and effects on surfaces", Journal of photochemistry and photobiology. C, Photochemistry reviews. Amsterdam; Oxford : Elsevier, ISSN 1389-5567, Year 2011, vol. 12, Part 2, pp. 138-150.

\* cited by examiner

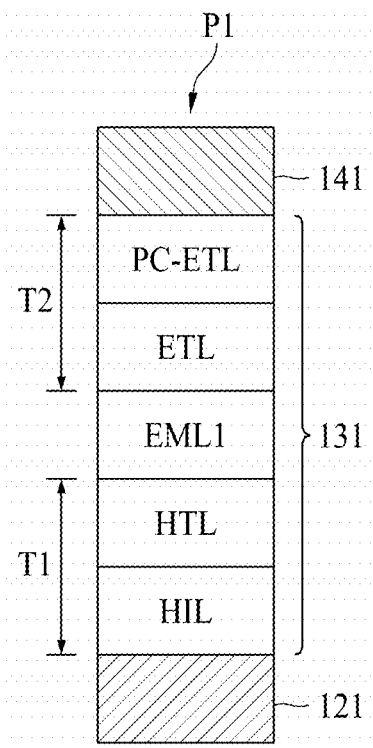

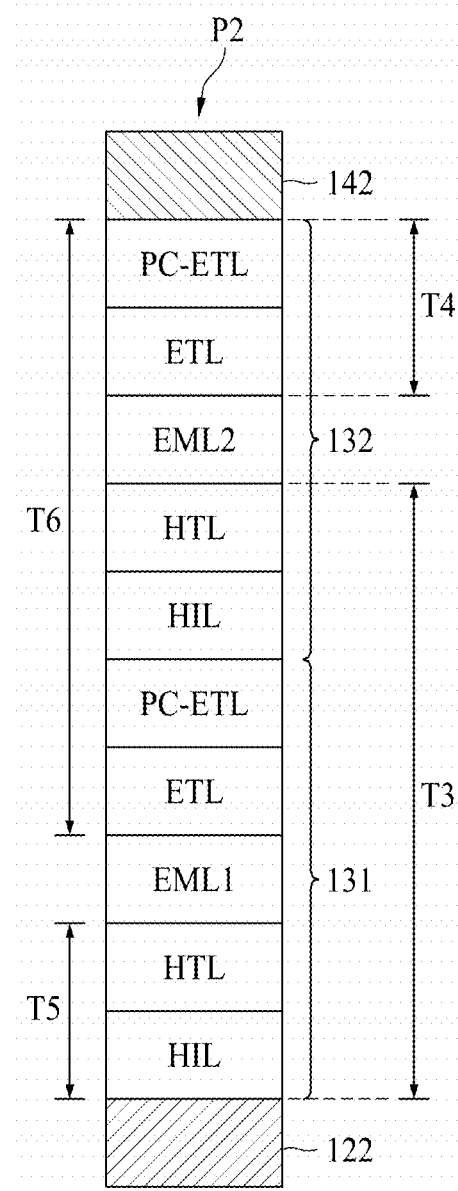

DISPLAY DEVICE INCLUDING PHOTO CHROMIC MATERIAL IN LIGHT EMITTING LAYER

CROSS REFERENCE TO RELATED APPLICATION

This application claims the priority of Korean Patent Application No. 10-2018-0089113, filed on Jul. 31, 2018, in the Korean Intellectual Property Office, which is hereby incorporated by reference in its entirety.

BACKGROUND

Field of the Disclosure

The present disclosure relates to a display device, and more particularly, to a display device, a head-mounted display device including the display device and a method for manufacturing the same.

Description of the Background

With the advancement of the information age, the demand for a display device for displaying an image has increased with various forms. Therefore, various types of display devices such as a non-self-light emitting display device including a liquid crystal display (LCD) device and a plasma display panel (PDP) device and an electroluminescence display device including an organic light emitting display (OLED) device and a quantum dot light emitting display (QLED) device have been recently used.

Among the display devices, the organic light emitting display device is a self-light emitting device, and has advantages in that a viewing angle and a contrast ratio are more excellent than those of the liquid crystal display (LCD) device. Also, since the organic light emitting display device does not require a separate backlight, it is advantageous that the organic light emitting display device is able to be thin and lightweight and has low power consumption. Furthermore, the organic light emitting display device has advantages in that it may be driven at a low direct current voltage, has a fast response speed, and especially has a low manufacturing cost.

The organic light emitting display device includes a plurality of light emitting diodes. Light emitting layers having their respective colors different from each other are formed to be patterned in the plurality of light emitting diodes. In the related art, the light emitting layers having their respective colors different from each other are formed to be patterned through a process using a fine metal mask (FMM) or photoresist. However, if the FMM is used, the metal mask is sagged due to its weight, whereby a problem occurs in that it is difficult to make an accurate deposition. Also, if a photoresist is used, a problem occurs in that a light emitting layer is damaged due to a solution process. This problem occurs more seriously in a display device, which has a compact pixel interval, such as a head mounted display (HMD) of ultra-high resolution.

SUMMARY

The present disclosure has been made in view of the above problems, and it is an object of the present disclosure to provide a display device that may prevent a light emitting layer and an upper electrode from being damaged.

The present disclosure to provide a display device in which a light emitting layer and an upper electrode may be provided to be accurately patterned.

In accordance with an aspect of the present disclosure, the above-described aspects can be accomplished by the provision of a display device comprising a first substrate having a plurality of subpixels, a lower electrode provided in each of the plurality of subpixels on the first substrate, a light emitting layer provided on the lower electrode and an upper electrode provided on the light emitting layer, wherein the light emitting layer includes a photoisomerized material.

In accordance with another aspect of the present disclosure, the above-described aspects can be accomplished by the provision of a method for manufacturing a display device comprising providing a first substrate having a plurality of subpixels, providing a lower electrode in each of the plurality of subpixels on the first substrate, providing a light emitting layer on the lower electrode, and providing an upper electrode on the light emitting layer, wherein the light emitting layer includes a photoisomerized material.

According to the present disclosure, since the light emitting layer includes a photoisomerized material, an upper electrode may selectively be deposited.

According to the present disclosure, light emitting layers emitting light of different colors and the upper electrode may be formed to be patterned even without FMM. Therefore, in the present disclosure, since sagging of the FMM is not generated, the light emitting layer and the upper electrode may be formed to be patterned accurately. Also, the cost caused by use and maintenance of the FMM may be reduced.

Also, in the present disclosure, light emitting layers emitting light of different colors and the upper electrode may be formed to be patterned even without photoresist. Therefore, in the present disclosure, the light emitting layer and the upper electrode may be prevented from being damaged during a manufacturing process, and lifespan and efficiency of a light emitting diode may be improved.

Also, in the present disclosure, since the upper electrode is formed to be patterned, its formation area may be minimized. Therefore, in the present disclosure, external light reflection by the upper electrode may be reduced, and parasitic capacitance generated between the upper electrode and another electrode layer may be reduced.

In addition to the effects of the present disclosure as mentioned above, additional objects and features of the present disclosure will be clearly understood by those skilled in the art from the following description of the present disclosure.

SCHEMATIC DESCRIPTION OF THE DRAWINGS

The above and other aspects, features and other advantages of the present disclosure will be more clearly understood from the following detailed description taken in conjunction with the accompanying drawings, in which:

FIGS. 14A to 14C are schematic views illustrating thicknesses of layers included in a pixel light emitting layer per subpixel;

DETAILED DESCRIPTION

Figure 1:
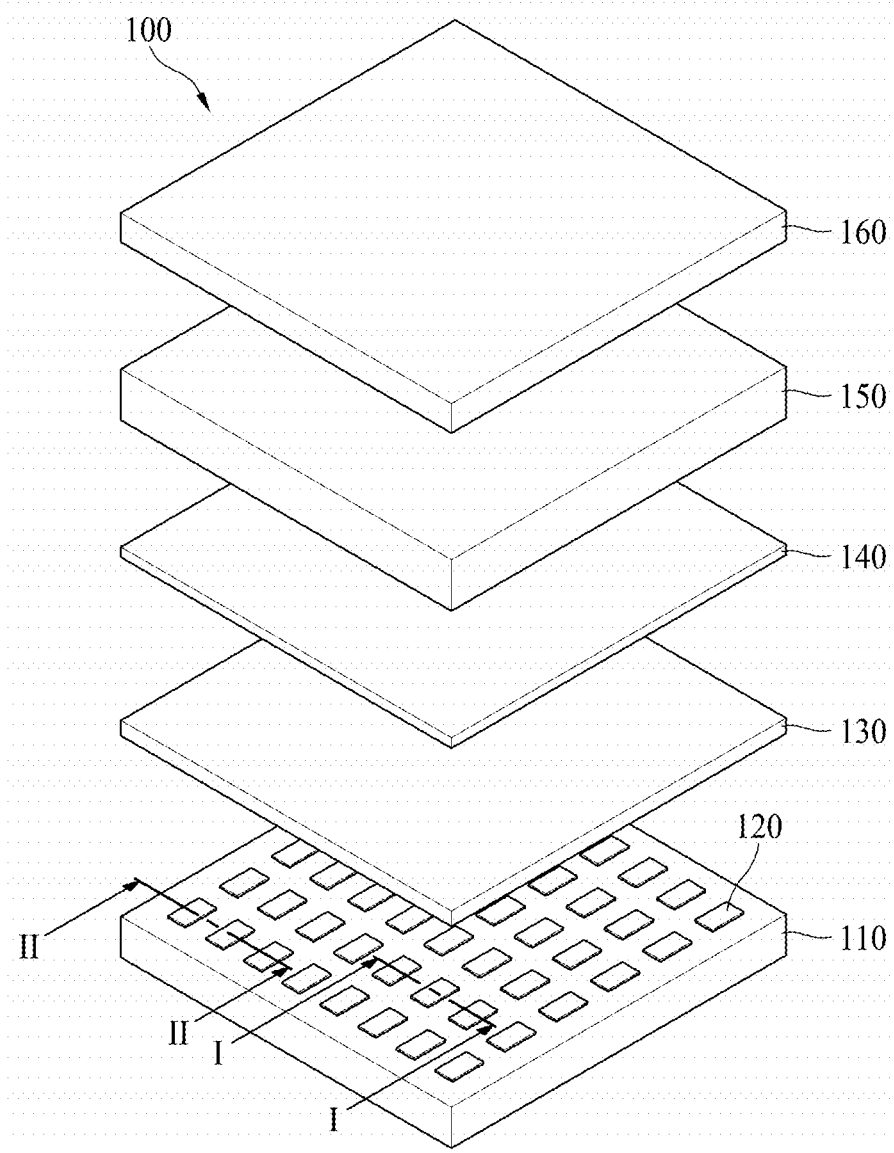
FIG. 1 is a perspective view illustrating a display device according to one aspect of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present disclosure.

In describing elements of the present disclosure, the terms "first", "second", etc. may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, the aspects of the display device according to the present disclosure will be described in detail with reference to the accompanying drawings. Wherever possible, the same reference numbers will be used throughout the drawings to refer to the same or like parts.

Figure 2:
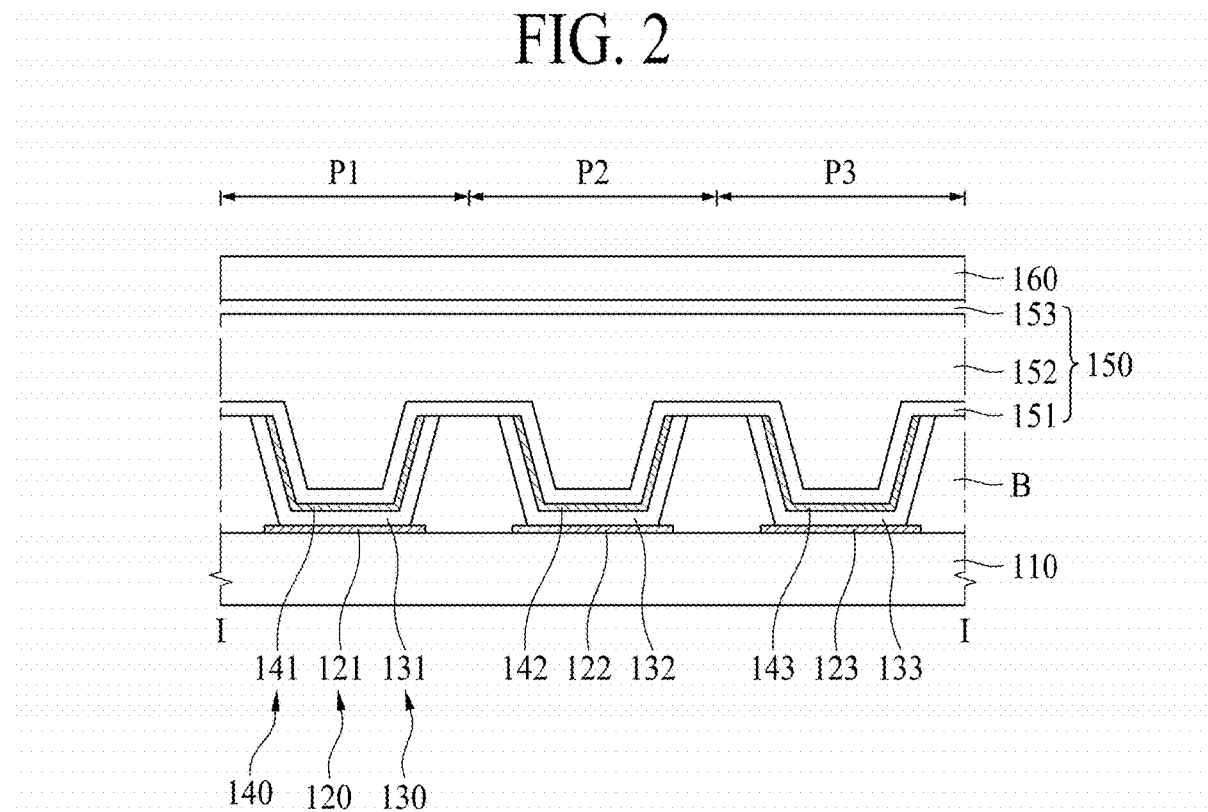
FIG. 2 is a cross-sectional view illustrating one example taken along line I-I of FIG. 1.
Figure 3:
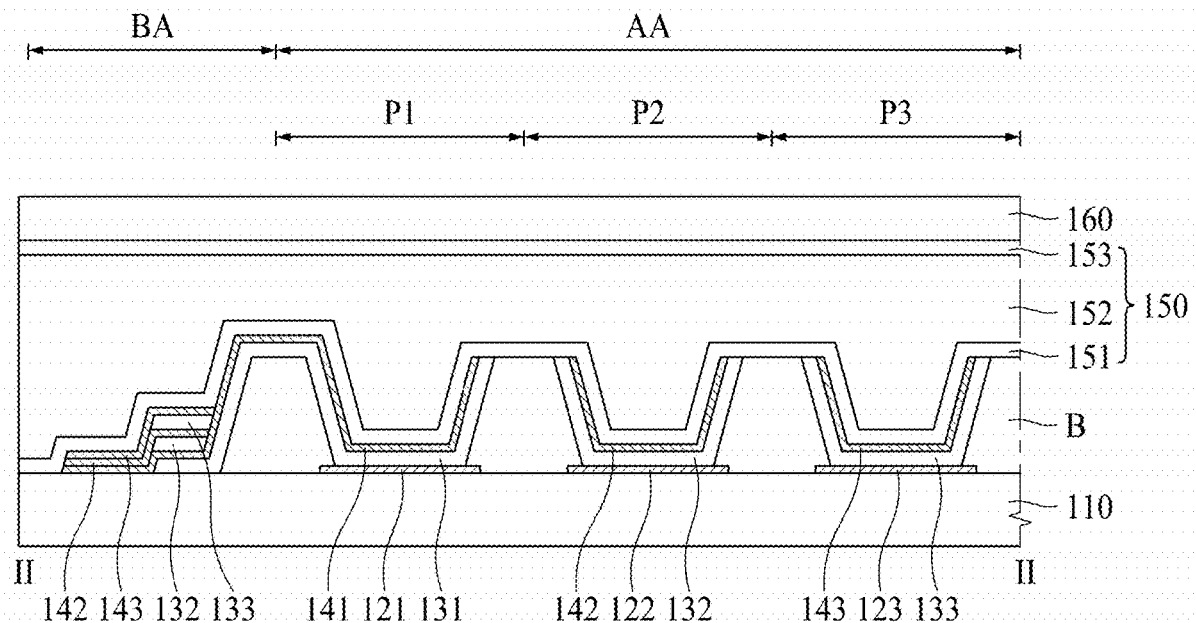
FIG. 3 is a cross-sectional view illustrating one example taken along line II-II of FIG. 1.
Figure 4:
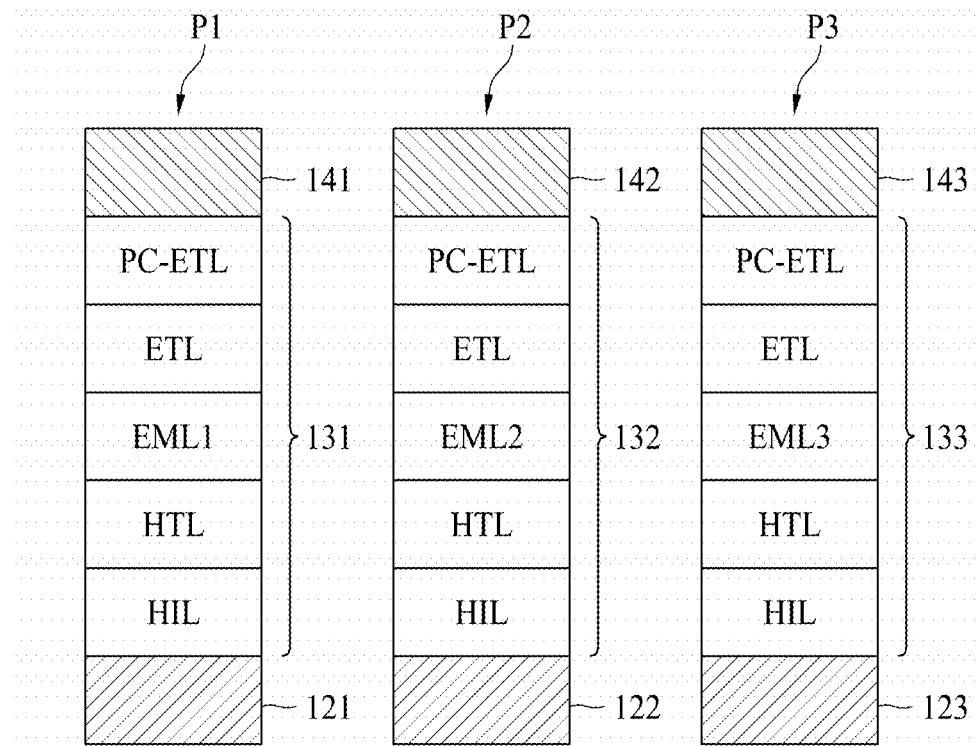
FIG. 4 is a schematic cross-sectional view illustrating an individual subpixel of FIGS. 2 and 3.

FIG. 1 is a perspective view illustrating a display device according to one aspect of the present disclosure, FIG. 2 is a cross-sectional view illustrating one example taken along line I-I of FIG. 1, FIG. 3 is a cross-sectional view illustrating one example taken along line II-II of FIG. 1, and FIG. 4 is a schematic cross-sectional view illustrating an individual subpixel of FIGS. 2 and 3.

Figure 5:
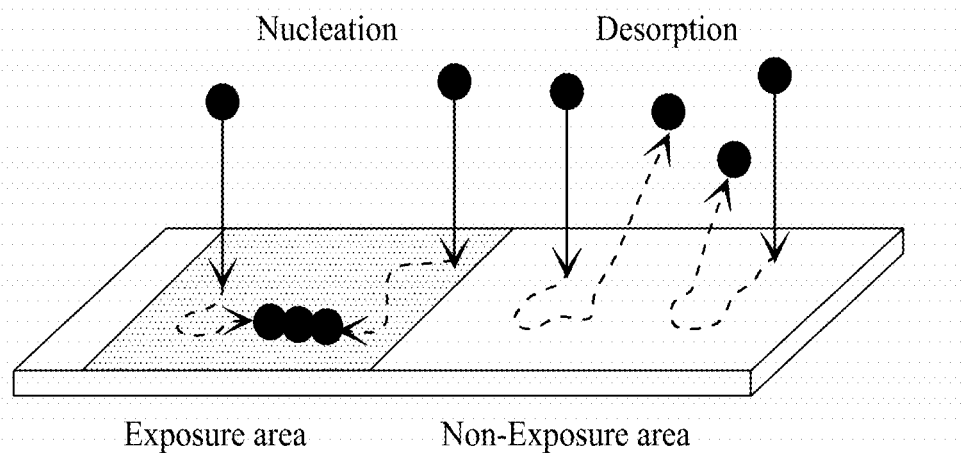
FIG. 5 is an exemplary view illustrating a case that a photoisomerized material is exposed to light and a case that photoisomerized material is not exposed to light.
Figure 6:
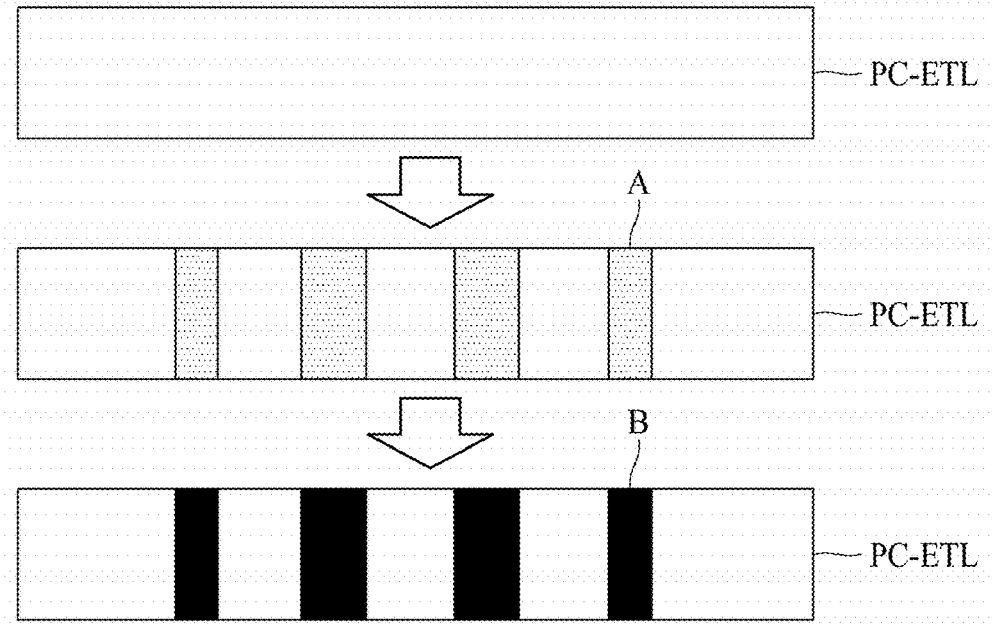
FIG. 6 is a view illustrating one example of metal patterning using a photoisomerized material.

FIG. 5 is an exemplary view illustrating a case that a photoisomerized material is exposed to light and a case that photoisomerized material is not exposed to light, and FIG. 6 is a view illustrating one example of metal patterning using a photoisomerized material.

Figure 7:
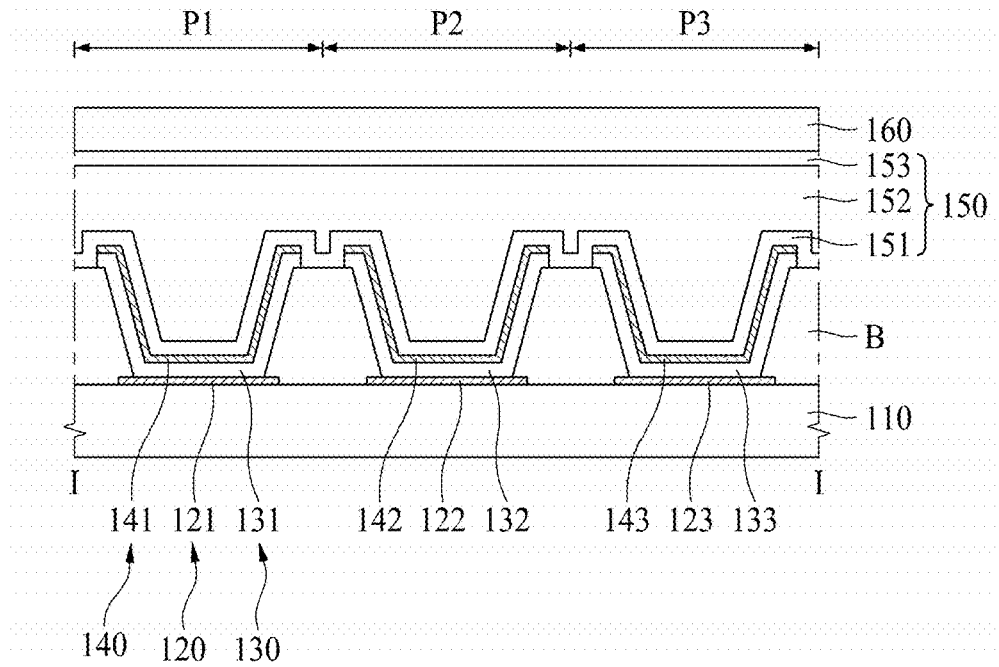
FIG. 7 is a cross-sectional view illustrating a modified example of FIG. 2.
Figure 8:
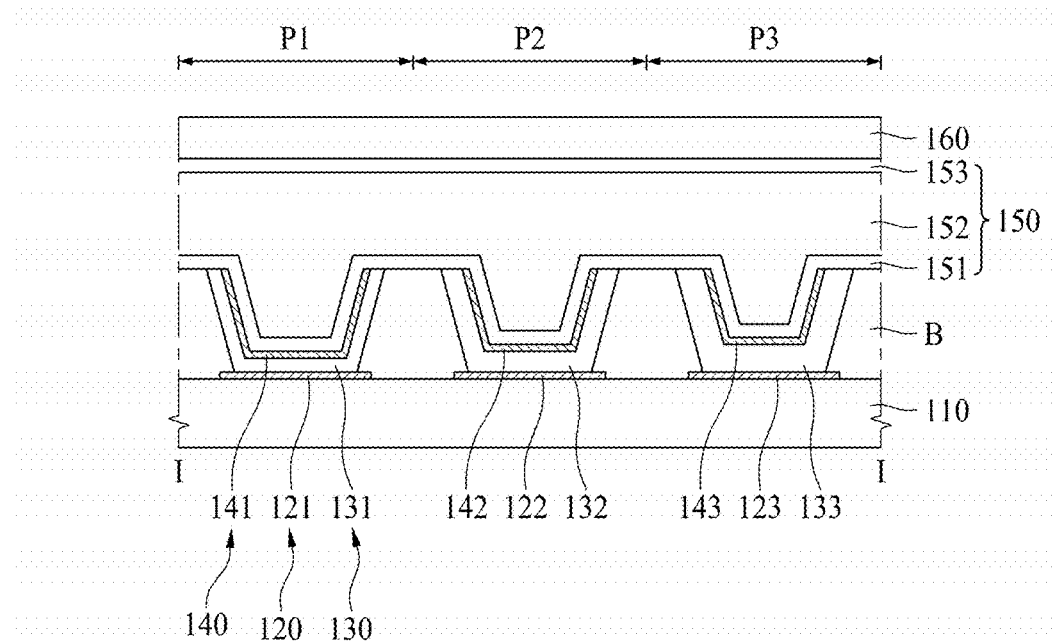
FIG. 8 is a cross-sectional view illustrating another modified example of FIG. 2.
Figure 9:
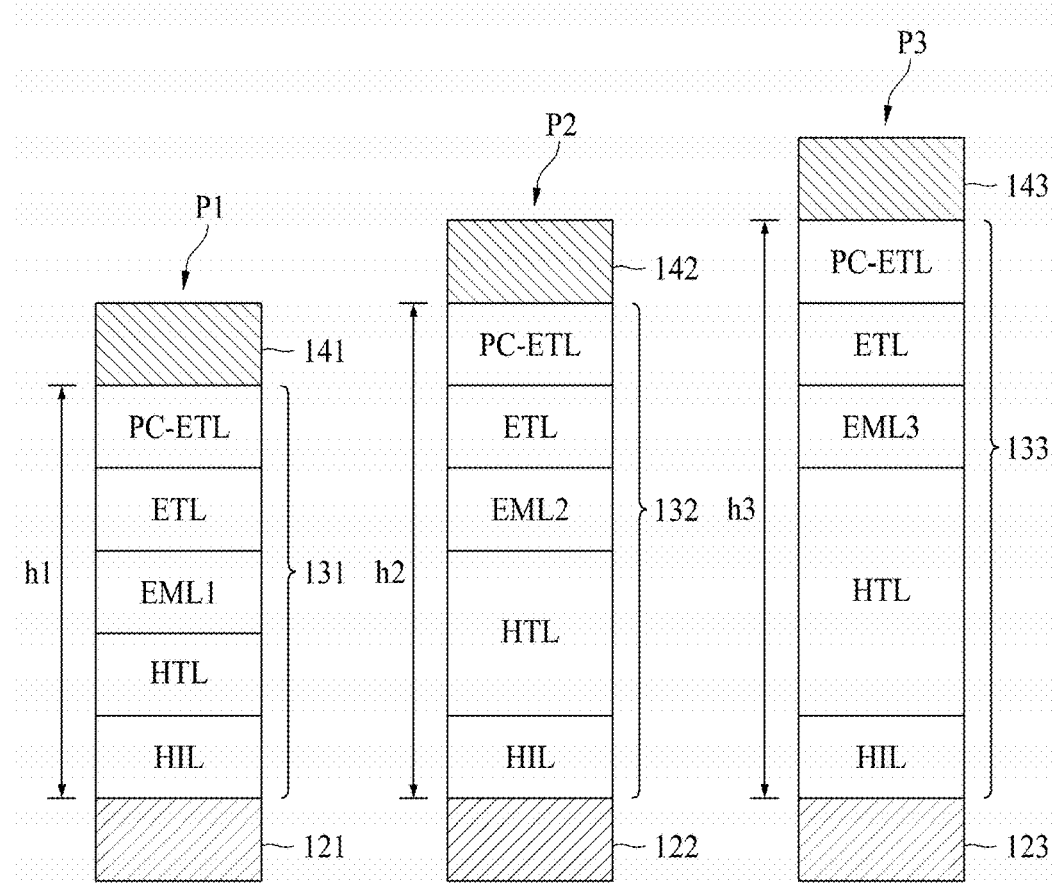
FIG. 9 is a schematic cross-sectional view illustrating an individual subpixel of FIG. 8.

FIG. 7 is a cross-sectional view illustrating a modified example of FIG. 2, FIG. 8 is a cross-sectional view illustrating another modified example of FIG. 2, and FIG. 9 is a schematic cross-sectional view illustrating an individual subpixel of FIG. 8.

Referring to FIGS. 1, 2 and 3, the display device 100 according to the first aspect of the present disclosure comprises a first substrate 110, a lower electrode 120, a light emitting layer 130, an upper electrode 140, an encapsulation layer 150, and a second substrate 160.

The first substrate 110 may be made of, but not limited to, a plastic film or glass substrate. The first substrate 110 may be made of a silicon wafer substrate formed using a semiconductor process. The first substrate 110 may be made of a transparent material or an opaque material. If the display device is provided in a bottom emission type in which light is emitted to a bottom portion, a transparent material may be used as the first substrate 110. If the display device is provided in a top emission type in which light is emitted to an upper portion, not only a transparent material but also an opaque material may be used as the first substrate 110.

The first substrate 110 may include gate lines, data lines, power lines, and transistors. The gate lines may be arranged to cross the data lines. The gate lines are connected to a gate driver and supplied with gate signals. The data lines are connected to a data driver and supplied with data voltages. The transistors include a switching transistor, a driving transistor, and a sensing transistor.

The switching transistor is switched in accordance with a gate signal supplied to the gate line, and serves to supply a data voltage supplied from the data line to the driving transistor.

The driving transistor is switched in accordance with the data voltage supplied from the switching transistor to generate a data current from a power source supplied from the power line and serves to supply the generated data current to the lower electrode 120.

The sensing transistor serves to sense a threshold voltage deviation of the driving transistor, which is a cause of image degradation.

An area where the lower electrode 120, the light emitting layer 130 and the upper electrode 140 are sequentially deposited may be defined as a subpixel P for emitting predetermined light. The subpixel P may include, but is not limited to, a first subpixel P1 for emitting blue (B) light, a second subpixel P2 for emitting green (G) light, and a third subpixel P3 for emitting red (R) light. The subpixel P may further include a subpixel for emitting white (W) light. Also, an arrangement sequence of the subpixels P1, P2 and P3 may be changed in various ways.

The lower electrode 120 includes a first lower electrode 121, a second lower electrode 122 and a third lower electrode 123, which are spaced apart from one another at a predetermined interval on the substrate 110. The first lower electrode 121 is formed to be patterned in the first subpixel P1, the second lower electrode 122 is formed to be patterned in the second subpixel P2, and the third lower electrode 123 is formed to be patterned in the third subpixel P3. Transistors (not shown) may be arranged in the first, second and third subpixels P1, P2 and P3, and supply a predetermined voltage to each of the first lower electrode 121, the second lower electrode 122 and the third lower electrode 123 in accordance with the data voltage of the data line if a gate signal from the gate line is input thereto.

The first, second and third lower electrodes 121, 122 and 123 are provided on the substrate 110. For example, the first, second and third lower electrodes 121, 122 and 123 may be formed to include a metal material of high reflectivity such as a deposited structure (Ti/Al/Ti) of aluminum and titanium, a deposited structure (ITO/Al/ITO) of aluminum and ITO, an APC alloy, and a deposited structure (ITO/APC/ITO) of APC alloy and ITO. The APC alloy is an alloy of silver (Ag), palladium (Pb), and Copper (Cu). Each of the first, second and third lower electrodes 121, 122 and 123 may be an anode. Each of the first, second and third lower electrodes 121, 122 and 123 may be connected with the driving transistor.

A bank B is provided on the substrate 110 to cover an edge of each of the first, second and third lower electrodes 121, 122 and 123, whereby a light emitting area of each of the first, second and third subpixels P1, P2 and P3 is defined. That is, an opening area where the bank B is not provided in each of the subpixels P1, P2 and P3 becomes a light emitting area. On the other hand, an area where the bank B is provided in each of the subpixels P1, P2 and P3 becomes a non-light emitting area.

The bank B is provided on the substrate 110 while covering an edge of each of the first, second and third lower electrodes 121, 122 and 123. Therefore, the first, second and third lower electrodes 121, 122 and 123 formed to be patterned for the subpixels P1, P2 and P3 may be insulated from one another by the bank B. Also, a problem that luminance efficiency is deteriorated due to a current concentrated on the end of each of the first, second and third lower electrodes 121, 122 and 123 may be solved.

The bank B may be formed of, but not limited to, an organic film such as acryl resin, epoxy resin, phenolic resin, polyamide resin, and polyimide resin.

The light emitting layer 130 is provided on the lower electrode 120. The light emitting layer 130 includes a first pixel light emitting layer 131, a second pixel light emitting layer 132 and a third pixel light emitting layer 133, which are formed to be patterned in the first, second and third subpixels P1, P2 and P3 to emit light of different colors.

In detail, the first pixel light emitting layer 131 is formed to be patterned on the first lower electrode 121 arranged in the first subpixel P1. The first pixel light emitting layer 131, as shown in FIG. 4, includes a hole transporting layer HTL, a first light generating layer EML1 for emitting light of a first color, a first electron transporting layer ETL, and a second photo chromic electron transporting layer PC-ETL. Therefore, the first subpixel P1 emits light of the first color. The first color may be, but not limited to, blue (B).

The second pixel light emitting layer 132 is formed to be patterned on the second lower electrode 122 arranged in the second subpixel P2. The second pixel light emitting layer 132, as shown in FIG. 4, includes a hole transporting layer HTL, a second light generating layer EML2 for emitting light of a second color different from the first color, a first electron transporting layer ETL, and a second photo chromic electron transporting layer PC-ETL. Therefore, the second subpixel P2 emits light of the second color. The second color may be, but not limited to, green (G).

The third pixel light emitting layer 133 is formed to be patterned on the third lower electrode 123 arranged in the third subpixel P3. The third pixel light emitting layer 133, as shown in FIG. 4, includes a hole transporting layer HTL, a third light generating layer EML3 for emitting light of a third color different from the first and second colors, a first electron transporting layer ETL, and a second photo chromic electron transporting layer PC-ETL. Therefore, the third subpixel P3 emits light of the third color. The third color may be, but not limited to, red (R).

The hole transporting layer HTL included in each of the first pixel light emitting layer 131, the second pixel light emitting layer 132 and the third pixel light emitting layer 133 serves to smoothly transfer holes to each of the first light generating layer EML1, the second light generating layer EML2 and the third light generating layer EML3.

The first electron transporting layer ETL included in each of the first pixel light emitting layer 131, the second pixel light emitting layer 132 and the third pixel light emitting layer 133 serves to smoothly transfer electrons to each of the first light generating layer EML1, the second light generating layer EML2 and the third light generating layer EML3.

The second photo chromic electron transporting layer PC-ETL included in each of the first pixel light emitting layer 131, the second pixel light emitting layer 132 and the third pixel light emitting layer 133 serves to smoothly transfer electrons to each of the first light generating layer EML1, the second light generating layer EML2 and the third light generating layer EML3. Also, the second photo chromic electron transporting layer PC-ETL serves to allow the upper electrode 140 to be formed to be patterned for each of the subpixels P1, P2 and P3. To this end, the second photo chromic electron transporting layer PC-ETL includes an electron transporting material and a photoisomerized material.

The electron transporting material is a material that smoothly moves electrons to the first light generating layer EML1, the second light generating layer EML2 and the third light generating layer EML3. For example, the electron transporting material may include at least any one selected from a group made of Alq3, PBD, TAZ, spiro-PBD, BAlq, Liq (lithium quinolate), BMB-2T, BMB-3T, PF-6P, TPBI, COT and SAlq.

The electron transporting material may also be included in the first electron transporting layer ETL. The first electron transporting layer ETL and the second photo chromic electron transporting layer PC-ETL may include their respective electron transporting materials different from each other, or may include the same electron transporting material. As the case may be, the first electron transporting layer ETL may be omitted. In this case, the second photo chromic electron transporting layer PC-ETL is not be doped with an n type dopant, and the light emitting layer 130 may further include a separate charge generating layer CGL provided between the first pixel light emitting layer 131 and the second pixel light emitting layer 132 and between the second pixel light emitting layer 132 and the third pixel light emitting layer 133.

The photoisomerized material is a material changed to an isomer having another physical or chemical characteristic if it is exposed to light such as UV, and for example, may be a photo chromic. The photo chromic is a material, of which color is changed if it is exposed to light such as UV returns to an original color if light is shielded. For example, the photo chromic may include a diarylethene based compound.

For example, the second photo chromic electron transporting layer PC-ETL may have a chemical structure as expressed in the following chemical formula 3 by combining a photoisomerized material including the following chemical formula 1 and an electron transporting material including the following chemical formula 2.

[Chemical formula 1]

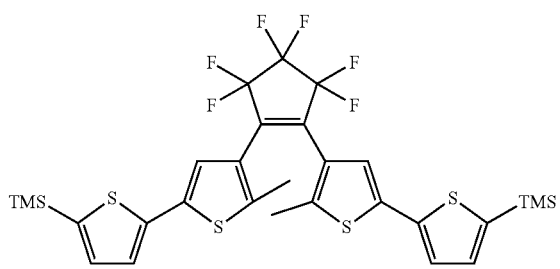

[Chemical formula 2]

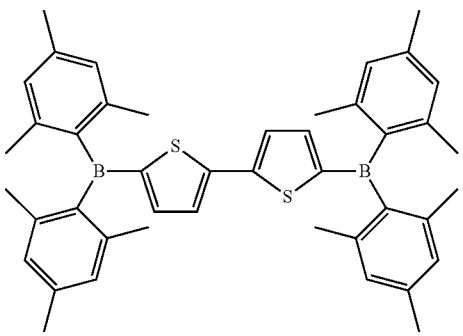

BMB-2T

[Chemical formula 3]

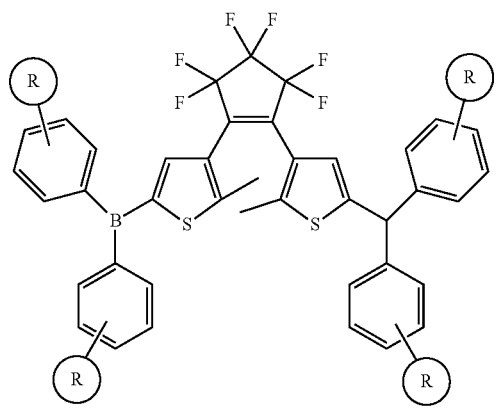

The photoisomerized material has a deposition rate of a metal material, which is varied depending on whether it is exposed to light. In detail, the photoisomerized material to which UV has been irradiated is subjected to nucleation as shown in FIG. 5 and thus has a high deposition rate of a metal material. That is, a metal material may well be deposited on the photoisomerized material to which UV has been irradiated. On the other hand, the photoisomerized material to which UV has not been irradiated is subjected to desorption as shown in FIG. 5 and thus has a low deposition rate of a metal material. That is, a metal material may not be well deposited on the photoisomerized material to which UV has not been irradiated.

In the display device according to one aspect of the present disclosure, metal may selectively be patterned using characteristic of the photoisomerized material. Referring to FIG. 6, first of all, a second photo chromic electron transporting layer PC-ETL including a photoisomerized material is prepared. Then, UV is irradiated to a specific area A of the second photo chromic electron transporting layer PC-ETL including a photoisomerized material. Then, if a metal material B is deposited on the second photo chromic electron transporting layer PC-ETL including a photoisomerized material, as shown in FIG. 6, the metal material B may be deposited on only the specific area A to which UV is irradiated.

The second photo chromic electron transporting layer PC-ETL may be doped with an n-type dopant.

Meanwhile, each of the first, second and third subpixels P1, P2 and P3 may further include a hole injection layer HIL between the lower electrodes 121, 122 and 123 and the hole transporting layer HTL. At this time, the hole injection layer HIL may be doped with a p-type dopant to improve mobility.

On the display area AA where the first, second and third subpixels P1, P2 and P3 are arranged, as shown in FIGS. 2 and 3, the first, second and third pixel light emitting layers 131, 132 and 133 are spaced apart from one another.

On the other hand, in a bezel area BA, as shown in FIG. 3, the first, second and third pixel light emitting layers 131, 132 and 133 are overlapped with one another. In detail, in a portion of the bezel area BA, the first, second and third upper electrodes 141, 142 and 143 are overlapped with the first, second and third pixel light emitting layers 131, 132 and 133. In a portion of the bezel area BA, the first upper electrode 141 may be provided between the first and second pixel light emitting layers 131 and 132, the second upper electrode 142 may be provided between the second and third pixel light emitting layers 132 and 133, and the third upper electrode 143 may be provided on the third pixel light emitting layer 133.

The upper electrode 140 is provided on the light emitting layer 130. The upper electrode 140 includes the first upper electrode 141, the second upper electrode 142 and the third upper electrode 143, which are respectively formed to be patterned in the first, second and third subpixels P1, P2 and P3.

In detail, the first upper electrode 141 is formed to be patterned on the first pixel light emitting layer 131 arranged in the first subpixel P1. The first upper electrode 141 may be formed in such a manner that UV is irradiated to the first pixel light emitting layer 131 arranged in the first subpixel P1, especially the second photo chromic electron transporting layer PC-ETL and then a metal material is deposited thereon after the first pixel light emitting layer 131 is formed on the lower electrode 120. Therefore, the first upper electrode 141 is formed to be patterned on only the first pixel light emitting layer 131 arranged in the first subpixel P1. At this time, since the first upper electrode 141 is formed to adjoin the second photo chromic electron transporting layer PC-ETL of the first pixel light emitting layer 131, the first upper electrode 141 may have the same formation area as that of the second photo chromic electron transporting layer PC-ETL of the first pixel light emitting layer 131 in the display area AA.

The second upper electrode 142 is formed to be patterned on the second pixel light emitting layer 132 arranged in the second subpixel P2. The second upper electrode 142 may be formed in such a manner that UV is irradiated to the second pixel light emitting layer 132 arranged in the second subpixel P2, especially the second photo chromic electron transporting layer PC-ETL and then a metal material is deposited thereon after the second pixel light emitting layer 132 is formed on the lower electrode 120. Therefore, the second upper electrode 142 is formed to be patterned on only the second pixel light emitting layer 132 arranged in the second subpixel P2. At this time, since the second upper electrode 142 is formed to adjoin the second photo chromic electron transporting layer PC-ETL of the second pixel light emitting layer 132, the second upper electrode 142 may have the same formation area as that of the second photo chromic electron transporting layer PC-ETL of the second pixel light emitting layer 132 in the display area AA.

The third upper electrode 143 is formed to be patterned on the third pixel light emitting layer 133 arranged in the third subpixel P3. The third upper electrode 143 may be formed in such a manner that UV is irradiated to the third pixel light emitting layer 133 arranged in the third subpixel P3, especially the second photo chromic electron transporting layer PC-ETL and then a metal material is deposited thereon after the third pixel light emitting layer 133 is formed on the lower electrode 120. Therefore, the third upper electrode 143 is formed to be patterned on only the third pixel light emitting layer 133 arranged in the third subpixel P3. At this time, since the third upper electrode 143 is formed to adjoin the second photo chromic electron transporting layer PC-ETL of the third pixel light emitting layer 133, the third upper electrode 143 may have the same formation area as that of the second photo chromic electron transporting layer PC-ETL of the third pixel light emitting layer 133 in the display area AA.

Meanwhile, in the display area AA where the first, second and third subpixels P1, P2 and P3 are arranged, as shown in FIGS. 2 and 3, the first, second and third upper electrodes 141, 142 and 143 are spaced apart from one another.

On the other hand, in the bezel area BA, as shown in FIG. 3, the first, second and third upper electrodes 141, 142 and 143 are overlapped with one another. In detail, in a portion of the bezel area BA, the first, second and third upper electrodes 141, 142 and 143 are overlapped with the first, second and third pixel light emitting layers 131, 132 and 133. In a portion of the bezel area BA, the first pixel light emitting layer 131 may be provided below the first upper electrode 141, the second pixel light emitting layer 132 may be provided between the first and second upper electrodes 141 and 142, and the third pixel light emitting layer 133 may be provided between the second and third upper electrodes 142 and 143. This is because that the first, second and third pixel light emitting layers 131, 132 and 133 as well as the first, second and third upper electrodes 141, 142 and 143 are provided to be wider than the display area AA.

Also, the first, second and third upper electrodes 141, 142 and 143 are provided to be wider than the first, second and third pixel light emitting layers 131, 132 and 133, whereby only the first, second and third upper electrodes may be overlapped with one another in another portion of the bezel area BA. Therefore, the first, second and third upper electrodes 141, 142 and 143 may electrically be connected with one another in the bezel area BA.

The first, second and third upper electrodes 141, 142 and 143 may be formed of a transparent conductive material (TCO) such as ITO and IZO, which can transmit light, or may be formed of a semi-transmissive conductive material such as Mg, Ag, or Alloy of Mg and Ag.

The encapsulation layer 150 may be provided to cover the upper electrode 140. The encapsulation layer 150 serves to prevent oxygen or water from being permeated into the light emitting layer 130 and the upper electrode 140. To this end, the encapsulation layer 150 may include at least one inorganic film and at least one organic film.

In detail, the encapsulation layer 150 may include a first inorganic film 151 and an organic film 152. In one aspect, the encapsulation layer 150 may further include a second inorganic film 153.

The first inorganic film 151 is provided to cover the upper electrode 140. The organic film 152 is provided on the first inorganic film 151. The organic film 152 may be provided at a length long enough to prevent particles from being permeated into the light emitting layer 130 and the upper electrode 140 by passing through the first inorganic film 151. The second inorganic film 153 is provided to cover the organic film 152.

Each of the first and second inorganic films 151 and 153 may be formed of a silicon nitride, an aluminum nitride, a zirconium nitride, a titanium nitride, a hafnium nitride, a tantalum nitride, a silicon oxide, an aluminum oxide, or a titanium oxide. The first and second inorganic films 151 and 153 may be deposited by, but not limited to, a Chemical Vapor Deposition (CVD) method or an Atomic Layer Deposition (ALD) method.

The organic film 152 may be formed of acrylic resin, epoxy resin, phenolic resin, polyamide resin, or polyimide resin.

The second substrate 160 may be an encapsulation substrate, or may be a plastic film, a glass substrate, or an encapsulation film.

In the display device 100 according to the first aspect of the present disclosure shown in FIGS. 2 and 3, the light emitting layer 130 and the upper electrode 140 are only provided on, but not limited to, an upper surface of the lower electrode 120 and a side of the bank B.

In another aspect, the light emitting layer 130 and the upper electrode 140, as shown in FIG. 7, may be provided on an upper surface of the lower electrode 120 and a side and a portion of an upper surface of the bank B. This structure may be applied to the other aspects which will be described later.

In more detail, the first pixel light emitting layer 131 and the first upper electrode 141 may be provided on an upper surface of the first lower electrode 121 and a side and a portion of an upper surface of the bank B. The second pixel light emitting layer 132 and the second upper electrode 142 may be provided on an upper surface of the second lower electrode 122 and a side and a portion of an upper surface of the bank B. The third pixel light emitting layer 133 and the third upper electrode 143 may be provided on an upper surface of the third lower electrode 123 and a side and a portion of an upper surface of the bank B.

The first, second and third pixel light emitting layers 131, 132 and 133 may cover a portion of the upper surface of the bank B within the range that they are spaced apart from one another. The first, second and third upper electrodes 141, 142 and 143 may also cover a portion of the upper surface of the bank B within the range that they are spaced apart from one another.

As described above, although the upper electrode 141 may be arranged on only the light emitting area overlapped with the lower electrode 120 and the light emitting layer 130, the upper electrode 141 can be provided to cover a portion of the upper surface of the bank B in consideration of an error of a manufacturing process.

Also, in the display device 100 according to the first aspect of the present disclosure shown in FIGS. 2 and 3, the first, second and third pixel light emitting layers 131, 132 and 133 are provided with, but not limited to, the same thickness.

In another aspect, the first, second and third pixel light emitting layers 131, 132 and 133 may have their respective thicknesses different from one another to embody micro cavity characteristic. At this time, in order to embody the micro cavity characteristic, the lower electrode 120 may include a metal material having high reflectivity, and the upper electrode 140 may include a semi-transmissive metal material.

A portion of light emitted from the light emitting layer 130 transmits the upper electrode 140 but the other portion of light emitted from the light emitting layer 130 is reflected by the upper electrode 140 and then re-reflected by the lower electrode 120, whereby the light proceeds to the upper electrode 140. In this way, as reflection and re-reflection are repeated between the upper electrode 140 and the lower electrode 120, an image may be displayed by the light that has transmitted the upper electrode 140. At this time, if distances h1, h2 and h3 between the upper electrode 140 and the lower electrode 120 reach an integer multiple of a half wavelength $\lambda/2$ of light emitted from each of the subpixels P1, P2 and P3, reinforcing interference occurs to amplify light. If the reflection and re-reflection are repeated as above, an amplified level of light may continuously be increased to improve external extraction efficiency of light. This characteristic is referred to as the micro cavity characteristic.

The third distance h3 between the third lower electrode 123 and the third upper electrode 143 in the third subpixel P3 for emitting red (R) light of a long wavelength range, the second distance h2 between the second lower electrode 122 and the second upper electrode 142 in the second subpixel P2 for emitting green (G) light of an intermediate wavelength range, and the first distance h1 between the first lower electrode 121 and the first upper electrode 141 in the first subpixel P1 for emitting blue (B) light of a short wavelength range may be provided differently from one another.

In the display device 100 according to the first aspect of the present disclosure, the first, second and third pixel light emitting layers 131, 132 and 133 are formed to be patterned. Therefore, in the display device 100 according to the first aspect of the present disclosure, the first, second and third pixel light emitting layers 131, 132 and 133 are provided at their respective thicknesses different from one another, whereby the first, second and third distances h1, h2 and h3 may be provided differently from one another. For example, as shown in FIG. 9, the first, second and third distances h1, h2 and h3 may be provided differently from one another by adjusting the thickness of the hole transporting layer HTL included in each of the first, second and third pixel light emitting layers 131, 132 and 133. However, the first, second and third distances h1, h2 and h3 are not limited to this example.

The display device 100 described as above may improve light efficiency by embodying the micro cavity characteristic in the first, second and third subpixels P1, P2 and P3.

Figure 10A:
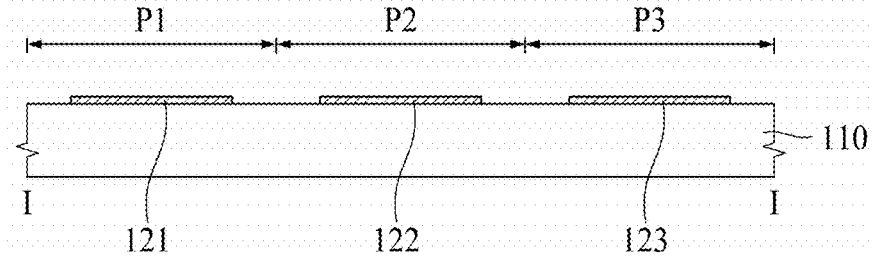
FIGS. 10A to 10O are cross-sectional views illustrating a manufacturing method of a display device according to the first aspect of the present disclosure.
Figure 10B:
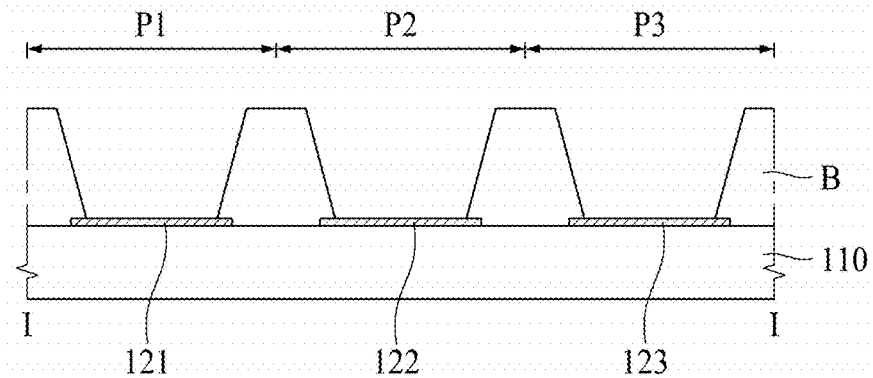
Figure 10C:
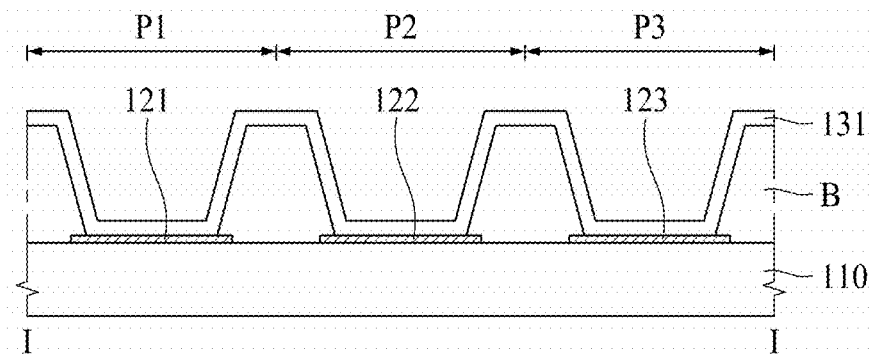
Figure 10D:
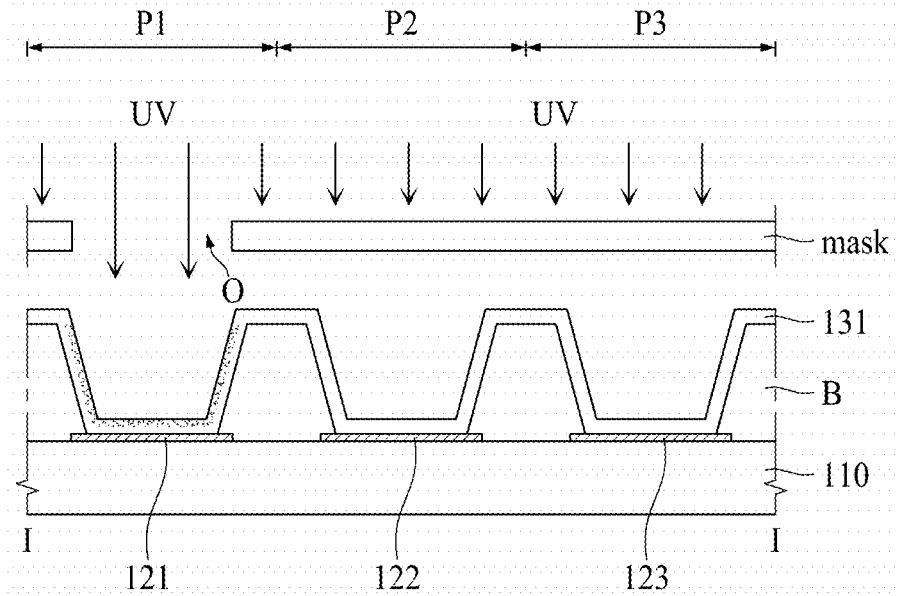
Figure 10E:
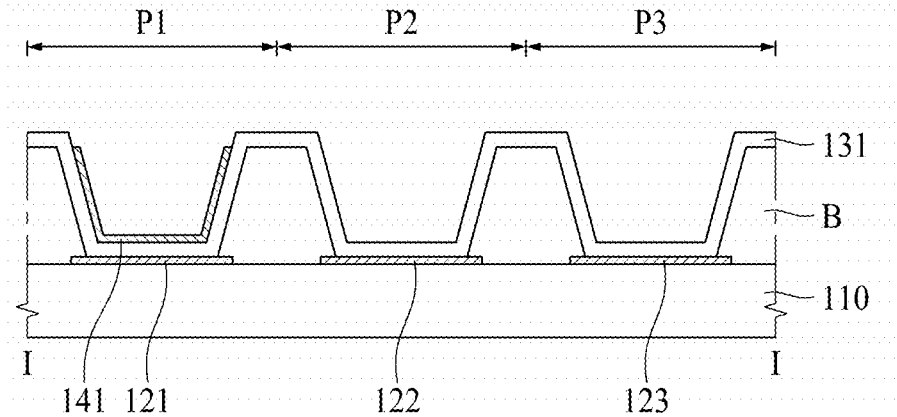
Figure 10F:
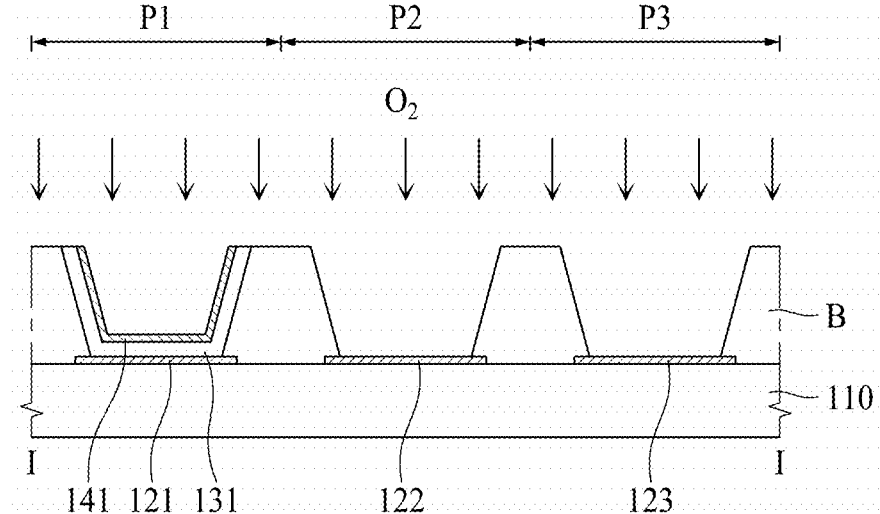
Figure 10G:
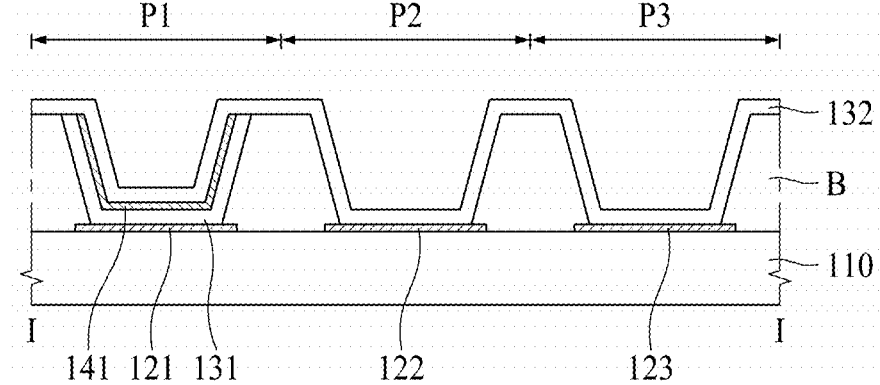
Figure 10H:
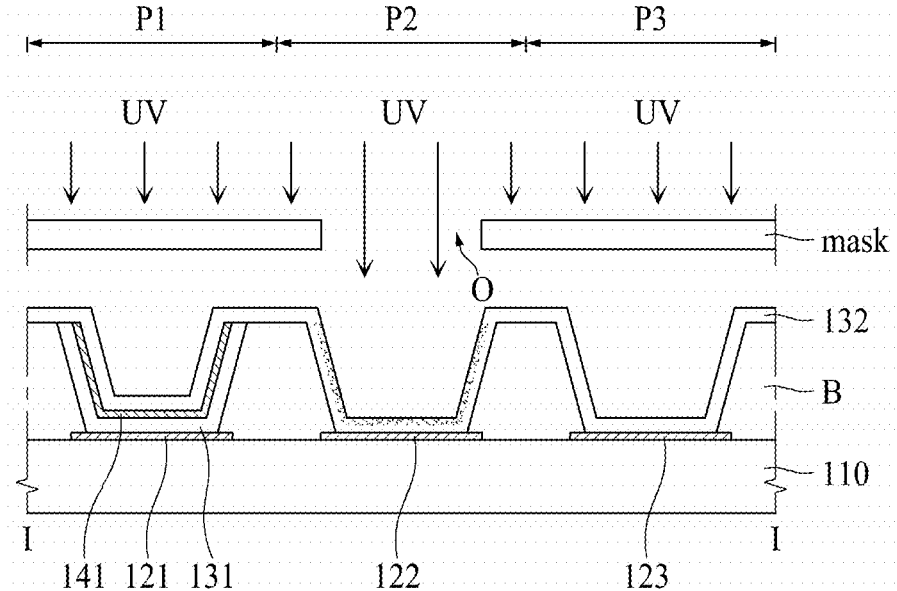
Figure 10I:
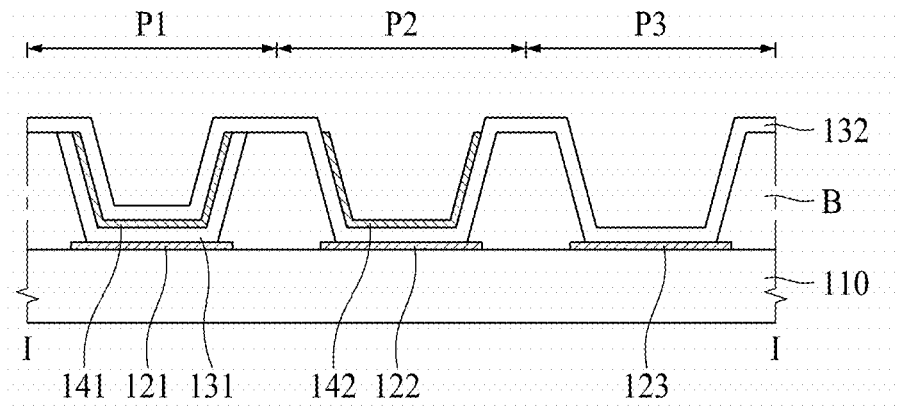
Figure 10J:
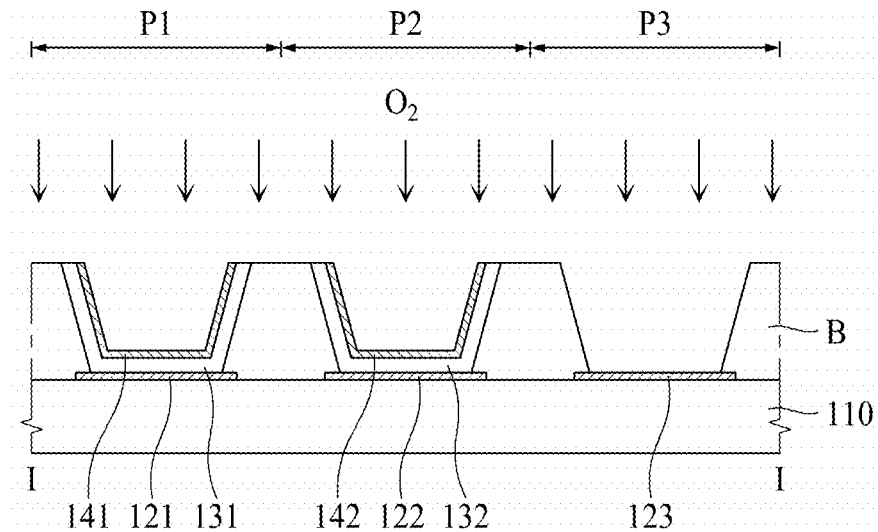
Figure 10K:
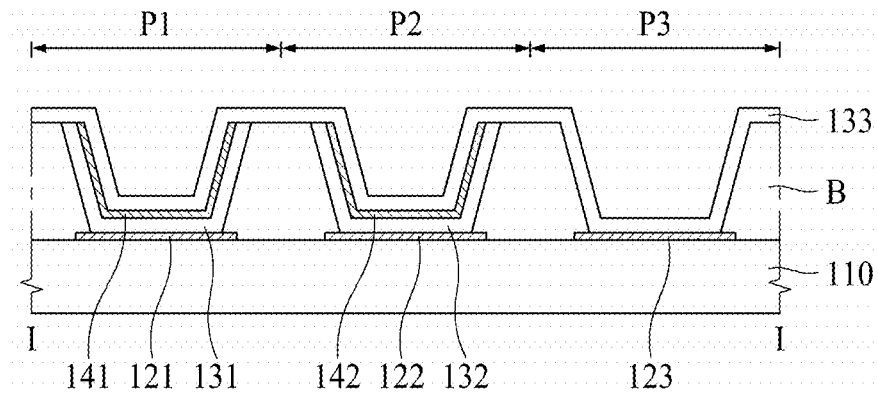
Figure 10L:
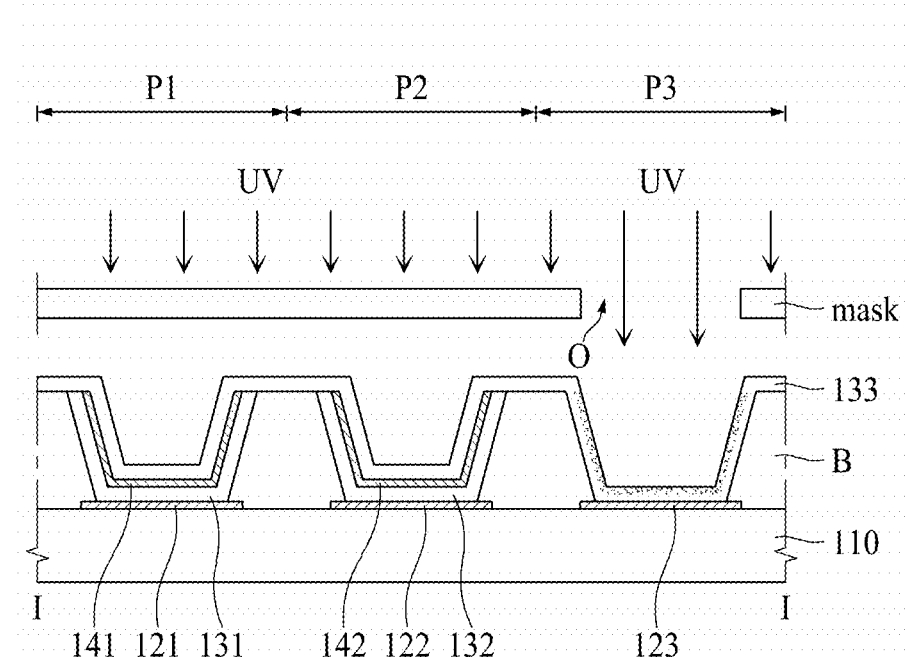
Figure 10M:
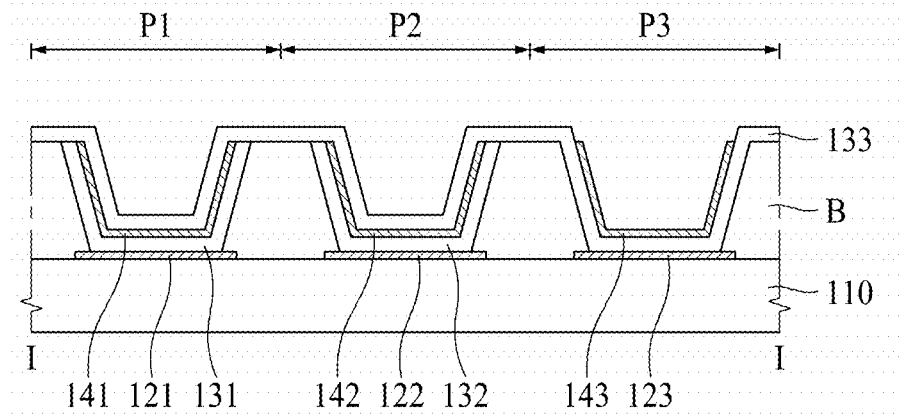
Figure 10N:
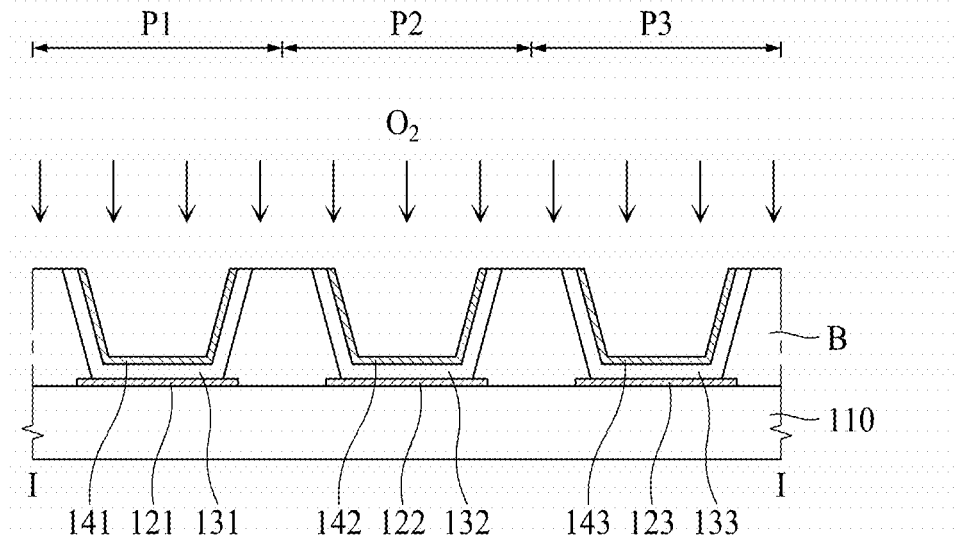
Figure 10O:
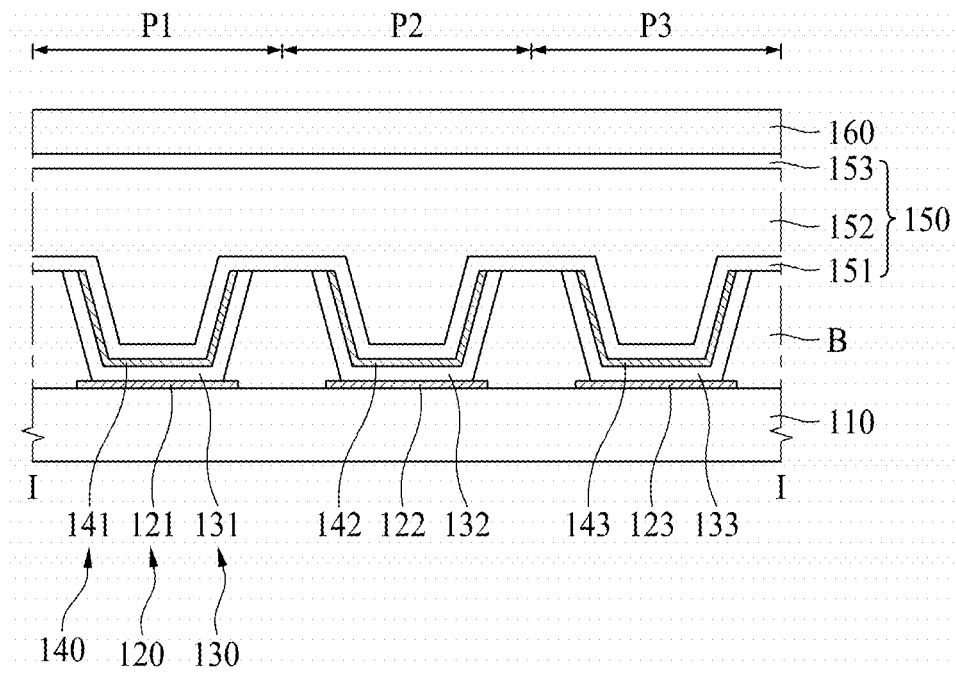

FIGS. 10a to 10o are cross-sectional views illustrating a manufacturing method of a display device according to the first aspect of the present disclosure.

First of all, as shown in FIG. 10a, transistors (not shown) and a low electrode 120 are formed on a substrate 110.

In detail, an active layer of each of the transistors is formed on the substrate 110. The active layer may be formed of a polycrystalline silicon based semiconductor material, a single crystalline silicon based semiconductor material, or an oxide based semiconductor material.

Then, a gate insulating film is formed on the active layer. The gate insulating film may be formed of an inorganic film, for example, a silicon oxide (SiOx) film, a silicon nitride (SiNx) film, or a multi-layered film of SiOx and SiNx.

Then, a gate electrode is formed on the gate insulating film.

Then, a first insulating film is formed on the active layer and the gate electrode, the first insulating film may be formed of an inorganic film, for example, a silicon oxide (SiOx) film, a silicon nitride (SiNx) film, or a multi-layered film of SiOx and SiNx.

Then, first and second contact holes passing through the first insulating film are formed. A source electrode connected to the active layer through the first contact hole and a drain electrode connected to the active layer through the second contact hole are formed on the first insulating film.

Then, the first insulating film is additionally formed on the source electrode and the drain electrode. A third contact hole is formed, which passes through the first insulating film which is additionally formed. An M3 metal layer connected to the drain electrode through the third contact hole is formed on the first insulating film which is additionally formed.

Then, a second insulating film is formed on the M3 metal layer. The second insulating film may be formed of an inorganic film, for example, a silicon oxide (SiOx) film, a silicon nitride (SiNx) film, or a multi-layered film of SiOx and SiNx.

Then, a fourth contact hole is formed, which is connected to the M3 metal layer through the second insulating film. An M4 metal layer connected to the M3 metal layer through the fourth contact hole is formed on the second insulating film.

Then, the second insulating film is additionally formed on the M4 metal layer. A fifth contact hole is formed, which is connected to the M4 metal layer through the second insulating film which is additionally formed. The M3 metal layer, the M4 metal layer and the second insulating film may be omitted.

Then, the lower electrodes 120 are formed on the second insulating film. In more detail, a lower electrode film is formed on the second insulating film. The lower electrode film may be formed to include a metal material of high reflectivity such as a deposited structure (Ti/Al/Ti) of aluminum and titanium, a deposited structure (ITO/Al/ITO) of aluminum and ITO, an APC alloy, and a deposited structure (ITO/APC/ITO) of APC alloy and ITO. The APC alloy is an alloy of silver (Ag), palladium (Pb), and Copper (Cu).

Then, a photoresist pattern is formed on the lower electrode film. The photoresist pattern may be formed on a position where first, second and third subpixels P1, P2 and P3 will be formed. The lower electrode film which is not covered by the photoresist pattern is dry etched to form the first, second and third lower electrodes 121, 122 and 123 as shown in FIG. 10A, and the photoresist pattern is removed.

Next, as shown in FIG. 10B, a bank B is formed to cover edges of the first, second and third lower electrodes 121, 122 and 123.

In detail, a charging material is formed on the first, second and third lower electrodes 121, 122 and 123. The charging material may be an organic material, for example, acryl resin, epoxy resin, phenolic resin, polyamide resin, or polyimide resin.

Then, the bank B is formed by dry etching. A material, which can etch the charging material but cannot etch the first, second and third lower electrodes 121, 122 and 123, may be selected as a dry etching material.

Next, a first pixel light emitting layer 131 and a first upper electrode 141 are formed to be patterned in the first subpixel P1.

In more detail, as shown in FIG. 10C, the first pixel light emitting layer 131 is formed on the first, second and third lower electrodes 121, 122 and 123 and the bank B. The first pixel light emitting layer 131 may be formed by a deposition process or a solution process. If the first pixel light emitting layer 131 is formed by a deposition process, an evaporation method may be used.

The first pixel light emitting layer 131 includes a hole transporting layer HTL, a first light generating layer EML1 for emitting light of a first color, a first electron transporting layer ETL, and a second photo chromic electron transporting layer PC-ETL. The first color may be, but not limited to, blue (B).

The second photo chromic electron transporting layer PC-ETL includes an electron transporting material and a photoisomerized material.

The electron transporting material is a material that smoothly moves electrons to the first light generating layer EML1, the second light generating layer EML2 and the third light generating layer EML3. For example, the electron transporting material may include at least any one selected from a group made of Alq3, PBD, TAZ, spiro-PBD, BAlq, Liq (lithium quinolate), BMB-2T, BMB-3T, PF-6P, TPBI, COT and SAlq. The electron transporting material may also be included in the first electron transporting layer ETL. The first electron transporting layer ETL and the second photo chromic electron transporting layer PC-ETL may include their respective electron transporting materials different from each other, or may include the same electron transporting material.

The photoisomerized material is a material changed to an isomer having another physical or chemical characteristic if it is exposed to light such as UV, and for example, may be a photo chromic. The photo chromic is a material, of which color is changed if it is exposed to light such as UV and returns to an original color if light is shielded. For example, the photo chromic may include a diarylethene based compound.

Then, as shown in FIG. 10D, UV is irradiated to only the first subpixel P1. A mask is arranged on the second and third subpixels P2 and P3, and an open area O of the mask is arranged on the first subpixel P1. In this state, UV is irradiated to only the second photo chromic electron transporting layer PC-ETL arranged in the first subpixel P1. Therefore, the second photo chromic electron transporting layer PC-ETL of the first pixel light emitting layer 131 arranged in the first subpixel P1 is changed to an isomer having physical or chemical characteristic different from that of the second photo chromic electron transporting layer PC-ETL of the first pixel light emitting layer 131 arranged in the second and third subpixels P2 and P3.

Then, as shown in FIG. 10E, the first upper electrode 141 is formed to be patterned in the first subpixel P1. The second photo chromic electron transporting layer PC-ETL of the first pixel light emitting layer 131 to which UV has been irradiated is subjected to nucleation and thus has a high deposition rate of a metal material. That is, a metal material may well be deposited on the photoisomerized material to which UV has been irradiated. On the other hand, the second photo chromic electron transporting layer PC-ETL of the first pixel light emitting layer 131 to which UV has not been irradiated is subjected to desorption and thus has a low deposition rate of a metal material. That is, a metal material may not be well deposited on the photoisomerized material to which UV has not been irradiated. As a result, the first upper electrode 141 is formed to be patterned on only the second photo chromic electron transporting layer PC-ETL of the first pixel light emitting layer 131 arranged in the first subpixel P1.

Then, as shown in FIG. 10F, plasma ashing is performed to remove the first pixel light emitting layer 131 formed in the second and third subpixels P2 and P3. The first pixel light emitting layer 131 on which the first upper electrode 141 is not formed may be removed using oxygen plasma.

Next, the second pixel light emitting layer 132 and the second upper electrode 142 are formed to be patterned in the second subpixel P2.

In more detail, as shown in FIG. 10G, the second pixel light emitting layer 132 is formed on the first upper electrode 141, the second and third lower electrodes 122 and 123 and the bank B. The second pixel light emitting layer 132 may be formed by a deposition process or a solution process. If the second pixel light emitting layer 132 is formed by a deposition process, an evaporation method may be used.

The second pixel light emitting layer 132 includes a hole transporting layer HTL, a second light generating layer EML2 for emitting light of a second color different from the first color, a first electron transporting layer ETL, and a second photo chromic electron transporting layer PC-ETL. The second color may be, but not limited to, green (G).

Then, as shown in FIG. 10H, UV is irradiated to only the second subpixel P2. A mask is arranged on the first and third subpixels P1 and P3, and an open area O of the mask is arranged on the second subpixel P2. In this state, UV is irradiated to only the second photo chromic electron transporting layer PC-ETL arranged in the second subpixel P2. Therefore, the second photo chromic electron transporting layer PC-ETL of the second pixel light emitting layer 132 arranged in the second subpixel P2 is changed to an isomer having physical or chemical characteristic different from that of the second photo chromic electron transporting layer PC-ETL of the second pixel light emitting layer 132 arranged in the first and third subpixels P1 and P3.

Then, as shown in FIG. 10I, the second upper electrode 142 is formed to be patterned in the second subpixel P2. The second photo chromic electron transporting layer PC-ETL of the second pixel light emitting layer 132 to which UV has been irradiated is subjected to nucleation and thus has a high deposition rate of a metal material. That is, a metal material may well be deposited on the photoisomerized material to which UV has been irradiated. On the other hand, the second photo chromic electron transporting layer PC-ETL of the second pixel light emitting layer 132 to which UV has not been irradiated is subjected to desorption and thus has a low deposition rate of a metal material. That is, a metal material may not be well deposited on the photoisomerized material to which UV has not been irradiated. As a result, the second upper electrode 142 is formed to be patterned on only the second photo chromic electron transporting layer PC-ETL of the second pixel light emitting layer 132 arranged in the second subpixel P2.

Then, as shown in FIG. 10J, plasma ashing is performed to remove the second pixel light emitting layer 132 formed in the first and third subpixels P1 and P3. The second pixel light emitting layer 132 on which the second upper electrode 142 is not formed may be removed using oxygen plasma.

Next, the third pixel light emitting layer 133 and the third upper electrode 143 are formed to be patterned in the third subpixel P3.

In more detail, as shown in FIG. 10K, the third pixel light emitting layer 133 is formed on the first and second upper electrodes 141 and 142, the third lower electrode 123 and the bank B. The third pixel light emitting layer 133 may be formed by a deposition process or a solution process. If the third pixel light emitting layer 133 is formed by a deposition process, an evaporation method may be used.

The third pixel light emitting layer 133 includes a hole transporting layer HTL, a third light generating layer EML3 for emitting light of a third color different from the first and second colors, a first electron transporting layer ETL, and a second photo chromic electron transporting layer PC-ETL. The third color may be, but not limited to, red (R).

Then, as shown in FIG. 10L, UV is irradiated to only the third subpixel P3. A mask is arranged on the first and second subpixels P1 and P2, and an open area O of the mask is arranged on the third subpixel P3. In this state, UV is irradiated to only the second photo chromic electron transporting layer PC-ETL arranged in the third subpixel P3. Therefore, the second photo chromic electron transporting layer PC-ETL of the third pixel light emitting layer 133 arranged in the third subpixel P3 is changed to an isomer having physical or chemical characteristic different from that of the second photo chromic electron transporting layer PC-ETL of the third pixel light emitting layer 133 arranged in the first and second subpixels P1 and P2.

Then, as shown in FIG. 10M, the third upper electrode 143 is formed to be patterned in the third subpixel P3. The second photo chromic electron transporting layer PC-ETL of the third pixel light emitting layer 133 to which UV has been irradiated is subjected to nucleation and thus has a high deposition rate of a metal material. That is, a metal material may well be deposited on the photoisomerized material to which UV has been irradiated. On the other hand, the second photo chromic electron transporting layer PC-ETL of the third pixel light emitting layer 133 to which UV has not been irradiated is subjected to desorption and thus has a low deposition rate of a metal material. That is, a metal material may not be well deposited on the photoisomerized material to which UV has not been irradiated. As a result, the third upper electrode 143 is formed to be patterned on only the second photo chromic electron transporting layer PC-ETL of the third pixel light emitting layer 133 arranged in the third subpixel P3.

Then, as shown in FIG. 10N, plasma ashing is performed to remove the third pixel light emitting layer 133 formed in the first and second subpixels P1 and P2. The third pixel light emitting layer 133 on which the third upper electrode 143 is not formed may be removed using oxygen plasma.

Next, as shown in FIG. 10O, an encapsulation layer 150 and a second substrate 160 are formed on the first, second and third upper electrodes 141, 142 and 143.

In more detail, a first inorganic film 151 is formed on the first, second and third upper electrodes 141, 142 and 143. The first inorganic film 151 may be formed of a silicon nitride, an aluminum nitride, a zirconium nitride, a titanium nitride, a hafnium nitride, a tantalum nitride, a silicon oxide, an aluminum oxide, or a titanium oxide. The first inorganic film 151 may be deposited by, but not limited to, a Chemical Vapor Deposition (CVD) method or an Atomic Layer Deposition (ALD) method.

Then, the organic film 152 is formed on the first inorganic film 151. The organic film 152 may be formed of an organic material, for example, acrylic resin, epoxy resin, phenolic resin, polyamide resin, or polyimide resin.

Then, a second inorganic film 153 is formed on the organic film 152. The second inorganic film 153 may be formed of a silicon nitride, an aluminum nitride, a zirconium nitride, a titanium nitride, a hafnium nitride, a tantalum nitride, a silicon oxide, an aluminum oxide, or a titanium oxide. The second inorganic film 153 may be deposited by, but not limited to, a Chemical Vapor Deposition (CVD) method or an Atomic Layer Deposition (ALD) method.

Then, the second substrate 160 is formed on the second inorganic film 153.

The display device 100 according to the first aspect of the present disclosure described as above is characterized in that it comprises the second photo chromic electron transporting layer made of an electron transporting material and a photoisomerized material in each of the first pixel light emitting layer 131, the second pixel light emitting layer 132 and the third pixel light emitting layer 133. In the display device 100 according to the first aspect of the present disclosure, UV is selectively irradiated to the second photo chromic electron transporting layer to change the characteristic of the photoisomerized material such that the metal material may well be deposited on the photoisomerized material. As the upper electrode 140 is selectively deposited on the second photo chromic electron transporting layer to which UV has been irradiated, the first, second and third upper electrodes 141, 142 and 143 are respectively formed to be patterned on the first pixel light emitting layer 131, the second pixel light emitting layer 132 and the third pixel light emitting layer 133.

In the display device 100 according to the first aspect of the present disclosure, the first, second and third upper electrodes 141, 142 and 143 as well as the first pixel light emitting layer 131, the second pixel light emitting layer 132 and the third pixel light emitting layer 133 may be formed to be patterned even without FMM. Therefore, in the display device 100 according to the first aspect of the present disclosure, the light emitting layer 130 and the upper electrode 140 may be formed to be patterned accurately. Also, in the display device 100 according to the first aspect of the present disclosure, the cost caused by use and maintenance of the FMM may be reduced.

In the display device 100 according to the first aspect of the present disclosure, the first, second and third upper electrodes 141, 142 and 143 as well as the first pixel light emitting layer 131, the second pixel light emitting layer 132 and the third pixel light emitting layer 133 may be formed to be patterned even without photoresist. Therefore, in the display device 100 according to the first aspect of the present disclosure, the light emitting layer 130 and the upper electrode 140 may be prevented from being damaged during a manufacturing process. In the display device 100 according to the first aspect of the present disclosure, lifespan and efficiency of the light emitting diode may be improved.

In the display device 100 according to the first aspect of the present disclosure, since the upper electrode 140 is formed to be patterned, its formation area may be minimized. Therefore, in the display device 100 according to the first aspect of the present disclosure, external light reflection by the upper electrode 140 may be reduced. Also, in the display device 100 according to the first aspect of the present disclosure, parasitic capacitance generated between the upper electrode 140 and another electrode layer may be reduced.

Figure 11:
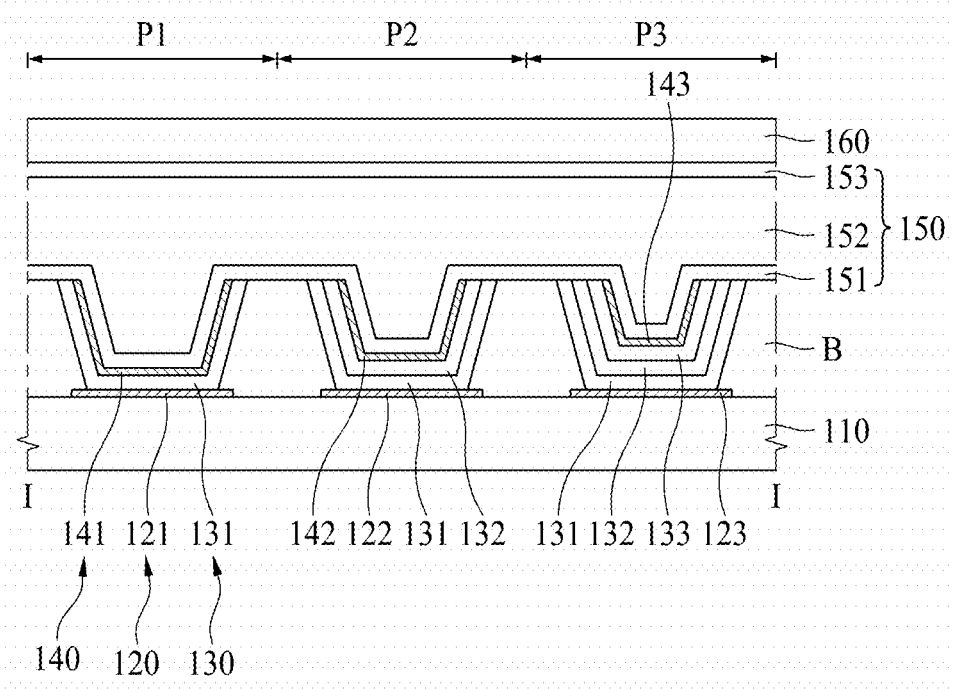
FIG. 11 is a cross-sectional view illustrating another example taken along line I-I of FIG. 1.
Figure 12:
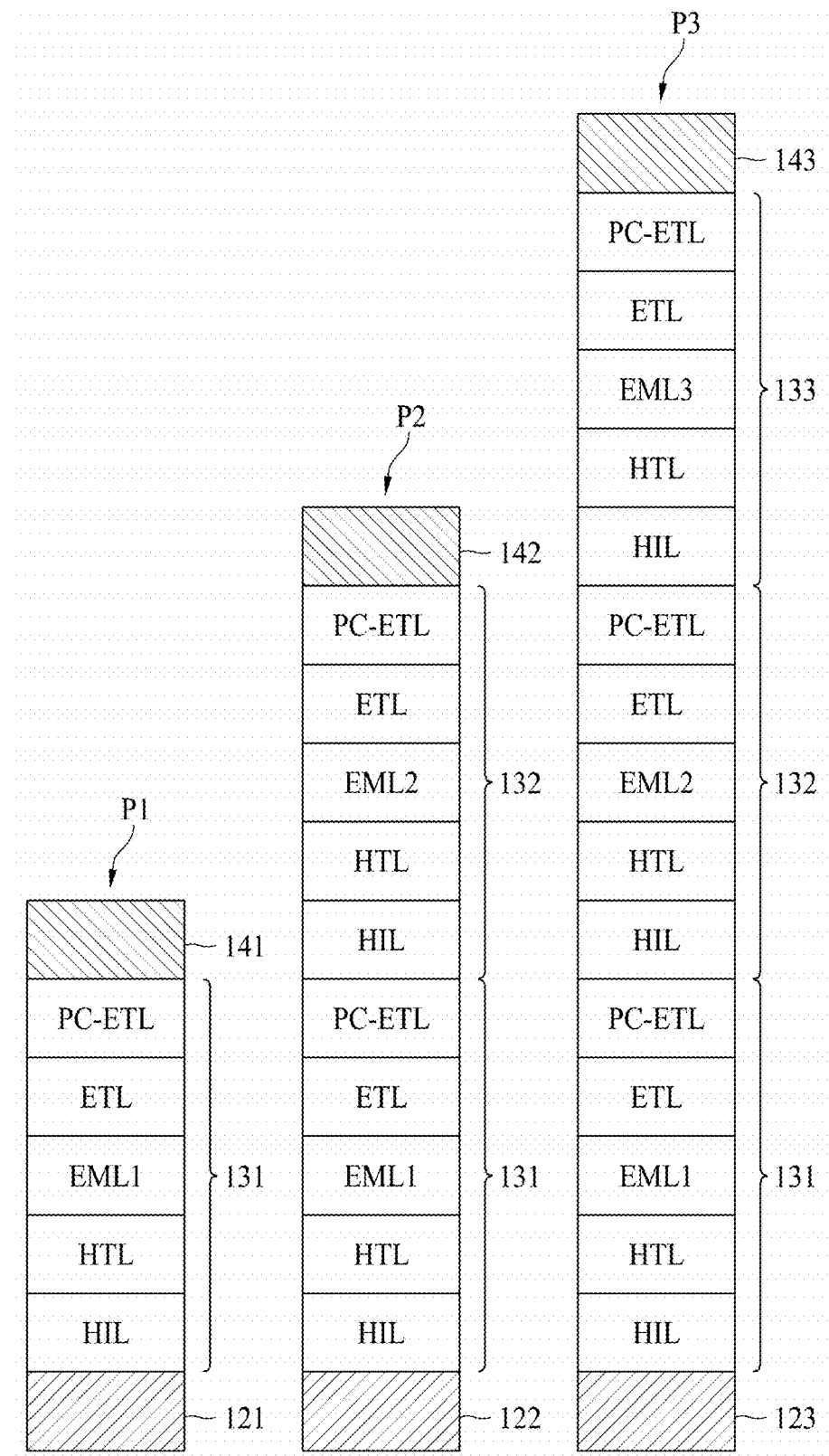
FIG. 12 is a schematic cross-sectional view illustrating an individual subpixel of FIG. 11.

FIG. 11 is a cross-sectional view illustrating another example taken along line I-I of FIG. 1, and FIG. 12 is a schematic cross-sectional view illustrating an individual subpixel of FIG. 11.

Referring to FIGS. 11 and 12, the display device 100 according to the second aspect of the present disclosure comprises a first substrate 110, a lower electrode 120, a light emitting layer 130, an upper electrode 140, an encapsulation layer 150, and a second substrate 160.

Since the first substrate 110, the encapsulation layer 150 and the second substrate 160 shown in FIG. 11 are substantially the same as the first substrate 110, the encapsulation layer 150 and the second substrate 160 shown in FIGS. 1 and 2, their detailed description will be omitted. Hereinafter, description will be given based on the lower electrode 120, the light emitting layer 130 and the upper electrode 140 according to the second aspect of the present disclosure.

An area where the lower electrode 120, the light emitting layer 130 and the upper electrode 140 are sequentially deposited may be defined as a subpixel P for emitting predetermined light. The subpixel P may include, but is not limited to, a first subpixel P1 for emitting blue (B) light, a second subpixel P2 for emitting green (G) light, and a third subpixel P3 for emitting red (R) light. The subpixel P may further include a subpixel for emitting white (W) light. Also, an arrangement sequence of the subpixels P1, P2 and P3 may be changed in various ways.

The lower electrode 120 includes a first lower electrode 121, a second lower electrode 122 and a third lower electrode 123, which are spaced apart from one another at a predetermined interval on the substrate 110. The first lower electrode 121 is formed to be patterned in the first subpixel P1, the second lower electrode 122 is formed to be patterned in the second subpixel P2, and the third lower electrode 123 is formed to be patterned in the third subpixel P3. Transistors (not shown) may be arranged in the first, second and third subpixels P1, P2 and P3, and supply a predetermined voltage to each of the first lower electrode 121, the second lower electrode 122 and the third lower electrode 123 in accordance with a data voltage of a data line if a gate signal from a gate line is input thereto.

The first, second and third lower electrodes 121, 122 and 123 are provided on the substrate 110. For example, the first, second and third lower electrodes 121, 122 and 123 may be formed to include a metal material of high reflectivity such as a deposited structure (Ti/Al/Ti) of aluminum and titanium, a deposited structure (ITO/Al/ITO) of aluminum and ITO, an APC alloy, and a deposited structure (ITO/APC/ITO) of APC alloy and ITO. The APC alloy is an alloy of silver (Ag), palladium (Pb), and Copper (Cu). Each of the first, second and third lower electrodes 121, 122 and 123 may be an anode. Each of the first, second and third lower electrodes 121, 122 and 123 may be connected with a driving transistor.

A bank B is provided on the substrate 110 to cover an edge of each of the first, second and third lower electrodes 121, 122 and 123, whereby a light emitting area of each of the first, second and third subpixels P1, P2 and P3 is defined. That is, an opening area where the bank B is not provided in each of the subpixels P1, P2 and P3 becomes a light emitting area. On the other hand, an area where the bank B is provided in each of the subpixels P1, P2 and P3 becomes a non-light emitting area.

The bank B is provided on the substrate 110 while covering an edge of each of the first, second and third lower electrodes 121, 122 and 123. Therefore, the first, second and third lower electrodes 121, 122 and 123 formed to be patterned for the subpixels P1, P2 and P3 may be insulated from one another by the bank B. Also, a problem that luminance efficiency is deteriorated due to a current concentrated on the end of each of the first, second and third lower electrodes 121, 122 and 123 may be solved.

The bank B may be formed of, but not limited to, an organic film such as acryl resin, epoxy resin, phenolic resin, polyamide resin, and polyimide resin.

The light emitting layer 130 is provided on the lower electrode 120. The light emitting layer 130 includes a first pixel light emitting layer 131, a second pixel light emitting layer 132 and a third pixel light emitting layer 133, which are formed to be patterned to emit light of different colors.

In detail, the first pixel light emitting layer 131 is formed to be patterned on the first, second and third lower electrodes 121, 122 and 123 respectively arranged in the first, second and third subpixels P1, P2 and P3. The first pixel light emitting layer 131, as shown in FIG. 12, includes a hole transporting layer HTL, a first light generating layer EML1 for emitting light of a first color, a first electron transporting layer ETL, and a second photo chromic electron transporting layer PC-ETL. The first color may be, but not limited to, blue (B).

The second pixel light emitting layer 132 is formed to be patterned on the first pixel light emitting layer 131 arranged in each of the second and third subpixels P2 and P3. The second pixel light emitting layer 132, as shown in FIG. 12, includes a hole transporting layer HTL, a second light generating layer EML2 for emitting light of a second color different from the first color, a first electron transporting layer ETL, and a second photo chromic electron transporting layer PC-ETL. The second color may be, but not limited to, green (G).

The third pixel light emitting layer 133 is formed to be patterned on the third pixel light emitting layer 132 arranged in the third subpixel P3. The third pixel light emitting layer 133, as shown in FIG. 12, includes a hole transporting layer HTL, a third light generating layer EML3 for emitting light of a third color different from the first and second colors, a first electron transporting layer ETL, and a second photo chromic electron transporting layer PC-ETL. The third color may be, but not limited to, red (R).

The hole transporting layer HTL included in each of the first pixel light emitting layer 131, the second pixel light emitting layer 132 and the third pixel light emitting layer 133 serves to smoothly transfer holes to each of the first light generating layer EML1, the second light generating layer EML2 and the third light generating layer EML3.

The first electron transporting layer ETL included in each of the first pixel light emitting layer 131, the second pixel light emitting layer 132 and the third pixel light emitting layer 133 serves to smoothly transfer electrons to each of the first light generating layer EML1, the second light generating layer EML2 and the third light generating layer EML3.

The second photo chromic electron transporting layer PC-ETL included in each of the first pixel light emitting layer 131, the second pixel light emitting layer 132 and the third pixel light emitting layer 133 serves to smoothly transfer electrons to each of the first light generating layer EML1, the second light generating layer EML2 and the third light generating layer EML3. Also, the second photo chromic electron transporting layer PC-ETL serves to allow the upper electrode 140 to be formed to be patterned for each of the subpixels P1, P2 and P3. To this end, the second photo chromic electron transporting layer PC-ETL includes an electron transporting material and a photoisomerized material.

The electron transporting material is a material that smoothly moves electrons to the first light generating layer EML1, the second light generating layer EML2 and the third light generating layer EML3. For example, the electron transporting material may include at least any one selected from a group made of Alq3, PBD, TAZ, spiro-PBD, BAlq, Liq (lithium quinolate), BMB-2T, BMB-3T, PF-6P, TPBI, COT and SAlq. The electron transporting material may also be included in the first electron transporting layer ETL. The first electron transporting layer ETL and the second photo chromic electron transporting layer PC-ETL may include their respective electron transporting materials different from each other, or may include the same electron transporting material.

The photoisomerized material is a material changed to an isomer having another physical or chemical characteristic if it is exposed to light such as UV, and for example, may be a photo chromic. The photo chromic is a material, of which color is changed if it is exposed to light such as UV and returns to an original color if light is shielded. For example, the photo chromic may include a diarylethene based compound.

The photoisomerized material has a deposition rate of a metal material, which is varied depending on whether it is exposed to light. In detail, the photoisomerized material to which UV has been irradiated is subjected to nucleation and thus has a high deposition rate of a metal material. That is, a metal material may well be deposited on the photoisomerized material to which UV has been irradiated. On the other hand, the photoisomerized material to which UV has not been irradiated is subjected to desorption and thus has a low deposition rate of a metal material. That is, a metal material may not be well deposited on the photoisomerized material to which UV has not been irradiated.

The second photo chromic electron transporting layer PC-ETL may be doped with an n-type dopant.

Meanwhile, each of the first, second and third subpixels P1, P2 and P3 may further include a hole injection layer HIL between the lower electrodes 121, 122 and 123 and the hole transporting layer HTL. At this time, the hole injection layer HIL may be doped with a p-type dopant to improve mobility.

In the display device 100 according to the second aspect of the present disclosure, the first, second and third subpixels P1, P2 and P3 have their respective stack structures different from one another.

In more detail, in the display device 100 according to the second aspect of the present disclosure, the first subpixel P1 has one-stack structure. The first pixel light emitting layer 131 is provided in the first subpixel P1, whereby the first light generating layer EML1 included in the first pixel light emitting layer 131 emits light of the first color.

At this time, in order to embody micro cavity characteristic for light of the first color emitted from the first light generating layer EML1, a distance between the first lower electrode 121 and the first upper electrode 141 may be provided in the first subpixel P1. As reflection and re-reflection are repeated between the first lower electrode 121 and the first upper electrode 141, reinforcing interference occurs to amplify light, whereby light of the first color emitted from the first light generating layer EML1 is emitted to the outside. As a result, light of the first color is emitted in the first subpixel P1.

The display device 100 according to the second aspect of the present disclosure has a tandem structure of two stacks in the second subpixel P2. The second pixel light emitting layer 132 is provided on the first pixel light emitting layer 131 in the second subpixel P2. In this case, the second photo chromic electron transporting layer PC-ETL of the first pixel light emitting layer 131 and the hole injection layer HIL of the second pixel light emitting layer 132 may adjoin each other to serve as charge generation layers. The second photo chromic electron transporting layer PC-ETL of the first pixel light emitting layer 131 may be doped with an n-type dopant and inject electrons into the first pixel light emitting layer 131, and the hole injection layer HIL of the second pixel light emitting layer 132 may be doped with a p-type dopant and inject holes into the second pixel light emitting layer 132.

In the second subpixel P2, light of the first color is emitted from the first light generating layer EML1 included in the first pixel light emitting layer 131 and light of the second color is emitted from the second light generating layer EML2 included in the second pixel light emitting layer 132.

At this time, in order to embody micro cavity characteristic for light of the second color emitted from the second light generating layer EML2, a distance between the second lower electrode 122 and the second upper electrode 142 may be provided in the second subpixel P2. As reflection and re-reflection are repeated between the second lower electrode 122 and the second upper electrode 142, reinforcing interference occurs to amplify light, whereby light of the second color emitted from the second light generating layer EML2 is emitted to the outside. On the other hand, as reflection and re-reflection are repeated between the second lower electrode 122 and the second upper electrode 142 to cause offset interference, light becomes extinct, whereby light of the first color emitted from the first light generating layer EML1 is not emitted to the outside. As a result, light of the second color is emitted in the second subpixel P2.

The display device 100 according to the second aspect of the present disclosure has a tandem structure of three stacks in the third subpixel P3. In the third subpixel P3, the second pixel light emitting layer 132 is provided on the first pixel light emitting layer 131, and the third pixel light emitting layer 133 is provided on the second pixel light emitting layer 132.

In this case, the second photo chromic electron transporting layer PC-ETL of the first pixel light emitting layer 131 and the hole injection layer HIL of the second pixel light emitting layer 132 may adjoin each other to serve as charge generation layers. The second photo chromic electron transporting layer PC-ETL of the first pixel light emitting layer 131 may be doped with an n-type dopant and inject electrons into the first pixel light emitting layer 131, and the hole injection layer HIL of the second pixel light emitting layer 132 may be doped with a p-type dopant and inject holes into the second pixel light emitting layer 132.

Also, the second photo chromic electron transporting layer PC-ETL of the second pixel light emitting layer 132 and the hole injection layer HIL of the third pixel light emitting layer 133 may adjoin each other to serve as charge generation layers. The second photo chromic electron transporting layer PC-ETL of the second pixel light emitting layer 132 may be doped with an n-type dopant and inject electrons into the second pixel light emitting layer 132, and the hole injection layer HIL of the third pixel light emitting layer 133 may be doped with a p-type dopant and inject holes into the third pixel light emitting layer 133.

In the third subpixel P3, light of the first color is emitted from the first light generating layer EML1 included in the first pixel light emitting layer 131, light of the second color is emitted from the second light generating layer EML2 included in the second pixel light emitting layer 132, and light of the third color is emitted from the third light generating layer EML3 included in the third pixel light emitting layer 133.

At this time, in order to embody micro cavity characteristic for light of the third color emitted from the third light generating layer EML3, a distance between the third lower electrode 123 and the third upper electrode 143 may be provided in the third subpixel P3. As reflection and re-reflection are repeated between the third lower electrode 123 and the third upper electrode 143, reinforcing interference occurs to amplify light, whereby light of the third color emitted from the third light generating layer EML3 is emitted to the outside.

On the other hand, as reflection and re-reflection are repeated between the third lower electrode 123 and the third upper electrode 143 to cause offset interference, light becomes extinct, whereby light of the second color emitted from the second light generating layer EML2 is not emitted to the outside. Also, as reflection and re-reflection are repeated between the third lower electrode 123 and the third upper electrode 143 to cause offset interference, light becomes extinct, whereby light of the first color emitted from the first light generating layer EML1 is not emitted to the outside. As a result, light of the third color is emitted in the third subpixel P3.

The upper electrode 140 is provided on the light emitting layer 130. The upper electrode 140 includes the first upper electrode 141, the second upper electrode 142 and the third upper electrode 143, which are respectively formed to be patterned in each of the first, second and third subpixels P1, P2 and P3.

In detail, the first upper electrode 141 is formed to be patterned on the first pixel light emitting layer 131 arranged in the first subpixel P1. The first upper electrode 141 may be formed in such a manner that UV is irradiated to the first pixel light emitting layer 131 arranged in the first subpixel P1, especially the second photo chromic electron transporting layer PC-ETL and then a metal material is deposited thereon after the first pixel light emitting layer 131 is formed on the lower electrode 120. Therefore, the first upper electrode 141 is formed to be patterned on only the first pixel light emitting layer 131 arranged in the first subpixel P1. At this time, the first upper electrode 141 is formed to adjoin the second photo chromic electron transporting layer PC-ETL of the first pixel light emitting layer 131.

The second upper electrode 142 is formed to be patterned on the second pixel light emitting layer 132 arranged in the second subpixel P2. The second upper electrode 142 may be formed in such a manner that UV is irradiated to the second pixel light emitting layer 132 arranged in the second subpixel P2, especially the second photo chromic electron transporting layer PC-ETL and then a metal material is deposited thereon after the second pixel light emitting layer 132 is formed on the lower electrode 120. Therefore, the second upper electrode 142 is formed to be patterned on only the second pixel light emitting layer 132 arranged in the second subpixel P2. At this time, the second upper electrode 142 is formed to adjoin the second photo chromic electron transporting layer PC-ETL of the second pixel light emitting layer 132.

The third upper electrode 143 is formed to be patterned on the third pixel light emitting layer 133 arranged in the third subpixel P3. The third upper electrode 143 may be formed in such a manner that UV is irradiated to the third pixel light emitting layer 133 arranged in the third subpixel P3, especially the second photo chromic electron transporting layer PC-ETL and then a metal material is deposited thereon after the third pixel light emitting layer 133 is formed on the lower electrode 120. Therefore, the third upper electrode 143 is formed to be patterned on only the third pixel light emitting layer 133 arranged in the third subpixel P3. At this time, the third upper electrode 143 is formed to adjoin the second photo chromic electron transporting layer PC-ETL of the third pixel light emitting layer 133.

Meanwhile, in the display area AA where the first, second and third subpixels P1, P2 and P3 are arranged, the first, second and third upper electrodes 141, 142 and 143 are spaced apart from one another.

On the other hand, in the bezel area BA, the first, second and third upper electrodes 141, 142 and 143 may be overlapped with one another. In detail, in a portion of the bezel area BA, the first, second and third upper electrodes 141, 142 and 143 are overlapped with the first, second and third pixel light emitting layers 131, 132 and 133. In a portion of the bezel area BA, the first pixel light emitting layer 131 may be provided below the first upper electrode 141, the second pixel light emitting layer 132 may be provided between the first and second upper electrodes 141 and 142, and the third pixel light emitting layer 133 may be provided between the second and third upper electrodes 142 and 143. This is because that the first, second and third pixel light emitting layers 131, 132 and 133 as well as the first, second and third upper electrodes 141, 142 and 143 are provided to be wider than the display area AA.

Also, the first, second and third upper electrodes 141, 142 and 143 are provided to be wider than the first, second and third pixel light emitting layers 131, 132 and 133, whereby only the first, second and third upper electrodes may be overlapped with one another in another portion of the bezel area BA. Therefore, the first, second and third upper electrodes 141, 142 and 143 may electrically be connected with one another in the bezel area BA.

The first, second and third upper electrodes 141, 142 and 143 may be formed of a transparent conductive material (TCO) such as ITO and IZO, which can transmit light, or may be formed of a semi-transmissive conductive material such as Mg, Ag, or Alloy of Mg and Ag.

Figure 13A:
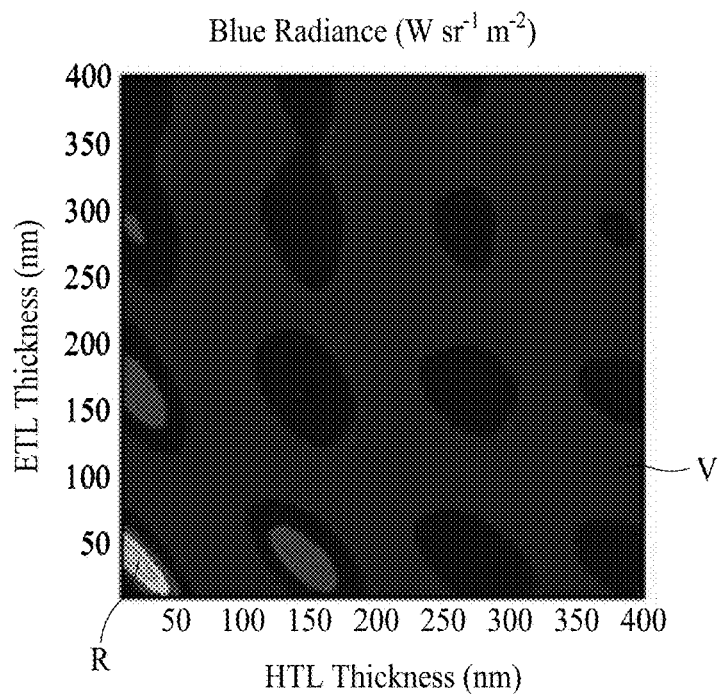
FIGS. 13A to 13C are views illustrating light emission intensity according to thicknesses of layers per pixel light emitting layer.
Figure 13B:
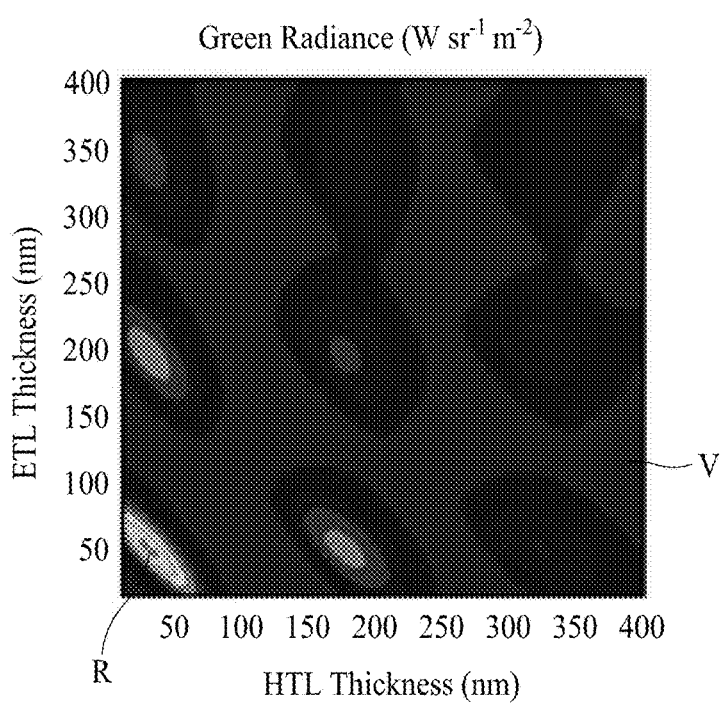
Figure 13C:
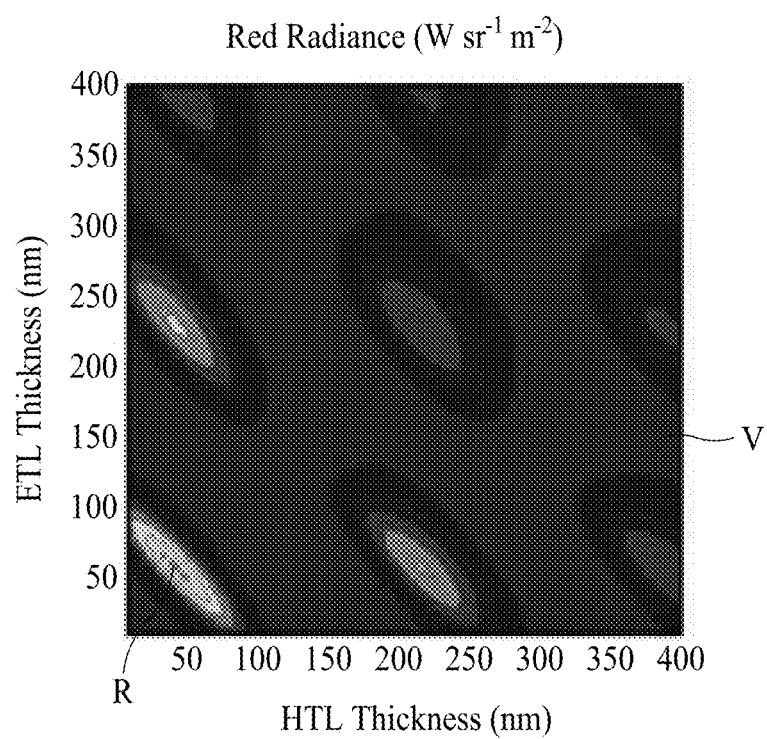
Figure 14C:
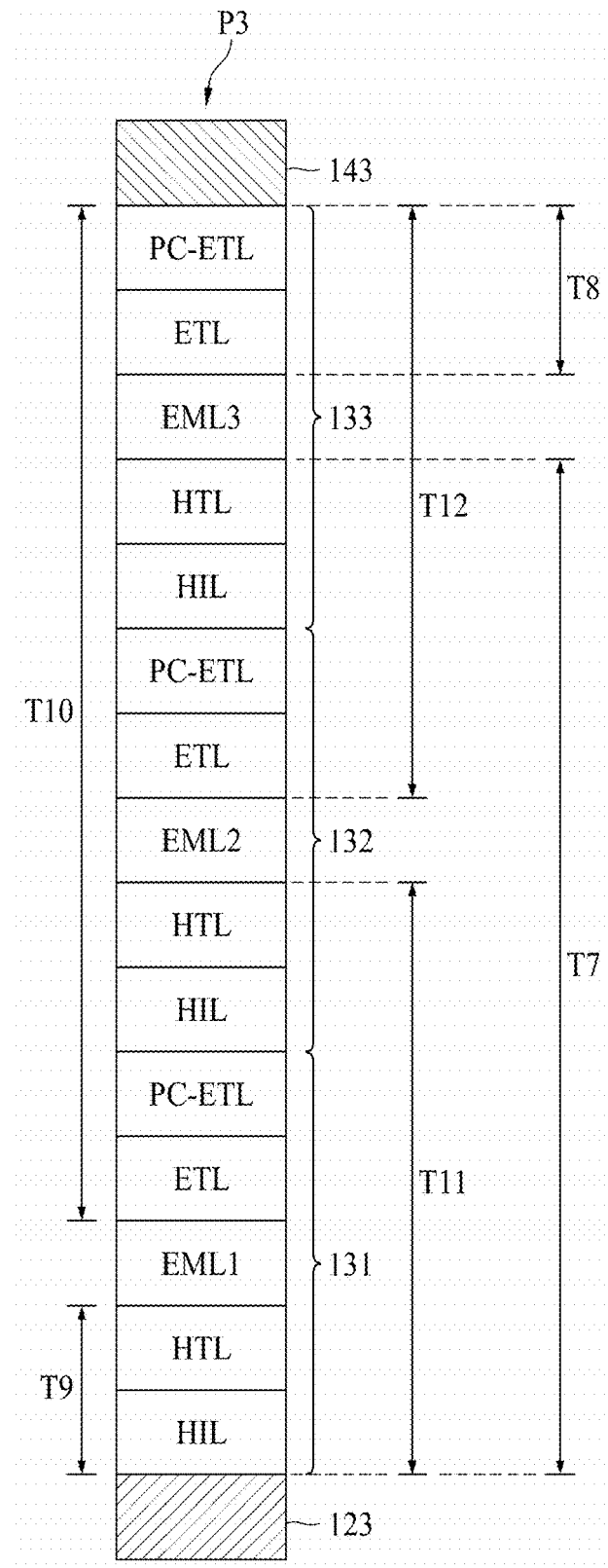

FIGS. 13A to 13C are views illustrating light emission intensity according to thicknesses of layers per pixel light emitting layer, and FIGS. 14a to 14c are views illustrating thicknesses of layers included in a pixel light emitting layer per subpixel.

FIG. 13A illustrates light emission intensity according to a first thickness T1 from the first light generating layer EML1 to the first lower electrode 121 and a second thickness T2 from the first light generating layer EML1 to the first upper electrode 141. In this case, the first light generating layer EML1 has a fixed value which is set to 20 nm. FIG. 14A illustrates the first subpixel P1 of the display device 100 according to the second aspect of the present disclosure.

Referring to FIGS. 13a and 14a, the first thickness T1 may be equal to, but not limited to, a sum of thicknesses of the hole injection layer HIL and the hole transporting layer HTL, which are included in the first pixel light emitting layer 131.

The second thickness T2 may be equal to, but not limited to, a sum of thicknesses of the first electron transporting layer ETL and the second photo chromic electron transporting layer PC-ETL, which are included in the first pixel light emitting layer 131. The first electron transporting layer ETL may be omitted, and in this case, the second thickness T2 may be equal to the thickness of the second photo chromic electron transporting layer PC-ETL.

The light emitted from the first light generating layer EML1 has maximum intensity due to reinforcing interference occurring in a ridge R shown in FIG. 13A, and has minimum intensity due to offset interference occurring in a valley V. The first thickness T1 and the second thickness T2 may correspond to one of a plurality of points where the ridge R shown in FIG. 13a is located.

Therefore, the first subpixel P1 displays light of the first color emitted from the first light generating layer EML1.

FIG. 13B illustrates light emission intensity according to a third thickness T3 from the second light generating layer EML2 to the second lower electrode 122 and a fourth thickness T4 from the second light generating layer EML2 to the second upper electrode 142. In this case, the second light generating layer EML2 has a fixed value which is set to 20 nm. FIG. 14B illustrates the second subpixel P2 of the display device 100 according to the second aspect of the present disclosure.

Referring to FIGS. 13B and 14B, the third thickness T3 may be equal to, but not limited to, a sum of thicknesses of the hole injection layer HIL and the hole transporting layer HTL, which are included in the second pixel light emitting layer 132, and the first pixel light emitting layer 131. The hole injection layer HIL may be omitted. In this case, the third thickness T3 may be equal to a sum of thicknesses of the hole transporting layer HTL included in the second pixel light emitting layer 132, and the first pixel light emitting layer 131.

The fourth thickness T4 may be equal to, but not limited to, a sum of thicknesses of the first electron transporting layer ETL and the second photo chromic electron transporting layer PC-ETL, which are included in the second pixel light emitting layer 132. The first electron transporting layer ETL may be omitted, and in this case, the fourth thickness T4 may be equal to the thickness of the second photo chromic electron transporting layer PC-ETL included in the second pixel light emitting layer 132.

The light emitted from the second light generating layer EML2 has maximum intensity due to reinforcing interference occurring in a ridge R shown in FIG. 13b, and has minimum intensity due to offset interference occurring in a valley V. The third thickness T3 and the fourth thickness T4 may correspond to one of a plurality of points where the ridge R shown in FIG. 13b is located.

Meanwhile, the light emitted from the first light generating layer EML1 arranged in the second subpixel P2 may be not emitted to the outside. Therefore, a fifth thickness T5 from the first light generating layer EML1 to the second lower electrode 122 and a sixth thickness T6 from the first light generating layer EML1 to the second upper electrode 142 may correspond to one of a plurality of points where the valley V shown in FIG. 13A is located. At this time, the fifth thickness T5 may be equal to, but not limited to, the first thickness T1. If the thickness of the first lower electrode 121 is equal to the thickness of the second lower electrode 122, the fifth thickness T5 may be equal to the first thickness T1. However, if the thickness of the first lower electrode 121 is different from the thickness of the second lower electrode 122, the fifth thickness T5 may be different from the first thickness T1.

The thickness of each layer in the second subpixel P2 may be provided to satisfy a first condition that the third thickness T3 and the fourth thickness T4 correspond to one of the plurality of points where the ridge R shown in FIG. 13b is located and a second condition that the fifth thickness T5 and the sixth thickness T6 correspond to one of the plurality of points where the valley V shown in FIG. 13A is located.

Therefore, the second subpixel P2 displays light of the second color emitted from the second light generating layer EML2.

FIG. 13C illustrates light emission intensity according to a seventh thickness T7 from the third light generating layer EML3 to the third lower electrode 123 and an eighth thickness T8 from the third light generating layer EML3 to the third upper electrode 143. In this case, the third light generating layer EML3 has a fixed value which is set to 20 nm. FIG. 14c illustrates the third subpixel P3 of the display device 100 according to the second aspect of the present disclosure.

Referring to FIGS. 13C and 14C, the seventh thickness T7 may be equal to, but not limited to, a sum of thicknesses of the hole injection layer HIL and the hole transporting layer HTL, which are included in the third pixel light emitting layer 133, and the first and second pixel light emitting layers 131 and 132. The hole injection layer HIL may be omitted, and in this case, the seventh thickness T7 may be equal to a sum of thicknesses of the hole transporting layer HTL included in the third pixel light emitting layer and the first and second pixel light emitting layers 131 and 132.

The eighth thickness T8 may be equal to, but not limited to, a sum of thicknesses of the first electron transporting layer ETL and the second photo chromic electron transporting layer PC-ETL, which are included in the third pixel light emitting layer 132. The first electron transporting layer ETL may be omitted, and in this case, the eighth thickness T8 may be equal to the thickness of the second photo chromic electron transporting layer PC-ETL included in the third pixel light emitting layer 133.

The light emitted from the third light generating layer EML3 has maximum intensity due to reinforcing interference occurring in a ridge R shown in FIG. 13C, and has minimum intensity due to offset interference occurring in a valley V. The seventh thickness T7 and the eighth thickness T8 may correspond to one of a plurality of points where the ridge R shown in FIG. 13c is located.

Meanwhile, the light emitted from the first light generating layer EML1 arranged in the third subpixel P3 may be not emitted to the outside. Therefore, a ninth thickness T9 from the first light generating layer EML1 to the third lower electrode 123 and a tenth thickness T10 from the first light generating layer EML1 to the third upper electrode 143 may correspond to one of the plurality of points where the valley V shown in FIG. 13A is located. At this time, the ninth thickness T9 may be equal to, but not limited to, the first thickness T1. If the thickness of the first lower electrode 121 is equal to the thickness of the third lower electrode 123, the ninth thickness T9 may be equal to the first thickness T1. However, if the thickness of the first lower electrode 121 is different from the thickness of the third lower electrode 123, the ninth thickness T9 may be different from the first thickness T1.

Also, the light emitted from the second light generating layer EML2 arranged in the third subpixel P3 may not be emitted to the outside. Therefore, an eleventh thickness T11 from the second light generating layer EML2 to the third lower electrode 123 and a twelfth thickness T12 from the second light generating layer EML2 to the third upper electrode 143 may correspond to one of the plurality of points where the valley V shown in FIG. 13b is located. At this time, the eleventh thickness T11 may be equal to, but not limited to, the third thickness T3. If the thickness of the second lower electrode 122 is equal to the thickness of the third lower electrode 123, the eleventh thickness T11 may be equal to the third thickness T3. However, if the thickness of the second lower electrode 122 is different from the thickness of the third lower electrode 123, the eleventh thickness T11 may be different from the third thickness T3.

The thickness of each layer in the third subpixel P3 may be provided to satisfy a first condition that the seventh thickness T7 and the eighth thickness T8 correspond to one of a plurality of points where the ridge R shown in FIG. 13c is located, a second condition that the ninth thickness T9 and the tenth thickness T10 correspond to one of the plurality of points where the valley V shown in FIG. 13a is located, and a third condition that the eleventh thickness T11 and the twelfth thickness T12 correspond to one of the plurality of points where the valley V shown in FIG. 13B is located.

Figure 15A:
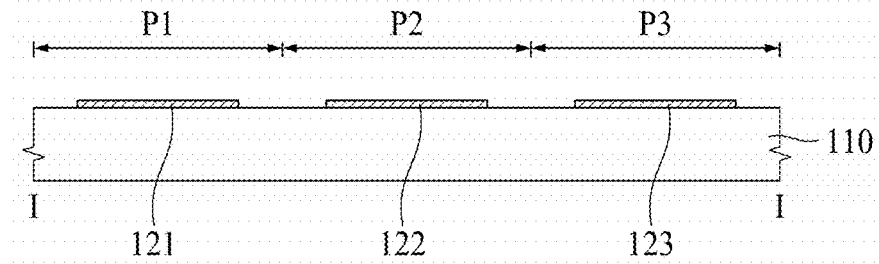
FIGS. 15A to 15N are cross-sectional views illustrating a manufacturing method of a display device according to the second aspect of the present disclosure.
Figure 15B:
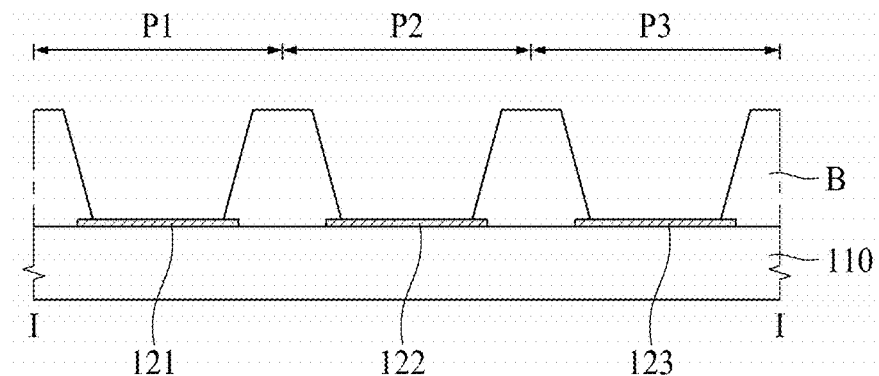
Figure 15C:
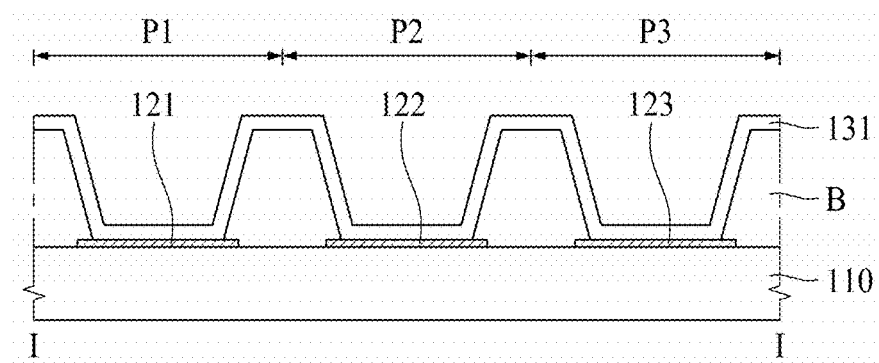
Figure 15D:
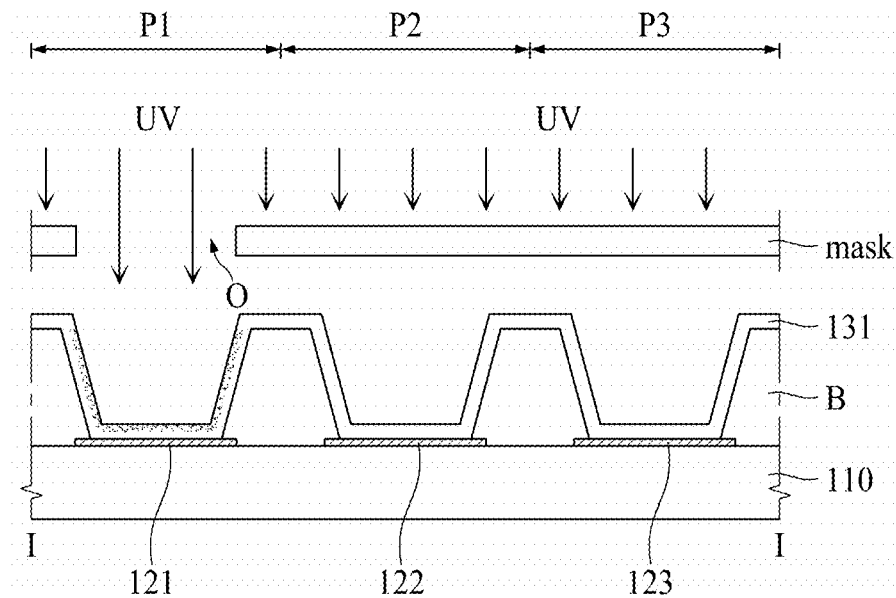
Figure 15E:
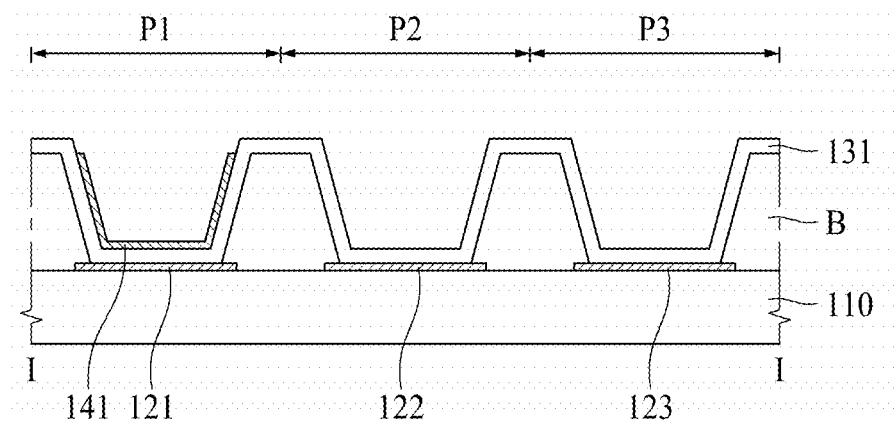
Figure 15F:
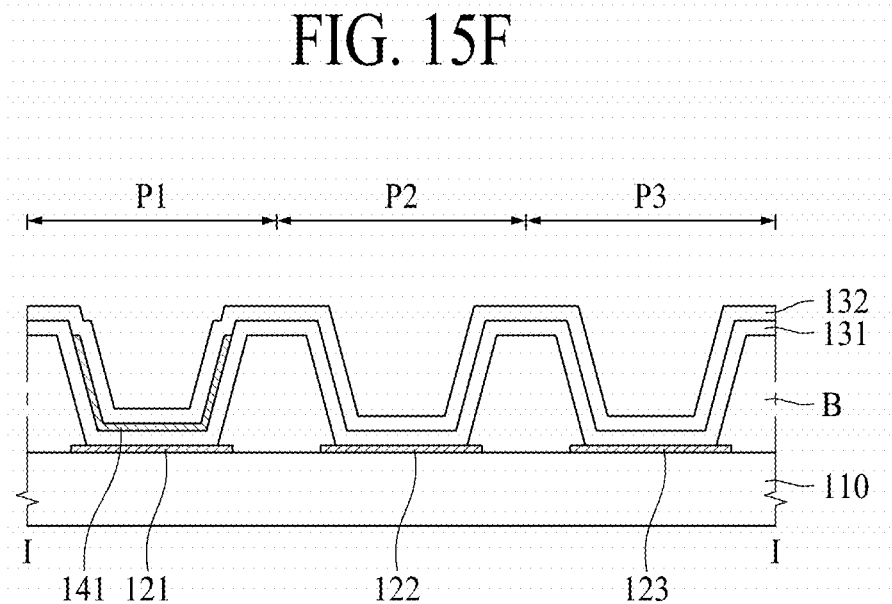
Figure 15G:
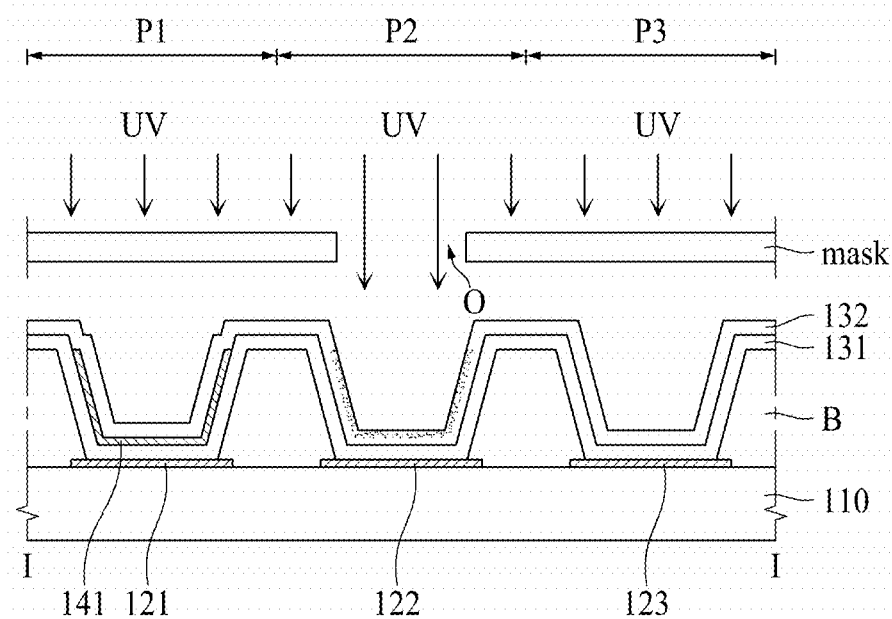
Figure 15H:
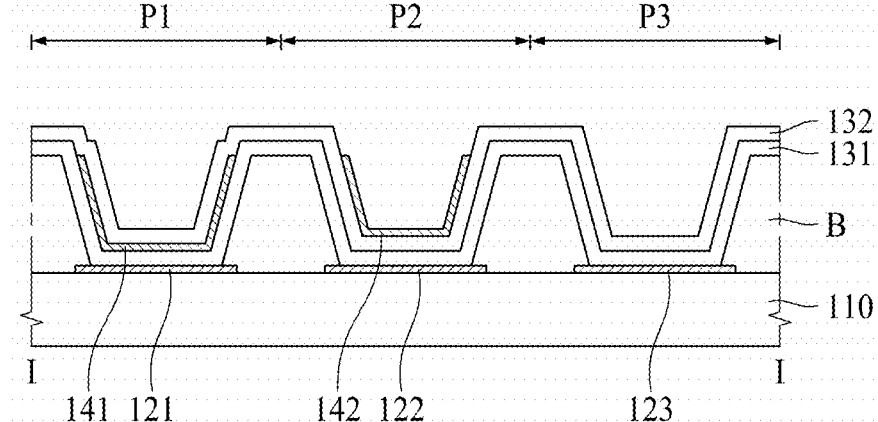
Figure 15I:
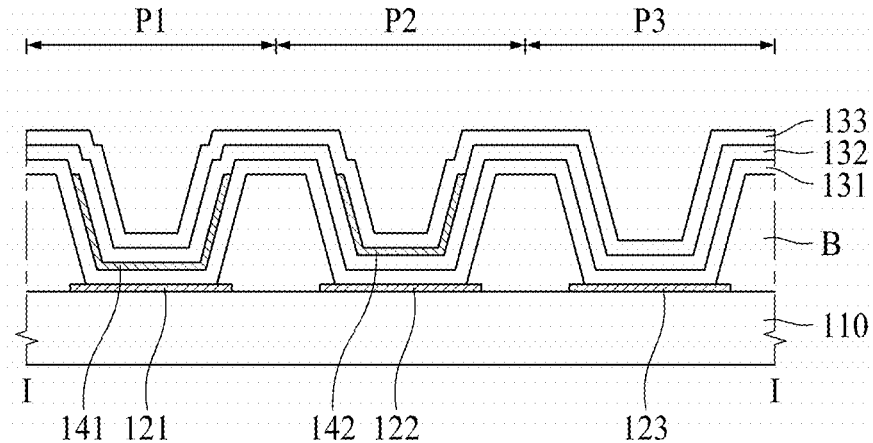
Figure 15J:
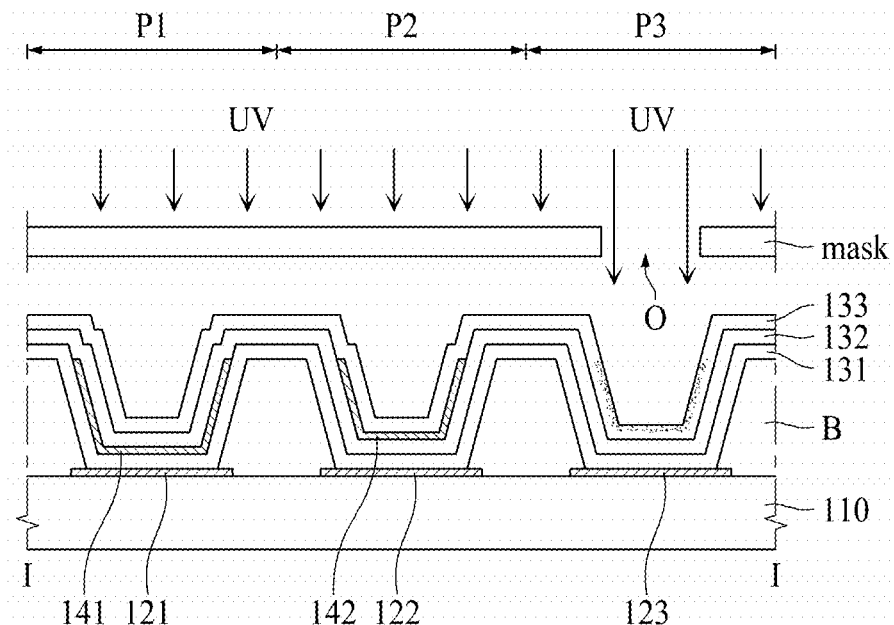
Figure 15K:
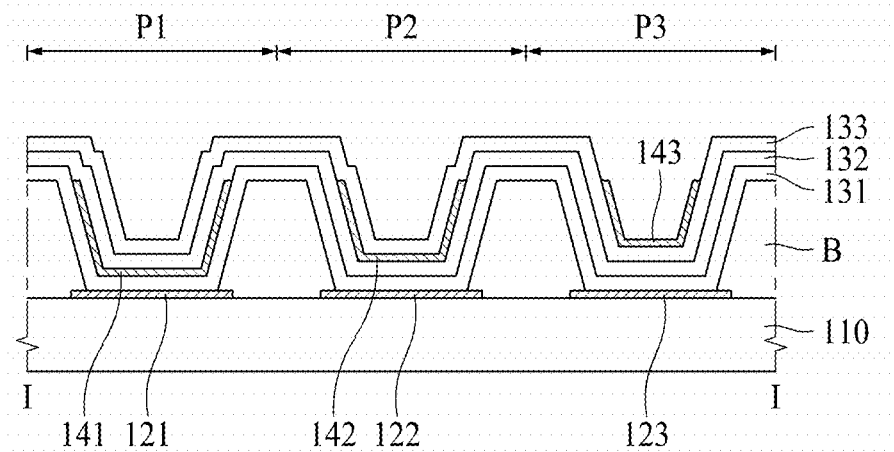
Figure 15L:
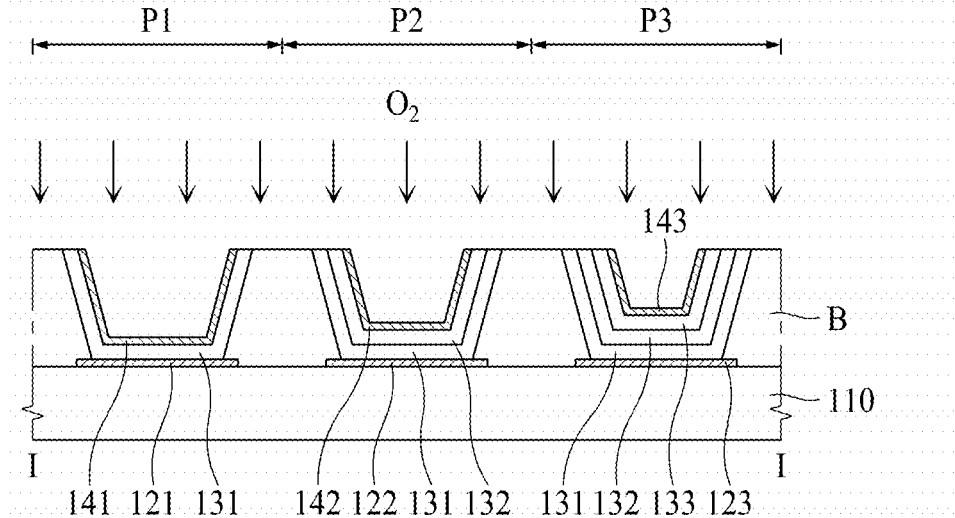
Figure 15M:
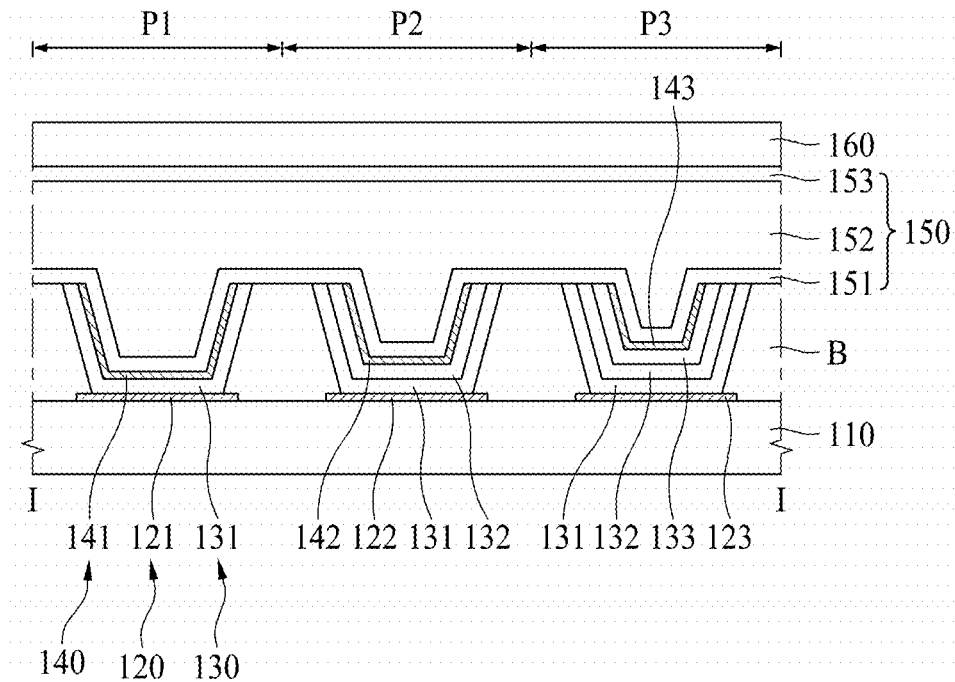
Figure 15N:
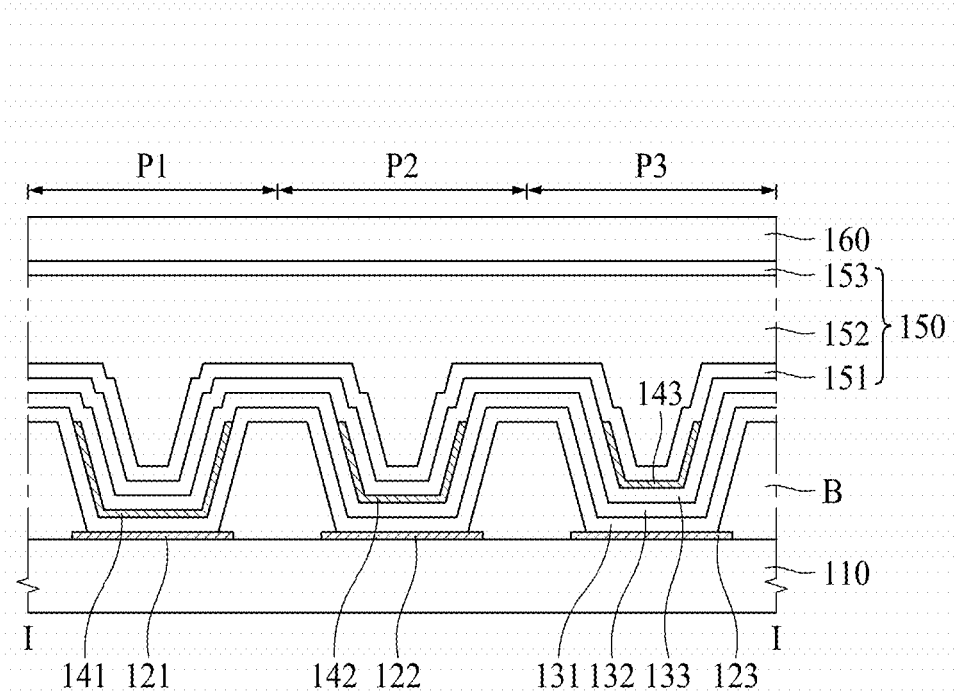

FIGS. 15A to 15N are cross-sectional views illustrating a manufacturing method of a display device according to the second aspect of the present disclosure.

First of all, as shown in FIG. 15A, transistors (not shown) and a lower electrode 120 are formed on a substrate 110.

In detail, an active layer of each of the transistors is formed on the substrate 110. The active layer may be formed of a polycrystalline silicon based semiconductor material, a single crystalline silicon based semiconductor material, or an oxide based semiconductor material.

Then, a gate insulating film is formed on the active layer. The gate insulating film may be formed of an inorganic film, for example, a silicon oxide (SiOx) film, a silicon nitride (SiNx) film, or a multi-layered film of SiOx and SiNx.

Then, a gate electrode is formed on the gate insulating film.

Then, a first insulating film is formed on the active layer and the gate electrode, the first insulating film may be formed of an inorganic film, for example, a silicon oxide (SiOx) film, a silicon nitride (SiNx) film, or a multi-layered film of SiOx and SiNx.

Then, first and second contact holes passing through the first insulating film are formed. A source electrode connected to the active layer through the first contact hole and a drain electrode connected to the active layer through the second contact hole are formed on the first insulating film.

Then, the first insulating film is additionally formed on the source electrode and the drain electrode. A third contact hole is formed, which passes through the first insulating film which is additionally formed. An M3 metal layer connected to the drain electrode through the third contact hole is formed on the first insulating film which is additionally formed.

Then, a second insulating film is formed on the M3 metal layer. The second insulating film may be formed of an inorganic film, for example, a silicon oxide (SiOx) film, a silicon nitride (SiNx) film, or a multi-layered film of SiOx and SiNx.

Then, a fourth contact hole is formed, which is connected to the M3 metal layer through the second insulating film. An M4 metal layer connected to the M3 metal layer through the fourth contact hole is formed on the second insulating film.

Then, the second insulating film is additionally formed on the M4 metal layer. A fifth contact hole is formed, which is connected to the M4 metal layer through the second insulating film which is additionally formed. The M3 metal layer, the M4 metal layer and the second insulating film may be omitted.

Then, the lower electrodes 120 are formed on the second insulating film. In more detail, a lower electrode film is formed on the second insulating film. The lower electrode film may be formed to include a metal material of high reflectivity such as a deposited structure (Ti/Al/Ti) of aluminum and titanium, a deposited structure (ITO/Al/ITO) of aluminum and ITO, an APC alloy, and a deposited structure (ITO/APC/ITO) of APC alloy and ITO. The APC alloy is an alloy of silver (Ag), palladium (Pb), and Copper (Cu).

Then, a photoresist pattern is formed on the lower electrode film. The photoresist pattern may be formed on a position where first, second and third subpixels P1, P2 and P3 will be formed. The lower electrode film which is not covered by the photoresist pattern is dry etched to form the first, second and third lower electrodes 121, 122 and 123 as shown in FIG. 15a, and the photoresist pattern is removed.

Next, as shown in FIG. 15B, a bank B is formed to cover edges of the first, second and third lower electrodes 121, 122 and 123.

In detail, a charging material is formed on the first, second and third lower electrodes 121, 122 and 123. The charging material may be an organic material, for example, acryl resin, epoxy resin, phenolic resin, polyamide resin, or polyimide resin.

Then, the bank B is formed by dry etching. A material, which can etch the charging material but cannot etch the first, second and third lower electrodes 121, 122 and 123, may be selected as a dry etching material.

Next, a first pixel light emitting layer 131 and a first upper electrode 141 are formed to be patterned in the first subpixel P1.

In more detail, as shown in FIG. 15C, the first pixel light emitting layer 131 is formed on the first, second and third lower electrodes 121, 122 and 123 and the bank B. The first pixel light emitting layer 131 may be formed by a deposition process or a solution process. If the first pixel light emitting layer 131 is formed by a deposition process, an evaporation method may be used.

The first pixel light emitting layer 131 includes a hole transporting layer HTL, a first light generating layer EML1 for emitting light of a first color, a first electron transporting layer ETL, and a second photo chromic electron transporting layer PC-ETL. The first color may be, but not limited to, blue (B).

The second photo chromic electron transporting layer PC-ETL includes an electron transporting material and a photoisomerized material.

The electron transporting material is a material that smoothly moves electrons to the first light generating layer EML1, the second light generating layer EML2 and the third light generating layer EML3. For example, the electron transporting material may include at least any one selected from a group made of Alq3, PBD, TAZ, spiro-PBD, BAlq, Liq (lithium quinolate), BMB-2T, BMB-3T, PF-6P, TPBI, COT and SAlq. The electron transporting material may also be included in the first electron transporting layer ETL. The first electron transporting layer ETL and the second photo chromic electron transporting layer PC-ETL may include their respective electron transporting materials different from each other, or may include the same electron transporting material.

The photoisomerized material is a material changed to an isomer having another physical or chemical characteristic if it is exposed to light such as UV, and for example, may be a photo chromic. The photo chromic is a material, of which color is changed if it is exposed to light such as UV and returns to an original color if light is shielded. For example, the photo chromic may include a diarylethene based compound.

Then, as shown in FIG. 15D, UV is irradiated to only the first subpixel P1. A mask is arranged on the second and third subpixels P2 and P3, and an open area O of the mask is arranged on the first subpixel P1. In this state, UV is irradiated to only the second photo chromic electron transporting layer PC-ETL arranged in the first subpixel P1. Therefore, the second photo chromic electron transporting layer PC-ETL of the first pixel light emitting layer 131 arranged in the first subpixel P1 is changed to an isomer having physical or chemical characteristic different from that of the second photo chromic electron transporting layer PC-ETL of the first pixel light emitting layer 131 arranged in the second and third subpixels P2 and P3.

Then, as shown in FIG. 15E, the first upper electrode 141 is formed to be patterned in the first subpixel P1. The second photo chromic electron transporting layer PC-ETL of the first pixel light emitting layer 131 to which UV has been irradiated is subjected to nucleation and thus has a high deposition rate of a metal material. That is, a metal material may well be deposited on the photoisomerized material to which UV has been irradiated. On the other hand, the second photo chromic electron transporting layer PC-ETL of the first pixel light emitting layer 131 to which UV has not been irradiated is subjected to desorption and thus has a low deposition rate of a metal material. That is, a metal material may not be well deposited on the photoisomerized material to which UV has not been irradiated. As a result, the first upper electrode 141 is formed to be patterned on only the second photo chromic electron transporting layer PC-ETL of the first pixel light emitting layer 131 arranged in the first subpixel P1.

Next, the second pixel light emitting layer 132 and the second upper electrode 142 are formed to be patterned in the second subpixel P2.

In more detail, as shown in FIG. 15F, the second pixel light emitting layer 132 is formed on the first upper electrode 141 and first pixel light emitting layer 131. The second pixel light emitting layer 132 may be formed by a deposition process or a solution process. If the second pixel light emitting layer 132 is formed by a deposition process, an evaporation method may be used.

The second pixel light emitting layer 132 includes a hole transporting layer HTL, a second light generating layer EML2 for emitting light of a second color different from the first color, a first electron transporting layer ETL, and a second photo chromic electron transporting layer PC-ETL. The second color may be, but not limited to, green (G).

Then, as shown in FIG. 15G, UV is irradiated to only the second subpixel P2. A mask is arranged on the first and third subpixels P1 and P3, and an open area O of the mask is arranged on the second subpixel P2. In this state, UV is irradiated to only the second photo chromic electron transporting layer PC-ETL arranged in the second subpixel P2. Therefore, the second photo chromic electron transporting layer PC-ETL of the second pixel light emitting layer 132 arranged in the second subpixel P2 is changed to an isomer having physical or chemical characteristic different from that of the second photo chromic electron transporting layer PC-ETL of the second pixel light emitting layer 132 arranged in the first and third subpixels P1 and P3.

Then, as shown in FIG. 15H, the second upper electrode 142 is formed to be patterned in the second subpixel P2. The second photo chromic electron transporting layer PC-ETL of the second pixel light emitting layer 132 to which UV has been irradiated is subjected to nucleation and thus has a high deposition rate of a metal material. That is, a metal material may well be deposited on the photoisomerized material to which UV has been irradiated. On the other hand, the second photo chromic electron transporting layer PC-ETL of the second pixel light emitting layer 132 to which UV has not been irradiated is subjected to desorption and thus has a low deposition rate of a metal material. That is, a metal material may not be well deposited on the photoisomerized material to which UV has not been irradiated. As a result, the second upper electrode 142 is formed to be patterned on only the second photo chromic electron transporting layer PC-ETL of the second pixel light emitting layer 132 arranged in the second subpixel P2.

Next, the third pixel light emitting layer 133 and the third upper electrode 143 are formed to be patterned in the third subpixel P3.

In more detail, as shown in FIG. 15I, the third pixel light emitting layer 133 is formed on the second upper electrode 142 and the second pixel light emitting layer 132. The third pixel light emitting layer 133 may be formed by a deposition process or a solution process. If the third pixel light emitting layer 133 is formed by a deposition process, an evaporation method may be used.

The third pixel light emitting layer 133 includes a hole transporting layer HTL, a third light generating layer EML3 for emitting light of a third color different from the first and second colors, a first electron transporting layer ETL, and a second photo chromic electron transporting layer PC-ETL. The third color may be, but not limited to, red (R).

Then, as shown in FIG. 15J, UV is irradiated to only the third subpixel P3. A mask is arranged on the first and second subpixels P1 and P2, and an open area O of the mask is arranged on the third subpixel P3. In this state, UV is irradiated to only the second photo chromic electron transporting layer PC-ETL arranged in the third subpixel P3. Therefore, the second photo chromic electron transporting layer PC-ETL of the third pixel light emitting layer 133 arranged in the third subpixel P3 is changed to an isomer having physical or chemical characteristic different from that of the second photo chromic electron transporting layer PC-ETL of the third pixel light emitting layer 133 arranged in the first and second subpixels P1 and P2.

Then, as shown in FIG. 15K, the third upper electrode 143 is formed to be patterned in the third subpixel P3. The second photo chromic electron transporting layer PC-ETL of the third pixel light emitting layer 133 to which UV has been irradiated is subjected to nucleation and thus has a high deposition rate of a metal material. That is, a metal material may well be deposited on the photoisomerized material to which UV has been irradiated. On the other hand, the second photo chromic electron transporting layer PC-ETL of the third pixel light emitting layer 133 to which UV has not been irradiated is subjected to desorption and thus has a low deposition rate of a metal material. That is, a metal material may not be well deposited on the photoisomerized material to which UV has not been irradiated. As a result, the third upper electrode 143 is formed to be patterned on only the second photo chromic electron transporting layer PC-ETL of the third pixel light emitting layer 133 arranged in the third subpixel P3.

Then, as shown in FIG. 15L, plasma ashing is performed to remove the third pixel light emitting layer 133 formed in the first and second subpixels P1 and P2 and the second pixel light emitting layer 132 formed in the first subpixel P1. The third pixel light emitting layer 133 on which the third upper electrode 143 is not formed may be removed using oxygen plasma. Also, the second pixel light emitting layer 132 on which the second upper electrode 142 is not formed may be removed using oxygen plasma.

Next, as shown in FIG. 15M, an encapsulation layer 150 and a second substrate 160 are formed on the first, second and third upper electrodes 141, 142 and 143.

In more detail, a first inorganic film 151 is formed on the first, second and third upper electrodes 141, 142 and 143. The first inorganic film 151 may be formed of a silicon nitride, an aluminum nitride, a zirconium nitride, a titanium nitride, a hafnium nitride, a tantalum nitride, a silicon oxide, an aluminum oxide, or a titanium oxide. The first inorganic film 151 may be deposited by, but not limited to, a Chemical Vapor Deposition (CVD) method or an Atomic Layer Deposition (ALD) method.

Then, the organic film 152 is formed on the first inorganic film 151. The organic film 152 may be formed of an organic material, for example, acrylic resin, epoxy resin, phenolic resin, polyamide resin, or polyimide resin.

Then, a second inorganic film 153 is formed on the organic film 152. The second inorganic film 153 may be formed of a silicon nitride, an aluminum nitride, a zirconium nitride, a titanium nitride, a hafnium nitride, a tantalum nitride, a silicon oxide, an aluminum oxide, or a titanium oxide. The second inorganic film 153 may be deposited by, but not limited to, a Chemical Vapor Deposition (CVD) method or an Atomic Layer Deposition (ALD) method.

Then, the second substrate 160 is formed on the second inorganic film 153.

Meanwhile, in FIG. 15L, plasma ashing may be performed to remove the third pixel light emitting layer 133 formed in the first and second subpixels P1 and P2 and the second pixel light emitting layer 132 formed in the first subpixel P1. However, without limitation to this example, the plasma ashing process shown in FIG. 15I may be omitted in another aspect. In this case, in a final product step, as shown in FIG. 15n, the second and third pixel light emitting layers 132 and 133 may remain on the first lower electrode 131 in the first subpixel P1, and the third pixel light emitting layer 133 may remain on the second lower electrode 132 in the second subpixel P2.

The display device 100 according to the second aspect of the present disclosure described as above is characterized in that it comprises the second photo chromic electron transporting layer made of an electron transporting material and a photoisomerized material in each of the first pixel light emitting layer 131, the second pixel light emitting layer 132 and the third pixel light emitting layer 133. In the display device 100 according to the second aspect of the present disclosure, UV is selectively irradiated to the second photo chromic electron transporting layer to change the characteristic of the photoisomerized material such that the metal material may well be deposited on the photoisomerized material. As the upper electrode 140 is selectively deposited on the second photo chromic electron transporting layer to which UV has been irradiated, the first, second and third upper electrodes 141, 142 and 143 are respectively formed to be patterned on the first pixel light emitting layer 131, the second pixel light emitting layer 132 and the third pixel light emitting layer 133.

In the display device 100 according to the second aspect of the present disclosure, the first, second and third upper electrodes 141, 142 and 143 as well as the first pixel light emitting layer 131, the second pixel light emitting layer 132 and the third pixel light emitting layer 133 may be formed to be patterned even without FMM. Therefore, in the display device 100 according to the second aspect of the present disclosure, the light emitting layer 130 and the upper electrode 140 may be formed to be patterned accurately. Also, in the display device 100 according to the second aspect of the present disclosure, the cost caused by use and maintenance of the FMM may be reduced.

In the display device 100 according to the second aspect of the present disclosure, the first, second and third upper electrodes 141, 142 and 143 as well as the first pixel light emitting layer 131, the second pixel light emitting layer 132 and the third pixel light emitting layer 133 may be formed to be patterned even without photoresist. In this case, the first, second and third upper electrodes 141, 142 and 143 may be overlapped with one another in the bezel area BA, whereby a predetermined voltage may be applied to each of the first, second and third upper electrodes 141, 142 and 143. However, without limitation to this case, the first, second and third upper electrodes 141, 142 and 143 may be patterned so as not to be overlapped with one another in the bezel area BA, whereby a predetermined voltage may be applied to each of the first, second and third upper electrodes 141, 142 and 143. Therefore, in the display device 100 according to the second aspect of the present disclosure, the light emitting layer 130 and the upper electrode 140 may be prevented from being damaged during a manufacturing process. In the display device 100 according to the second aspect of the present disclosure, lifespan and efficiency of the light emitting diode may be improved.

Also, in the display device 100 according to the second aspect of the present disclosure, since the number of times of the plasma ashing process may be reduced as compared with the display device according to the first aspect of the present disclosure, the manufacturing process may be simplified.

Also, in the display device 100 according to the second aspect of the present disclosure, light of different colors may be emitted from the first, second and third subpixels P1, P2 and P3 even though a separate color filer is not arranged. In the display device 100 according to the second aspect of the present disclosure, the thickness of each layer of the first pixel light emitting layer 131 is formed appropriately in the first subpixel P1 to embody micro cavity characteristic for light of the first color emitted from the first light generating layer EML1. Also, in the display device 100 according to the second aspect of the present disclosure, the thickness of each layer of the first and second pixel light emitting layers 131 and 132 is formed appropriately in the second subpixel P2 such that micro cavity characteristic for light of the second color emitted from the second light generating layer EML2 may be embodied and at the same time light of the first color emitted from the first light generating layer EML1 may become extinct. Also, in the display device 100 according to the second aspect of the present disclosure, the thickness of each layer of the first, second and third pixel light emitting layers 131, 132 and 133 is formed appropriately in the third subpixel P3 such that micro cavity characteristic for light of the third color emitted from the third light generating layer EML3 may be embodied and at the same time light of the first color emitted from the first light generating layer EML1 and light of the second color emitted from the second light generating layer EML2 may become extinct.

Figure 16:
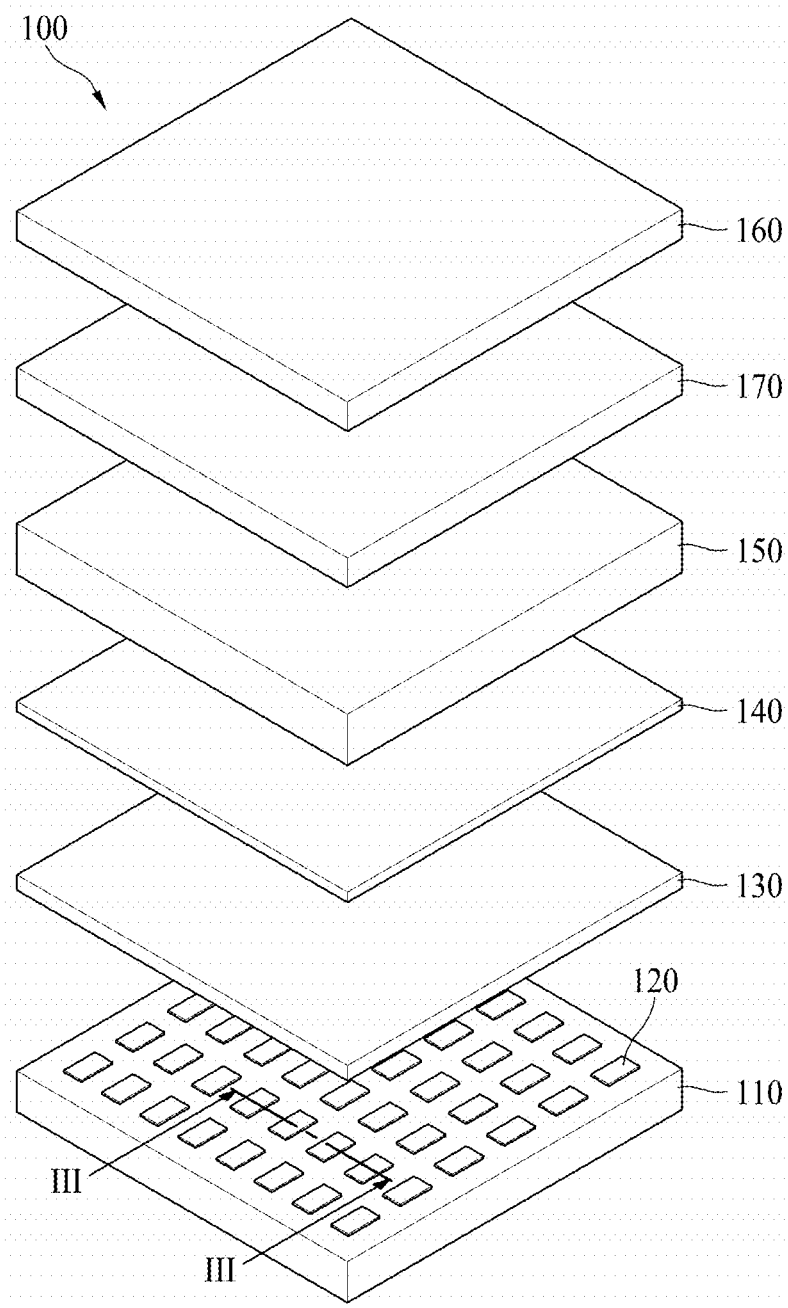
FIG. 16 is a perspective view illustrating a display device according to another aspect of the present disclosure.
Figure 17:
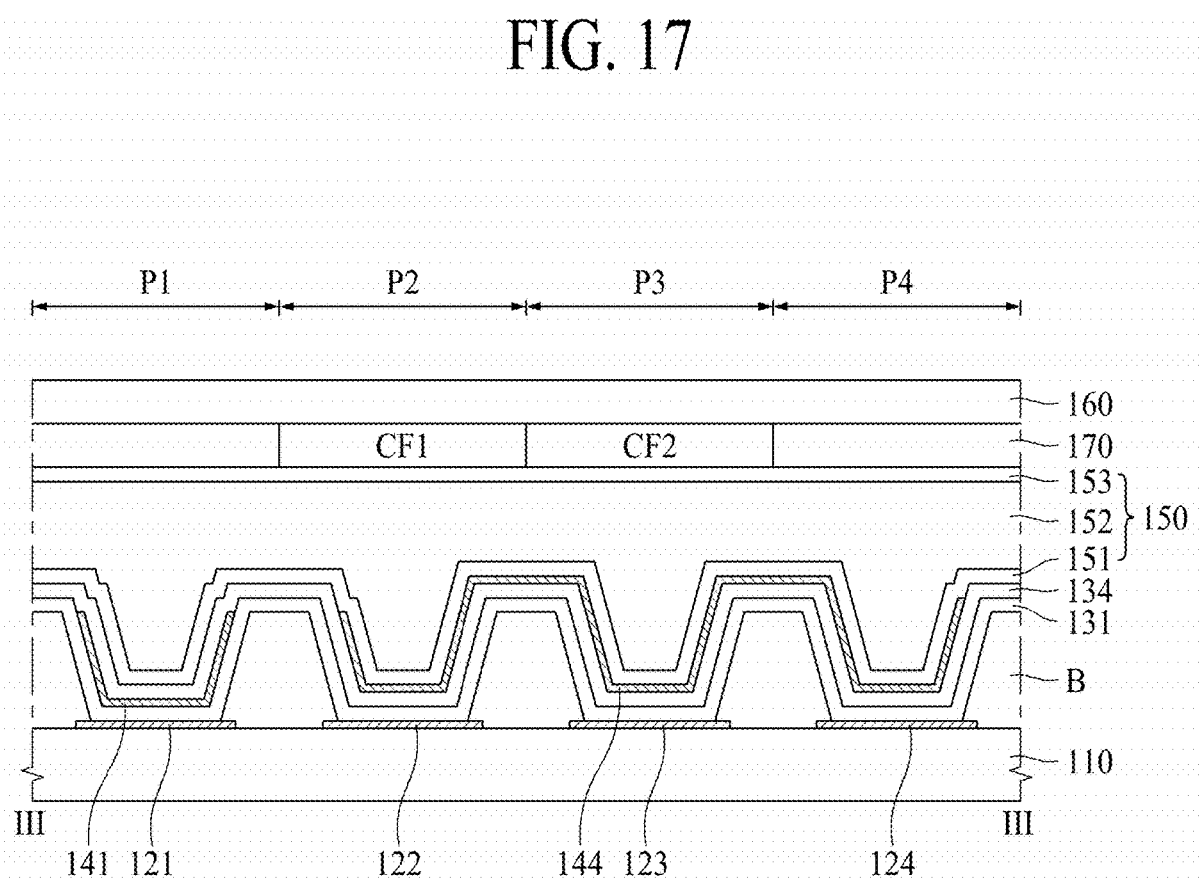
FIG. 17 is a cross-sectional view illustrating one example taken along line III-III of FIG. 16.
Figure 18:
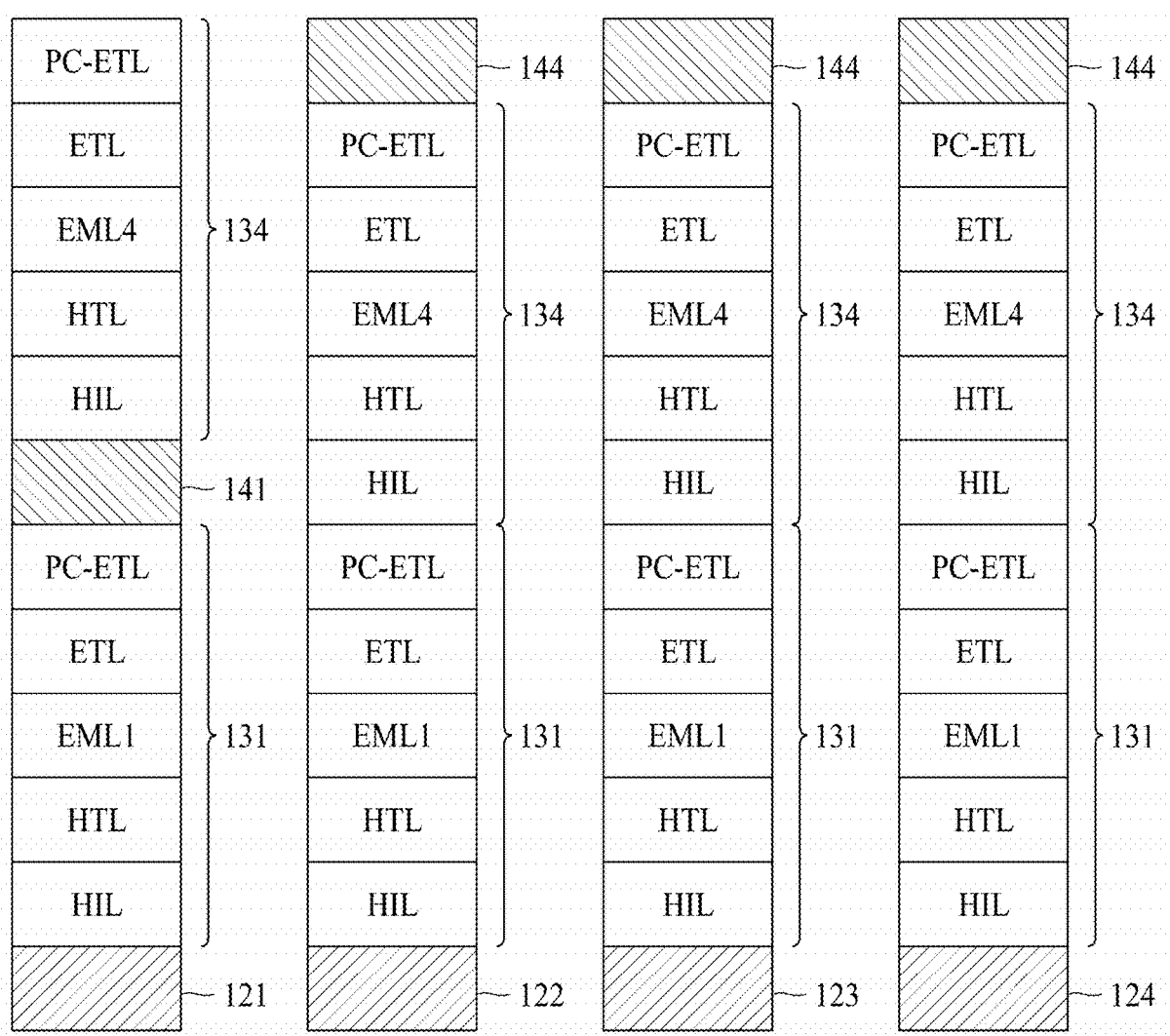
FIG. 18 is a schematic cross-sectional view illustrating an individual subpixel of FIG. 17.

FIG. 16 is a perspective view illustrating a display device according to another aspect of the present disclosure, FIG. 17 is a cross-sectional view illustrating one example taken along line III-III of FIG. 16, and FIG. 18 is a schematic cross-sectional view illustrating an individual subpixel of FIG. 17.

Referring to FIGS. 16, 17 and 18, the display device 100 according to the third aspect of the present disclosure comprises a first substrate 110, a lower electrode 120, a light emitting layer 130, an upper electrode 140, an encapsulation layer 150, a color filter 170 and a second substrate 160.

Since the first substrate 110, the encapsulation layer 150 and the second substrate 160 shown in FIGS. 16 and 17 are substantially the same as the first substrate 110, the encapsulation layer 150 and the second substrate 160 shown in FIGS. 1 and 2, their detailed description will be omitted. Hereinafter, description will be given based on the lower electrode 120, the light emitting layer 130, the upper electrode 140 and the color filter 170 according to the third aspect of the present disclosure.

An area where the lower electrode 120, the light emitting layer 130 and the upper electrode 140 are sequentially deposited may be defined as a subpixel P for emitting predetermined light. The subpixel P may include a first subpixel P1 for emitting blue (B) light, a second subpixel P2 for emitting green (G) light, a third subpixel P3 for emitting red (R) light, and a fourth subpixel P4 for emitting white (W) light. Also, an arrangement sequence of the subpixels P1, P2, P3 and P4 may be changed in various ways.

The lower electrode 120 includes a first lower electrode 121, a second lower electrode 122, a third lower electrode 123 and a fourth lower electrode 124, which are spaced apart from one another at a predetermined interval on the substrate 110. The first lower electrode 121 is formed to be patterned in the first subpixel P1, the second lower electrode 122 is formed to be patterned in the second subpixel P2, the third lower electrode 123 is formed to be patterned in the third subpixel P3, and the fourth lower electrode 124 is formed to be patterned in the fourth subpixel P4. Transistors (not shown) may be arranged in the first, second, third and fourth subpixels P1, P2, P3 and P4, and supply a predetermined voltage to each of the first lower electrode 121, the second lower electrode 122, the third lower electrode 123 and the fourth lower electrode 124 in accordance with a data voltage of a data line if a gate signal from a gate line is input thereto.

The first, second, third and fourth lower electrodes 121, 122, 123 and 124 are provided on the substrate 110. For example, the first, second, third and fourth lower electrodes 121, 122, 123 and 124 may be formed to include a metal material of high reflectivity such as a deposited structure (Ti/Al/Ti) of aluminum and titanium, a deposited structure (ITO/Al/ITO) of aluminum and ITO, an APC alloy, and a deposited structure (ITO/APC/ITO) of APC alloy and ITO. The APC alloy is an alloy of silver (Ag), palladium (Pb), and Copper (Cu). Each of the first, second, third and fourth lower electrodes 121, 122, 123 and 124 may be an anode. Each of the first, second, third and fourth lower electrodes 121, 122, 123 and 124 may be connected with a driving transistor.

A bank B is provided on the substrate 110 to cover an edge of each of the first, second, third and fourth lower electrodes 121, 122, 123 and 124, whereby a light emitting area of each of the first, second, third and fourth subpixels P1, P2, P3 and P4 is defined. That is, an opening area where the bank B is not provided in each of the subpixels P1, P2, P3 and P4 becomes a light emitting area. On the other hand, an area where the bank B is provided in each of the subpixels P1, P2, P3 and P4 becomes a non-light emitting area.

The bank B is provided on the substrate 110 while covering an edge of each of the first, second, third and fourth lower electrodes 121, 122, 123 and 124. Therefore, the first, second, third and fourth lower electrodes 121, 122, 123 and 124 formed to be patterned for the subpixels P1, P2, P3 and P4 may be insulated from one another by the bank B. Also, a problem that luminance efficiency is deteriorated due to a current concentrated on the end of each of the first, second, third and fourth lower electrodes 121, 122, 123 and 124 may be solved.

The bank B may be formed of, but not limited to, an organic film such as acryl resin, epoxy resin, phenolic resin, polyamide resin, and polyimide resin.

The light emitting layer 130 is provided on the lower electrode 120. The light emitting layer 130 includes a first pixel light emitting layer 131 and a fourth pixel light emitting layer 134, which are formed to be patterned to emit light of different colors.

In detail, the first pixel light emitting layer 131 is provided on the first, second, third and fourth lower electrodes 121, 122, 123 and 124 respectively arranged in the first, second, third and fourth subpixels P1, P2, P3 and P4. In this case, the first pixel light emitting layer 131 may be a common layer commonly provided in the first, second, third and fourth subpixels P1, P2, P3 and P4.

The first pixel light emitting layer 131, as shown in FIG. 18, includes a hole transporting layer HTL, a first light generating layer EML1 for emitting light of a first color, a first electron transporting layer ETL, and a second photo chromic electron transporting layer PC-ETL. The first color may be, but not limited to, blue (B).

The fourth pixel light emitting layer 134 is provided on the first pixel light emitting layer 131 arranged in the first, second, third and fourth subpixels P1, P2, P3 and P4. In this case, the fourth pixel light emitting layer 134 may be a common layer commonly provided in the first, second, third and fourth subpixels P1, P2, P3 and P4.

The fourth pixel light emitting layer 134, as shown in FIG. 18, includes a hole transporting layer HTL, a fourth light generating layer EML4 for emitting light of a fourth color different from the first color, a first electron transporting layer ETL, and a second photo chromic electron transporting layer PC-ETL. The fourth color may be, but not limited to, yellow-green (YG).

The hole transporting layer HTL included in each of the first pixel light emitting layer 131 and the fourth pixel light emitting layer 134 serves to smoothly transfer holes to each of the first light generating layer EML1 and the fourth light generating layer EML4.

The first electron transporting layer ETL included in each of the first pixel light emitting layer 131 and the fourth pixel light emitting layer 134 serves to smoothly transfer electrons to each of the first light generating layer EML1 and the fourth light generating layer EML4.

The second photo chromic electron transporting layer PC-ETL included in each of the first pixel light emitting layer 131 and the fourth pixel light emitting layer 134 serves to smoothly transfer electrons to each of the first light generating layer EML1 and the fourth light generating layer EML4. Also, the second photo chromic electron transporting layer PC-ETL serves to allow the upper electrode 140 to be formed to be patterned for the subpixels P1, P2, P3 and P4. To this end, the second photo chromic electron transporting layer PC-ETL includes an electron transporting material and a photoisomerized material.

The electron transporting material is a material that smoothly moves electrons to the first light generating layer EML1 and the fourth light generating layer EML4. For example, the electron transporting material may include at least any one selected from a group made of Alq3, PBD, TAZ, spiro-PBD, BAlq, Liq (lithium quinolate), BMB-2T, BMB-3T, PF-6P, TPBI, COT and SAlq. The electron transporting material may also be included in the first electron transporting layer ETL. The first electron transporting layer ETL and the second photo chromic electron transporting layer PC-ETL may include their respective electron transporting materials different from each other, or may include the same electron transporting material. As the case may be, the first electron transporting layer ETL may be omitted.

The photoisomerized material is a material changed to an isomer having another physical or chemical characteristic if it is exposed to light such as UV, and for example, may be a photo chromic. The photo chromic is a material, of which color is changed if it is exposed to light such as UV and returns to an original color if light is shielded. For example, the photo chromic may include a diarylethene based compound.

The photoisomerized material has a deposition rate of a metal material, which is varied depending on whether it is exposed to light. In detail, the photoisomerized material to which UV has been irradiated is subjected to nucleation and thus has a high deposition rate of a metal material. That is, a metal material may well be deposited on the photoisomerized material to which UV has been irradiated. On the other hand, the photoisomerized material to which UV has not been irradiated is subjected to desorption and thus has a low deposition rate of a metal material. That is, a metal material may not be well deposited on the photoisomerized material to which UV has not been irradiated.

The second photo chromic electron transporting layer PC-ETL may be doped with an n-type dopant.

Meanwhile, the first pixel light emitting layer 131 may further include a hole injection layer HIL between the lower electrodes 121, 122, 123 and 124 and the hole transporting layer HTL. At this time, the hole injection layer HIL may be doped with a p-type dopant to improve mobility.

In the display device 100 according to the third aspect of the present disclosure, the first, second, third and fourth subpixels P1, P2, P3 and P4 have a tandem structure of two stacks. The first and fourth pixel light emitting layers 131 and 134 are provided in all of the first, second, third and fourth subpixels P1, P2, P3 and P4.

However, since the first upper electrode 141 is provided between the first pixel light emitting layer 131 and the fourth pixel light emitting layer 134 in the first subpixel P1, light is emitted from only the first pixel light emitting layer 131 arranged between the first lower electrode 121 and the first upper electrode 141.

At this time, in order to embody micro cavity characteristic for light of the first color emitted from the first light generating layer EML1, a distance between the first lower electrode 121 and the first upper electrode 141 may be provided in the first subpixel P1. As reflection and re-reflection are repeated between the first lower electrode 121 and the first upper electrode 141, reinforcing interference occurs to amplify light, whereby light of the first color emitted from the first light generating layer EML1 is emitted to the outside. As a result, light of the first color is emitted in the first subpixel P1.

On the other hand, the fourth pixel light emitting layer 134 is directly provided on the first pixel light emitting layer 131 in the second, third and fourth subpixels P2, P3 and P4. In this case, the second photo chromic electron transporting layer PC-ETL of the first pixel light emitting layer 131 and the hole injection layer HIL of the fourth pixel light emitting layer 134 may adjoin each other to serve as charge generation layers. The second photo chromic electron transporting layer PC-ETL of the first pixel light emitting layer 131 may be doped with an n-type dopant and inject electrons into the first pixel light emitting layer 131, and the hole injection layer HIL of the fourth pixel light emitting layer 134 may be doped with a p-type dopant and inject holes into the fourth pixel light emitting layer 134.

In the second, third and fourth subpixels P2, P3 and P4, light of the first color is emitted from the first light generating layer EML1 included in the first pixel light emitting layer 131 and light of the fourth color is emitted from the fourth light generating layer EML4 included in the fourth pixel light emitting layer 134. As a result, mixed light of the first color and the fourth color is emitted in the second, third and fourth subpixels P2, P3 and P4. In this case, the mixed light may be white light.

Meanwhile, although FIGS. 17 and 18 illustrate that the display device comprises only the first and fourth pixel light emitting layers 131 and 134, the present disclosure is not limited to the examples of FIGS. 17 and 18. In the display device 100 according to the third aspect of the present disclosure, the mixed light of the colors emitted from the plurality of pixel light emitting layers is white light. In another aspect, the display device 100 may comprise the first, second and third pixel light emitting layers 131, 132 and 133. In this case, the first, second and third pixel light emitting layers 131, 132 and 133 may be common layers commonly provided for the first, second, third and fourth subpixels P1, P2, P3 and P4.

The upper electrode 140 is provided on the light emitting layer 130. The upper electrode 140 includes the first upper electrode 141 and the fourth upper electrode 144, which are formed to be patterned in the first, second, third and fourth subpixels P1, P2, P3 and P4.

In detail, the first upper electrode 141 is formed to be patterned on the first pixel light emitting layer 131 arranged in the first subpixel P1. The first upper electrode 141 may be formed in such a manner that UV is irradiated to the first pixel light emitting layer 131 arranged in the first subpixel P1, especially the second photo chromic electron transporting layer PC-ETL and then a metal material is deposited thereon after the first pixel light emitting layer 131 is formed on the lower electrode 120. Therefore, the first upper electrode 141 is formed to be patterned on only the first pixel light emitting layer 131 arranged in the first subpixel P1. At this time, the first upper electrode 141 is formed to adjoin the second photo chromic electron transporting layer PC-ETL of the first pixel light emitting layer 131.

The fourth upper electrode 144 is formed to be patterned in the fourth pixel light emitting layer 134 arranged in the second, third and fourth subpixels P2, P3 and P4. The fourth upper electrode 144 may be formed in such a manner that UV is irradiated to the fourth pixel light emitting layer 134 arranged in the second, third and fourth subpixels P2, P3 and P4, especially the second photo chromic electron transporting layer PC-ETL and then a metal material is deposited thereon after the fourth pixel light emitting layer 134 is formed on the first pixel light emitting layer 131. Therefore, the fourth upper electrode 144 is formed to be patterned on only the fourth pixel light emitting layer 134 arranged in the second, third and fourth subpixels P2, P3 and P4. At this time, the fourth upper electrode 144 is formed to adjoin the second photo chromic electron transporting layer PC-ETL of the fourth pixel light emitting layer 134.

The first and fourth upper electrodes 141 and 144 may be formed of a transparent conductive material (TCO) such as ITO and IZO, which can transmit light, or may be formed of a semi-transmissive conductive material such as Mg, Ag, or Alloy of Mg and Ag.

The color filter 170 is provided on the encapsulation layer 150. The color filter 170 includes a first color filter CF1 arranged to correspond to the second subpixel P2 and a second color filter CF2 arranged to correspond to the third subpixel P3.

The first and second color filters CF1 and CF2 may be varied depending on a color of light emitted from the first emitting layer EML1 included in the first pixel light emitting layer 131. If the color of light emitted from the first light generating layer EML1 included in the first pixel light emitting layer 131 is blue (B), the first subpixel P1 emits light of a blue (B) color even without a separate color filter. In this case, the first color filter CF1 may be a green color filter that transmits light of a green (G) color, and the second color filter CF2 may be a red color filter that transmits light of a red (R) color.

Meanwhile, if the color of light emitted from the first light generating layer EML1 included in the first pixel light emitting layer 131 is green (G), the first subpixel P1 emits light of a green (G) color even without a separate color filter. In this case, the first color filter CF1 may be a blue color filter that transmits light of a blue (B) color, and the second color filter CF2 may be a red color filter that transmits light of a red (R) color.

Meanwhile, if the color of light emitted from the first light generating layer EML1 included in the first pixel light emitting layer 131 is red (R), the first subpixel P1 emits light of a red (R) color even without a separate color filter. In this case, the first color filter CF1 may be a green color filter that transmits light of a green (G) color, and the second color filter CF2 may be a blue color filter that transmits light of a blue (B) color.

The color filter 170 may further include a transparent organic film (not shown) arranged to correspond to the first and fourth subpixels P1 and P4.

FIGS. 19A to 19I are cross-sectional views illustrating a manufacturing method of a display device according to the third aspect of the present disclosure.

Figure 19A:
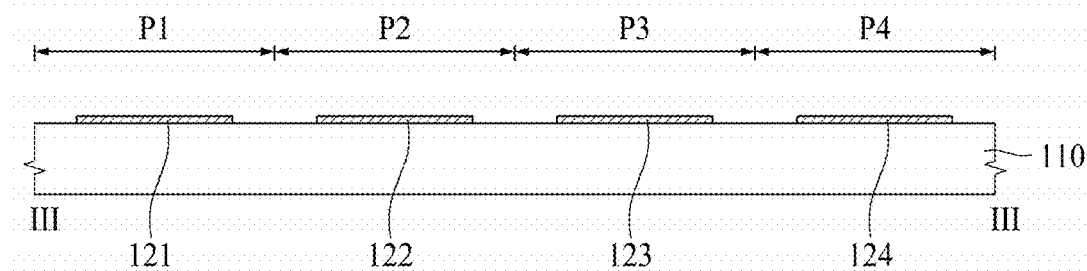
FIGS. 19A to 19I are cross-sectional views illustrating a manufacturing method of a display device according to the third aspect of the present disclosure.

First of all, as shown in FIG. 19A, transistors (not shown) and a low electrode 120 are formed on a substrate 110.

In detail, an active layer of each of the transistors is formed on the substrate 110. The active layer may be formed of a polycrystalline silicon based semiconductor material, a single crystalline silicon based semiconductor material, or an oxide based semiconductor material.

Then, a gate insulating film is formed on the active layer. The gate insulating film may be formed of an inorganic film, for example, a silicon oxide (SiOx) film, a silicon nitride (SiNx) film, or a multi-layered film of SiOx and SiNx.

Then, a gate electrode is formed on the gate insulating film.

Then, a first insulating film is formed on the active layer and the gate electrode, the first insulating film may be formed of an inorganic film, for example, a silicon oxide (SiOx) film, a silicon nitride (SiNx) film, or a multi-layered film of SiOx and SiNx.

Then, first and second contact holes passing through the first insulating film are formed. A source electrode connected to the active layer through the first contact hole and a drain electrode connected to the active layer through the second contact hole are formed on the first insulating film.

Then, the first insulating film is additionally formed on the source electrode and the drain electrode. A third contact hole is formed, which passes through the first insulating film which is additionally formed. An M3 metal layer connected to the drain electrode through the third contact hole is formed on the first insulating film which is additionally formed.

Then, a second insulating film is formed on the M3 metal layer. The second insulating film may be formed of an inorganic film, for example, a silicon oxide (SiOx) film, a silicon nitride (SiNx) film, or a multi-layered film of SiOx and SiNx.

Then, a fourth contact hole is formed, which is connected to the M3 metal layer through the second insulating film. An M4 metal layer connected to the M3 metal layer through the fourth contact hole is formed on the second insulating film.

Then, the second insulating film is additionally formed on the M4 metal layer. A fifth contact hole is formed, which is connected to the M4 metal layer through the second insulating film which is additionally formed. The M3 metal layer, the M4 metal layer and the second insulating film may be omitted.

Then, the lower electrodes 120 are formed on the second insulating film. In more detail, a lower electrode film is formed on the second insulating film. The lower electrode film may be formed to include a metal material of high reflectivity such as a deposited structure (Ti/Al/Ti) of aluminum and titanium, a deposited structure (ITO/Al/ITO) of aluminum and ITO, an APC alloy, and a deposited structure (ITO/APC/ITO) of APC alloy and ITO. The APC alloy is an alloy of silver (Ag), palladium (Pb), and Copper (Cu).

Then, a photoresist pattern is formed on the lower electrode film. The photoresist pattern may be formed on a position where first, second, third and fourth subpixels P1, P2, P3 and P4 will be formed. The lower electrode film which is not covered by the photoresist pattern is dry etched to form the first, second, third and fourth lower electrodes 121, 122, 123 and 124 as shown in FIG. 19a, and the photoresist pattern is removed.

Figure 19B:
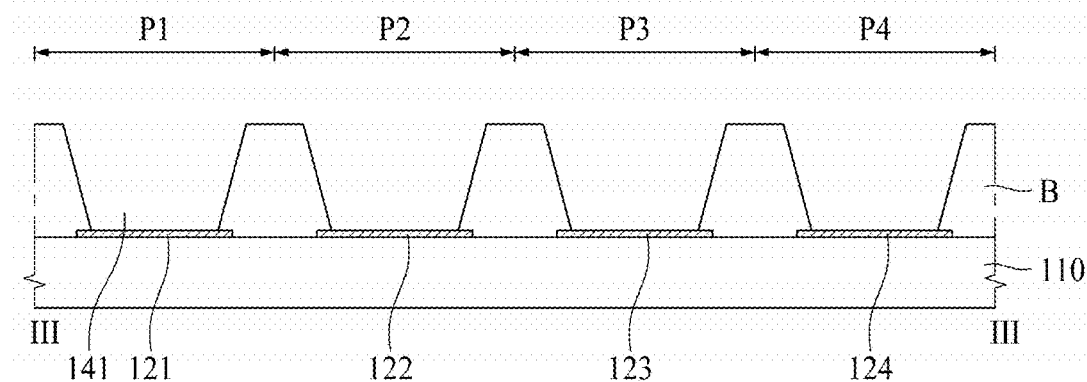

Next, as shown in FIG. 19B, a bank B is formed to cover edges of the first, second, third and fourth lower electrodes 121, 122, 123 and 124.

In detail, a charging material is formed on the first, second, third and fourth lower electrodes 121, 122, 123 and 124. The charging material may be an organic material, for example, acryl resin, epoxy resin, phenolic resin, polyamide resin, or polyimide resin.

Then, the bank B is formed by dry etching. A material, which can etch the charging material but cannot etch the first, second, third and fourth lower electrodes 121, 122, 123 and 124, may be selected as a dry etching material.

Next, a first pixel light emitting layer 131 and a first upper electrode 141 are formed to be patterned in the first subpixel P1.

Figure 19C:
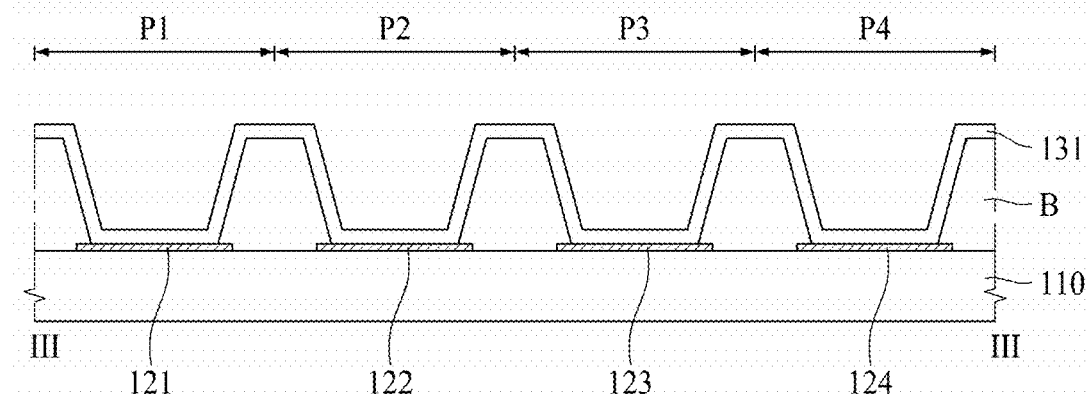

In more detail, as shown in FIG. 19C, the first pixel light emitting layer 131 is formed on the first, second, third and fourth lower electrodes 121, 122, 123 and 124 and the bank B. The first pixel light emitting layer 131 may be formed by a deposition process or a solution process. If the first pixel light emitting layer 131 is formed by a deposition process, an evaporation method may be used.

The first pixel light emitting layer 131 includes a hole transporting layer HTL, a first light generating layer EML1 for emitting light of a first color, a first electron transporting layer ETL, and a second photo chromic electron transporting layer PC-ETL. The first color may be, but not limited to, blue (B).

The second photo chromic electron transporting layer PC-ETL includes an electron transporting material and a photoisomerized material.

The electron transporting material is a material that smoothly moves electrons to the first light generating layer EML1 and the fourth light generating layer EML4. For example, the electron transporting material may include at least any one selected from a group made of Alq3, PBD, TAZ, spiro-PBD, BAlq, Liq (lithium quinolate), BMB-2T, BMB-3T, PF-6P, TPBI, COT and SAlq. The electron transporting material may also be included in the first electron transporting layer ETL. The first electron transporting layer ETL and the second photo chromic electron transporting layer PC-ETL may include their respective electron transporting materials different from each other, or may include the same electron transporting material.

The photoisomerized material is a material changed to an isomer having another physical or chemical characteristic if it is exposed to light such as UV, and for example, may be a photo chromic. The photo chromic is a material, of which color is changed if it is exposed to light such as UV and returns to an original color if light is shielded. For example, the photo chromic may include a diarylethene based compound.

Figure 19D:
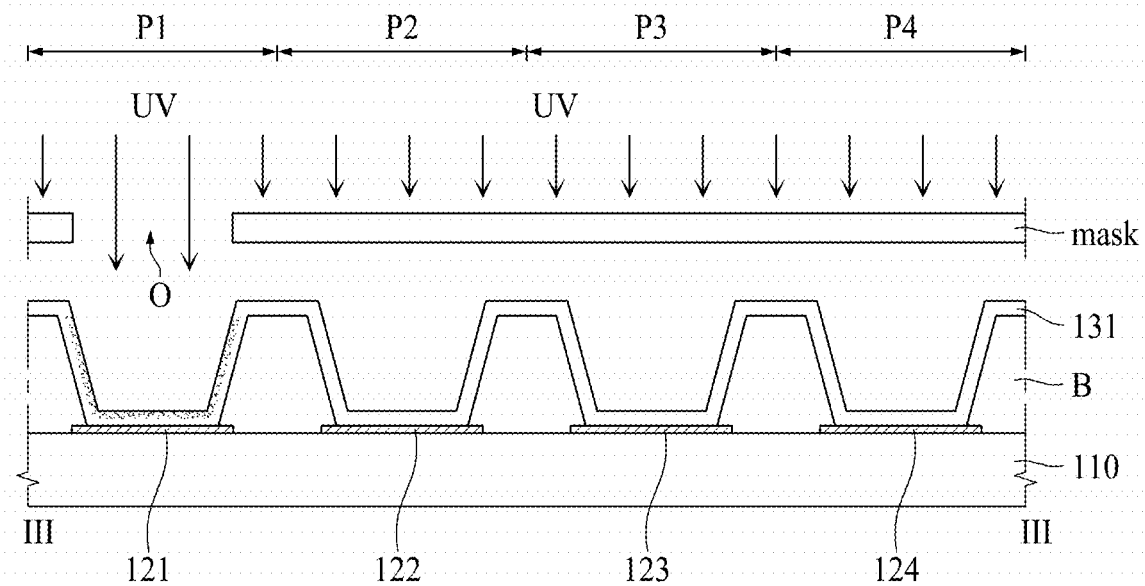

Then, as shown in FIG. 19D, UV is irradiated to only the first subpixel P1. A mask is arranged in the second, third and fourth subpixels P2, P3 and P4, and an open area O of the mask is arranged in the first subpixel P1. In this state, UV is irradiated to only the second photo chromic electron transporting layer PC-ETL arranged in the first subpixel P1. Therefore, the second photo chromic electron transporting layer PC-ETL of the first pixel light emitting layer 131 arranged in the first subpixel P1 is changed to an isomer having physical or chemical characteristic different from that of the second photo chromic electron transporting layer PC-ETL of the first pixel light emitting layer 131 arranged in the second, third and fourth subpixels P2, P3 and P4.

Figure 19E:
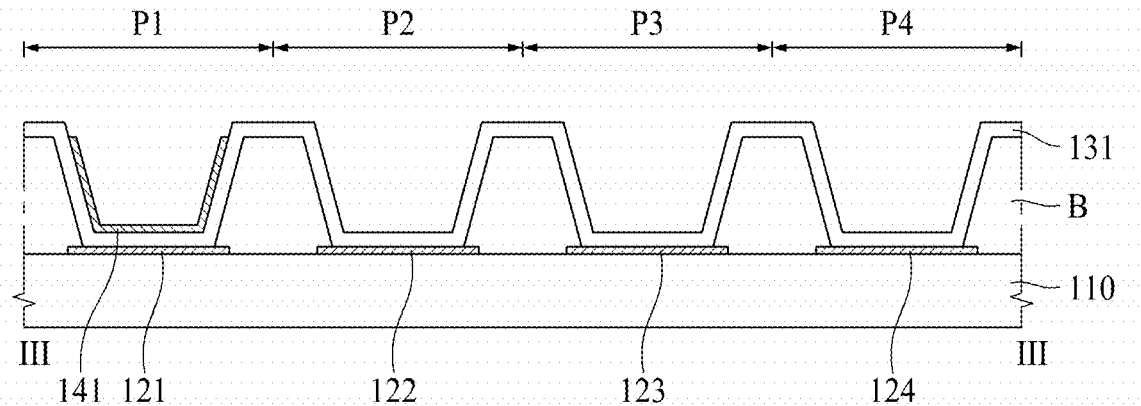

Then, as shown in FIG. 19E, the first upper electrode 141 is formed to be patterned in the first subpixel P1. The second photo chromic electron transporting layer PC-ETL of the first pixel light emitting layer 131 to which UV has been irradiated is subjected to nucleation and thus has a high deposition rate of a metal material. That is, a metal material may well be deposited on the photoisomerized material to which UV has been irradiated. On the other hand, the second photo chromic electron transporting layer PC-ETL of the first pixel light emitting layer 131 to which UV has not been irradiated is subjected to desorption and thus has a low deposition rate of a metal material. That is, a metal material may not be well deposited on the photoisomerized material to which UV has not been irradiated. As a result, the first upper electrode 141 is formed to be patterned on only the second photo chromic electron transporting layer PC-ETL of the first pixel light emitting layer 131 arranged in the first subpixel P1.

Next, the fourth pixel light emitting layer 134 and the fourth upper electrode 144 are formed to be patterned in the second, third and fourth subpixels P2, P3 and P4.

Figure 19F:
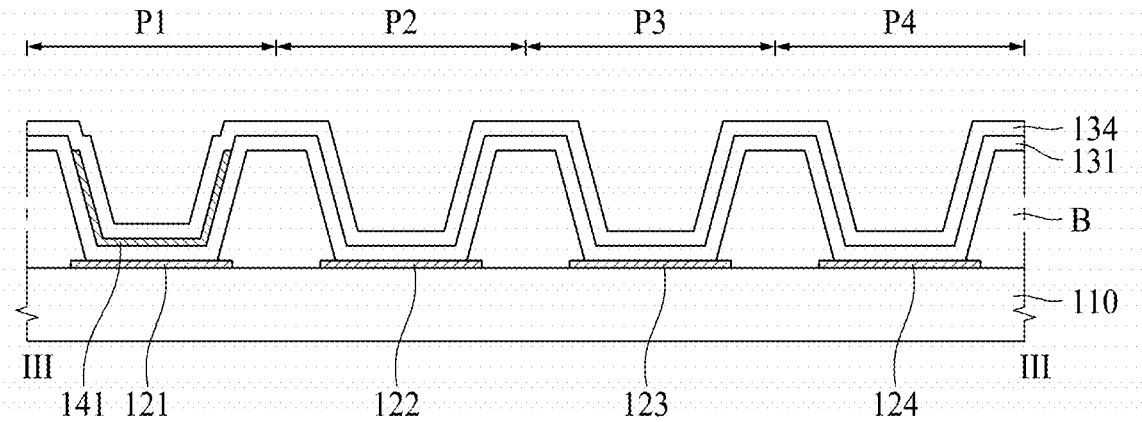

In more detail, as shown in FIG. 19F, the fourth pixel light emitting layer 134 is formed on the first upper electrode 141 and the first pixel light emitting layer 131. The fourth pixel light emitting layer 134 may be formed by a deposition process or a solution process. If the fourth pixel light emitting layer 134 is formed by a deposition process, an evaporation method may be used.

The fourth pixel light emitting layer 134 includes a hole transporting layer HTL, a fourth light generating layer EML4 for emitting light of a fourth color different from the first color, a first electron transporting layer ETL, and a second photo chromic electron transporting layer PC-ETL. The fourth color may be, but not limited to, yellow-green (YG).

Figure 19G:
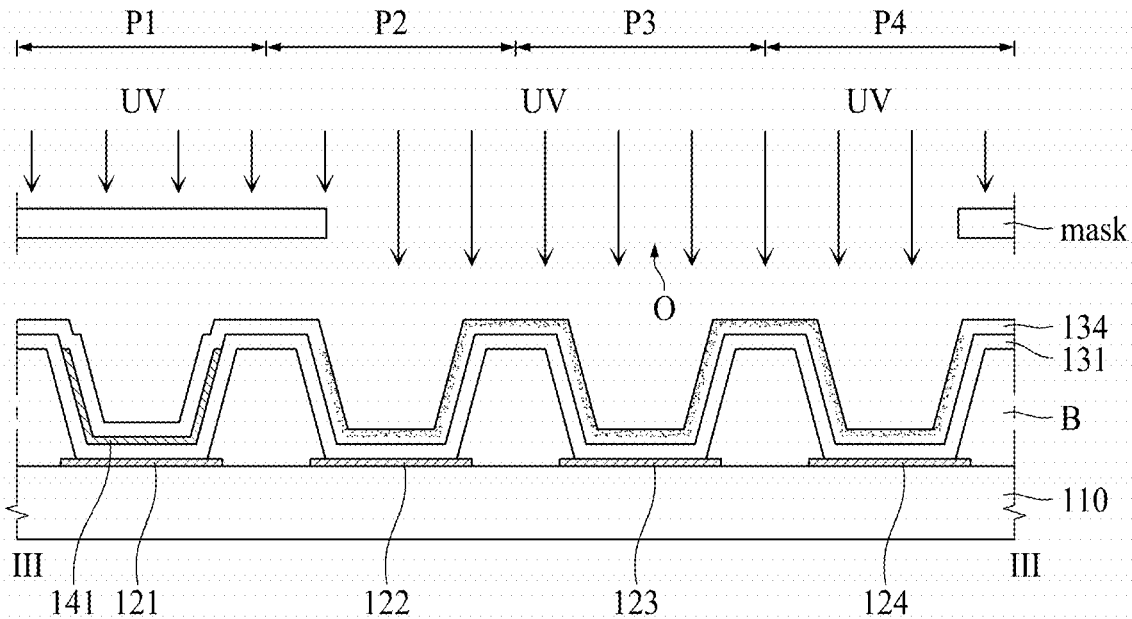

Then, as shown in FIG. 19G, UV is irradiated to only the second, third and fourth subpixels P2, P3 and P4. A mask is arranged in the first subpixel P1, and an open area O of the mask is arranged in the second, third and fourth subpixels P2, P3 and P4. In this state, UV is irradiated to only the second photo chromic electron transporting layer PC-ETL arranged in the second, third and fourth subpixels P2, P3 and P4. Therefore, the second photo chromic electron transporting layer PC-ETL of the fourth pixel light emitting layer 134 arranged in the second, third and fourth subpixels P2, P3 and P4 is changed to an isomer having physical or chemical characteristic different from that of the second photo chromic electron transporting layer PC-ETL of the fourth pixel light emitting layer 134 arranged in the first subpixel P1.

Figure 19H:
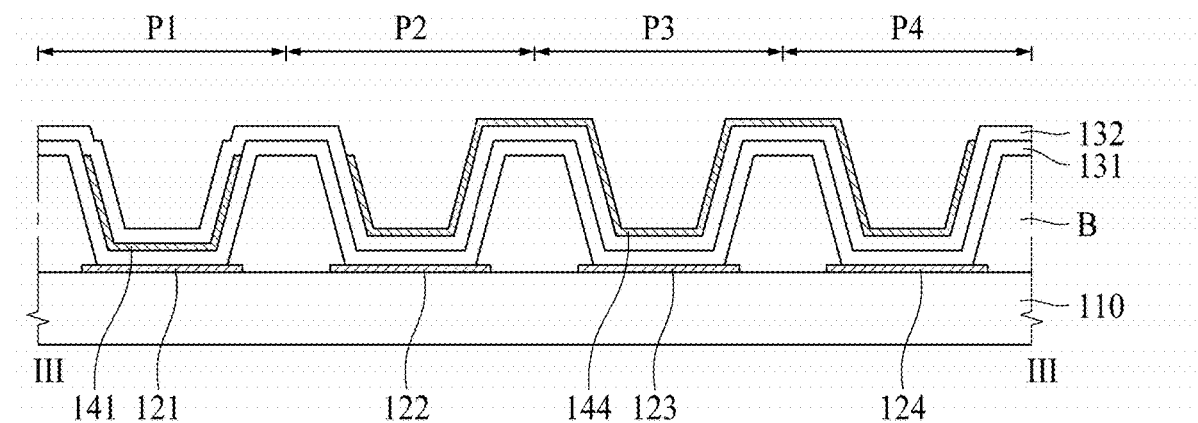

Then, as shown in FIG. 19H, the fourth upper electrode 144 is formed to be patterned in the second, third and fourth subpixels P2, P3 and P4. The second photo chromic electron transporting layer PC-ETL of the fourth pixel light emitting layer 134 to which UV has been irradiated is subjected to nucleation and thus has a high deposition rate of a metal material. That is, a metal material may well be deposited on the photoisomerized material to which UV has been irradiated. On the other hand, the second photo chromic electron transporting layer PC-ETL of the fourth pixel light emitting layer 134 to which UV has not been irradiated is subjected to desorption and thus has a low deposition rate of a metal material. That is, a metal material may not be well deposited on the photoisomerized material to which UV has not been irradiated. As a result, the fourth upper electrode 144 is formed to be patterned on only the second photo chromic electron transporting layer PC-ETL of the fourth pixel light emitting layer 134 arranged in the second, third and fourth subpixels P2, P3 and P4.

Figure 19I:
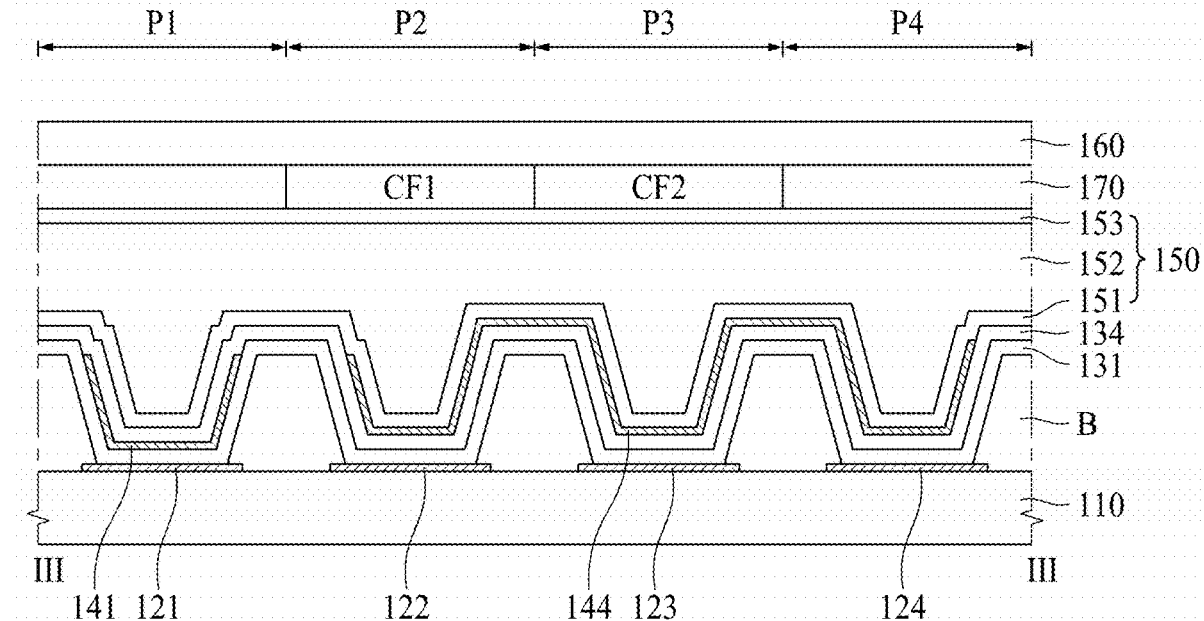

Then, as shown in FIG. 19I, an encapsulation layer 150, a color filter 170 and a second substrate 160 are formed on the fourth pixel light emitting layer 134 and the fourth upper electrode 144.

In more detail, a first inorganic film 151 is formed on the fourth pixel light emitting layer 134 and the fourth upper electrode 144. The first inorganic film 151 may be formed of a silicon nitride, an aluminum nitride, a zirconium nitride, a titanium nitride, a hafnium nitride, a tantalum nitride, a silicon oxide, an aluminum oxide, or a titanium oxide. The first inorganic film 151 may be deposited by, but not limited to, a Chemical Vapor Deposition (CVD) method or an Atomic Layer Deposition (ALD) method.

Then, the organic film 152 is formed on the first inorganic film 151. The organic film 152 may be formed of an organic material, for example, acrylic resin, epoxy resin, phenolic resin, polyamide resin, or polyimide resin.

Then, a second inorganic film 153 is formed on the organic film 152. The second inorganic film 153 may be formed of a silicon nitride, an aluminum nitride, a zirconium nitride, a titanium nitride, a hafnium nitride, a tantalum nitride, a silicon oxide, an aluminum oxide, or a titanium oxide. The second inorganic film 153 may be deposited by, but not limited to, a Chemical Vapor Deposition (CVD) method or an Atomic Layer Deposition (ALD) method.

Then, the first color filter CF1 and the second color filter CF2 are formed on the second inorganic film 153. The first color filter CF1 is arranged to correspond to the second subpixel P2, and the second color filter CF2 is arranged to correspond to the third subpixel P3.

Then, the second substrate 160 is formed on the first color filter CF1 and the second color filter CF2.

The display device 100 according to the third aspect of the present disclosure described as above is characterized in that it comprises the second photo chromic electron transporting layer made of an electron transporting material and a photoisomerized material in each of the first pixel light emitting layer 131 and the fourth pixel light emitting layer 134. In the display device 100 according to the third aspect of the present disclosure, UV is selectively irradiated to the second photo chromic electron transporting layer to change the characteristic of the photoisomerized material such that the metal material may well be deposited on the photoisomerized material. As the upper electrode 140 is selectively deposited on the second photo chromic electron transporting layer to which UV has been irradiated, the first and fourth upper electrodes 141 and 144 are respectively formed to be patterned on the first pixel light emitting layer 131 and the fourth pixel light emitting layer 134.

In the display device 100 according to the third aspect of the present disclosure, the first and fourth upper electrodes 141 and 144 may be formed to be patterned even without FMM. Therefore, in the display device 100 according to the third aspect of the present disclosure, the upper electrode 140 may be formed to be patterned accurately. Also, in the display device 100 according to the third aspect of the present disclosure, the cost caused by use and maintenance of the FMM may be reduced.

In the display device 100 according to the third aspect of the present disclosure, the first and fourth upper electrodes 141 and 144 may be formed to be patterned even without photoresist. Therefore, in the display device 100 according to the third aspect of the present disclosure, the light emitting layer 130 and the upper electrode 140 may be prevented from being damaged during a manufacturing process. In the display device 100 according to the third aspect of the present disclosure, lifespan and efficiency of the light emitting diode may be improved.

Also, in the display device 100 according to the third aspect of the present disclosure, since a plasma ashing process may be omitted as compared with the display device according to the first and second aspects of the present disclosure, the manufacturing process may be simplified.

Also, in the display device 100 according to the third aspect of the present disclosure, a separate color filter may not be arranged on some subpixels. Light emitted from the light emitting layer 130 has reduced luminance while passing through the color filter. Particularly, luminance of blue (B) light is reduced more seriously than light of the other colors while passing through the blue color filter. In the display device 100 according to the third aspect of the present disclosure, since the blue color filter is omitted, luminance for light of the blue (B) color may be improved.

Figure 20A:
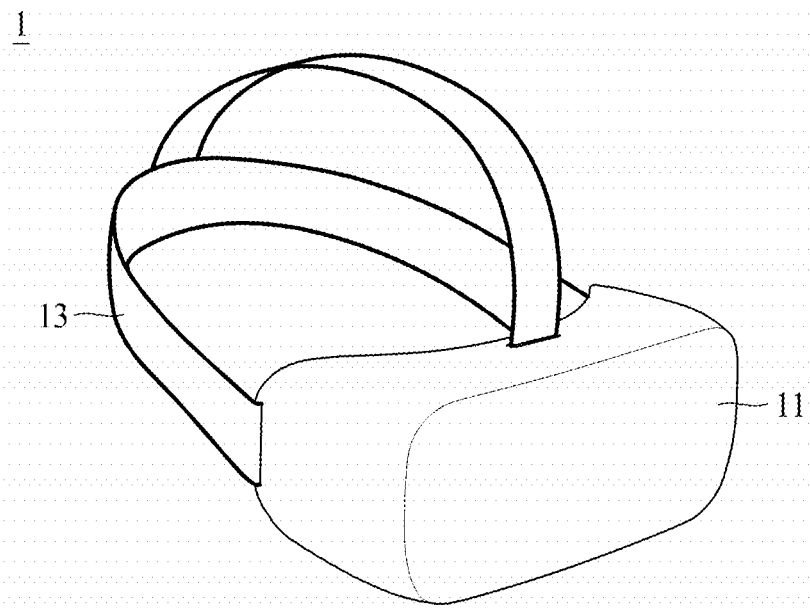
FIGS. 20A to 20C are views illustrating a display device according to other aspect of the present disclosure, and relate to a head-mounted display (HMD) device.
Figure 20B:
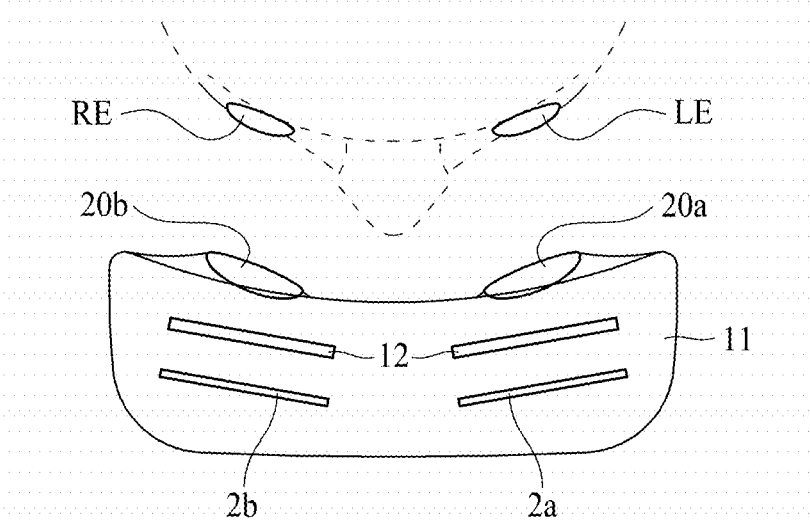
Figure 20C:
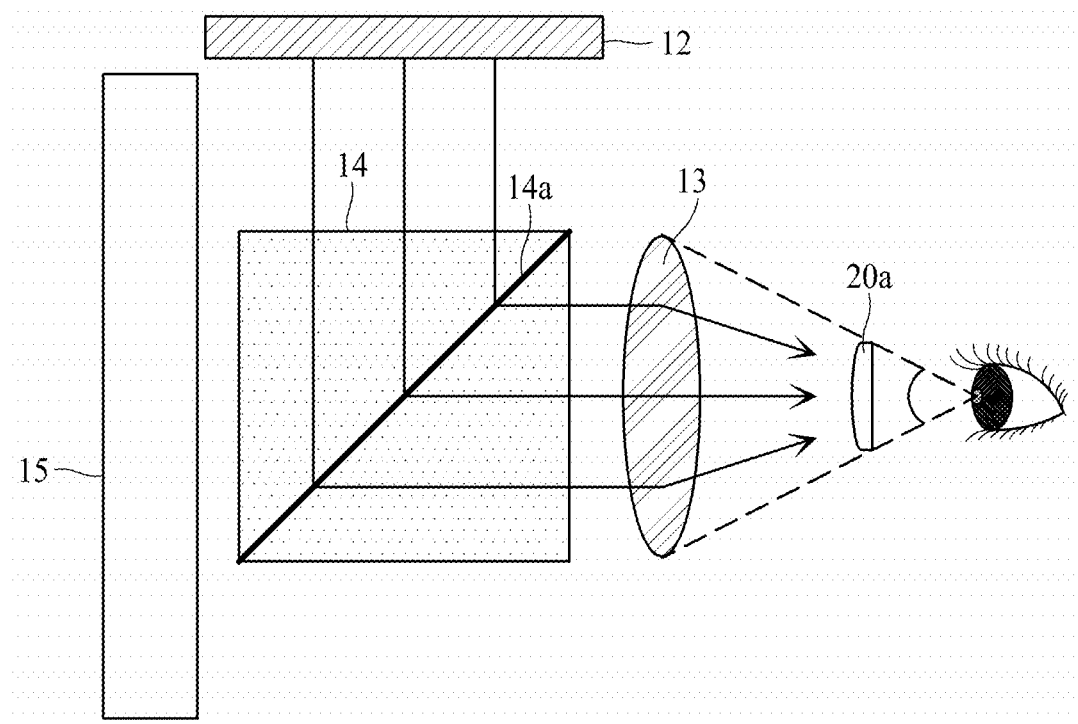

FIGS. 20A to 20C are views illustrating a display device according to other aspect of the present disclosure, and relate to a head-mounted display (HMD) device. FIG. 20A is schematic perspective view, FIG. 20B is a schematic plane view of a virtual reality (VR) structure, and FIG. 20C is a schematic cross-sectional view of an augmented reality (AR) structure.

As will be aware of it from FIGS. 20A and 20B, a head mounted display device 1 of a virtual reality (VR) structure to which a display device according to one aspect of the present disclosure is applied comprises a storage case 11, a left eye ocular lens 20a, a right eye ocular lens 20b, a lens array 12 and a head mounted band 13.

The storage case 11 stores the display device 2, and provides the left eye ocular lens 20a and the right eye ocular lens 20b with images of the display device 2. The display device 2 may be the display device according to one aspect of the present disclosure.

The storage case 11, as shown in FIG. 20B, may include a left eye display device 2a arranged in front of the left eye ocular lens 20a and a right eye display device 2b arranged in front of the right eye ocular lens 20b.

The left eye display device 2a and the right eye display device 2b may display the same image, and in this case, a user may view 2D image. Alternatively, the left eye display device 2a may display a left eye image and the right eye display device 2b may display a right eye image, and in this case, a user may view a 3D image.

Each of the left eye display device 2a and the right eye display device 2b may be comprised of a display device according to FIGS. 1 to 19 described above.

Meanwhile, the storage case 11 may further include a lens array 12 arranged between the left eye display device 2a and the left eye ocular lens 20a and between the right eye display device 2b and the right eye ocular lens 20b. The lens array 12 may be a micro lens array. The lens array 12 may be replaced with a pin hole array. Due to the lens array 12, images displayed on the left eye display device 2a or the right eye display device 2b may be viewed to be magnified to a user.

A left eye LE of a user may be arranged in the left eye ocular lens 20a, and a right eye of a user may be arranged in the right eye ocular lens 20b. That is, the left eye ocular lens 20a and the right eye ocular lens 20b correspond to an ocular lens arranged in front of the display device 2.

The head mounted band 13 is fixed to the storage case 11. The head mounted band 13 is formed to surround a top surface and both sides of a user's head, but is not limited to this example. The head mounted band 13 is to fix a head mounted display to a user's head and may be formed in a shape of a glasses frame or a helmet shape.

Referring to FIG. 20C, a head mounted display device of an augmented reality (AR) structure according to the present disclosure includes a left eye display device 12, a lens array 13, a left eye ocular lens 20*a*, a transmissive reflection portion 14, and a transmissive window 15. Although only a structure for a left eye is shown in FIG. 20*c* for convenience, a structure for a right eye is the same as the structure for the left eye.

The left eye display device 12, the lens array 13, the left eye ocular lens 20*a*, the transmissive reflection portion 14, and the transmissive window 15 are stored in the aforementioned storage case 11.

The left eye display device 12 may be arranged at one side of the transmissive reflection portion 14, for example, at an upper side, without covering the transmissive window 15. Therefore, the left eye display device 12 may provide the transmissive reflection portion 14 with an image without covering an outer background viewed through the transmissive window 15.

The left eye display device 12 may be comprised of a display device according to FIGS. 1 to 19 described above. In this case, the top portion corresponding to the surface where images are displayed in FIGS. 1 to 19, for example, the second substrate 160 faces the transmissive reflection portion 14.

The lens array 13 may be provided between the left eye ocular lens 20*a* and the transmissive reflection portion 14.

A left eye of a user is arranged in the left eye ocular lens 20*a*.

The transmissive reflection portion 14 is arranged between the lens array 13 and the transmissive window 15. The transmissive reflection portion 14 may include a reflection surface 14*a* which transmits a portion of light and reflects another portion of light. The reflection surface 14*a* is formed to make an image displayed on the left eye display device 12 to proceed to the lens array 13. Therefore, a user may view all of images displayed on the left eye display device 12 and an outer background through the transmissive window 15. That is, since the user may view one image by overlapping background in reality with virtual images, augmented reality (AR) may be embodied.

The transmissive window 15 is arranged in front of the transmissive reflection portion 14.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A display device comprising:
    a first substrate having a display area where a plurality of subpixels including a first subpixel, a second subpixel and a third subpixel are arranged, and a bezel area provided on the display area;
    a lower electrode disposed in each of the plurality of subpixels on the first substrate;
    a light emitting layer provided on the lower electrode and comprising at least one pixel light emitting layer; and
    an upper electrode disposed on the light emitting layer,
    wherein the at least one pixel light emitting layer comprises:
    a hole transporting layer;
    a light generating layer disposed on the hole transporting layer; and
    a first electron transporting layer disposed on the light generating layer,
    wherein the first electron transporting layer includes a photoisomerized material and a first electron transporting material,
    wherein the photoisomerized material is a photo chromic material,
    wherein the upper electrode includes a first upper electrode provided in the first subpixel, a second upper electrode provided in the second subpixel, and a third upper electrode in the third subpixel,
    wherein the first upper electrode, the second upper electrode and the third upper electrode vertically overlap with one another in the bezel area and are electrically connected.

2. The display device according to claim 1, wherein the photoisomerized material has a deposition rate of a metal material, which is varied with a light exposure.

3. The display device according to claim 1, wherein the first electron transporting layer is in contact with the upper electrode.

4. The display device according to claim 1, wherein the pixel light emitting layer further comprises a second electron transporting layer including a second electron transporting material and disposed between the light generating layer and the first electron transporting layer.

5. The display device according to claim 4, wherein the second electron transporting layer is doped with an n-type dopant.

6. The display device according to claim 1, wherein the pixel light emitting layer further comprises a hole injection layer disposed between the lower electrode and the hole transporting layer.

7. The display device according to claim 6, wherein the hole injection layer is doped with a p-type dopant.

8. The display device according to claim 1, wherein the light generating layer of the pixel light emitting layer disposed in the first subpixel emits light of a first color, the light generating layer of the pixel light emitting layer disposed in the second subpixel emits light of a second color different from the first color, and the light generating layer of the pixel light emitting layer disposed in the third subpixel emits light of a third color different from the first color and the second color.

9. The display device according to claim 8, wherein the plurality of subpixels further includes a fourth subpixel, and the light generating layer of the pixel light emitting layer disposed in the fourth subpixel emits white light different from the first color, the second color and the third color.

10. The display device according to claim 8, further comprising a bank disposed on the first substrate to cover an edge of the lower electrode in each of the plurality of subpixels, wherein the pixel light emitting layer and the upper electrode of each of the first subpixel, the second subpixel and the third subpixel are only provided on an upper surface of the lower electrode and a side of the bank or provided on an upper surface of the lower electrode and a side and a portion of an upper surface of the bank.

11. The display device according to claim 8, wherein the pixel light emitting layer is disposed in each of the first subpixel, the second subpixel and the third subpixel.

12. The display device according to claim 8, wherein the first subpixel, the second subpixel and the third subpixel have stack structures different from one another.

13. The display device according to claim 12, wherein the light emitting layer in the first subpixel has one-stack structure in which the pixel light emitting layer emitting light of the first color is provided;
the light emitting layer in the second subpixel has a tandem structure of two stacks in which the pixel light emitting layer emitting light of the first color and the pixel light emitting layer for emitting light of the second color are provided and the pixel light emitting layer for emitting light of the second color is provided on the pixel light emitting layer emitting light of the first color; and
the light emitting layer in the third subpixel has a tandem structure of three stacks in which the pixel light emitting layer for emitting light of the first color, the pixel light emitting layer for emitting light of the second color and the pixel light emitting layer for emitting light of the third color are provided, the pixel light emitting layer for emitting light of the second color is provided on the pixel light emitting layer for emitting light of the first color, and the pixel light emitting layer emitting light of the third color is provided on the pixel light emitting layer for emitting light of the second color.

14. The display device according to claim 13, wherein the pixel light emitting layer emitting light of the second color and the pixel light emitting layer emitting light of the third color are provided on the upper electrode of the first subpixel; and the pixel light emitting layer emitting light of the third color is provided on the upper electrode of the second subpixel.

15. The display device according to claim 8, wherein the pixel light emitting layer emitting light of the first color, the pixel light emitting layer emitting light of the second color and the pixel light emitting layer emitting light of the third color are spaced apart from one another in the display area and overlap one another in the bezel area.

16. The display device according to claim 8, wherein the upper electrode of each of the first subpixel, the second subpixel and the third subpixel is spaced apart from one another in the display area and overlaps one another in the bezel area.

17. The display device according to claim 16, wherein the pixel light emitting layer emitting light of the first color, the pixel light emitting layer emitting light of the second color and the pixel light emitting layer emitting light of the third color, and the upper electrode of each of the first subpixel, the second subpixel and the third subpixel overlap one another in the bezel area.

18. The display device according to claim 8, wherein the upper electrode and the electron transporting layer of the pixel light emitting layer in each of the first subpixel, the second subpixel and the third subpixel have a same formation area in the display area.

19. The display device according to claim 3, wherein the plurality of subpixels further include a fourth subpixel, the light emitting layer comprises a first common pixel light emitting layer having the light generating layer for emitting light of a first color and a second common pixel light emitting layer having the light generating layer for emitting light of a second color different from the first color, the first common pixel light emitting layer and the second common pixel light emitting layer are provided in the first subpixel, the second subpixel, the third subpixel and the fourth subpixel.

20. The display device according to claim 19, wherein the upper electrode is provided between the first common pixel light emitting layer and the second common pixel light emitting layer in the first subpixel, the second common pixel light emitting layer is directly provided on the first common pixel light emitting layer in the second subpixel, the third subpixel and the fourth subpixel.

21. The display device according to claim 20, further comprising a first color filter corresponding to the second subpixel and a second color filter corresponding to the third subpixel.

22. The display device according to claim 21, further comprising an encapsulation layer is provided to cover the upper electrode, wherein the first color filter and the second color filter are disposed on the encapsulation layer.

23. The display device according to claim 1, wherein the photoisomerized material is a photo chromic material including a diarylethene based compound.

24. A head-mounted display device comprising:
a left eye display device and a right eye display device, each comprising a first substrate having a display area where a plurality of subpixels including a first subpixel, a second subpixel and a third subpixel are arranged, and a bezel area provided on the display area; a lower electrode disposed in each of the plurality of subpixels on the first substrate; a light emitting layer disposed on the lower electrode and comprising at least one pixel light emitting layer; and an upper electrode disposed on the light emitting layer;
a storage case accommodating the display device;
a left eye ocular lens coupled with the left eye display device display for displaying a left eye image;
a right eye ocular lens coupled with the right eye display device display for displaying a right eye image;
a lens array each disposed between the left eye display device and the left eye ocular lens and between the right eye display device and the right eye ocular lens; and
a head mounted band attached to the storage case,
wherein the at least one pixel light emitting layer comprises:
a hole transporting layer;
a light generating layer disposed on the hole transporting layer; and
a first electron transporting layer disposed on the light generating layer,
wherein the first electron transporting layer includes a photoisomerized material and a first electron transporting material,
wherein the photoisomerized material is a photo chromic material,
wherein the upper electrode includes a first upper electrode provided in the first subpixel, a second upper electrode provided in the second subpixel, and a third upper electrode in the third subpixel, and
wherein the first upper electrode, the second upper electrode and the third upper electrode vertically overlap with one another in the bezel area and are electrically connected.

25. A method for manufacturing a display device comprising:
providing a first substrate having a display area where a plurality of subpixels including a first subpixel, a second subpixel and a third subpixel are arranged, and a bezel area provided on the display area;

providing a lower electrode in each of the plurality of subpixels on the first substrate;

providing a light emitting layer comprising at least one pixel light emitting layer on the lower electrode; and providing an upper electrode on the light emitting layer, wherein the at least one pixel light emitting layer comprises:

a hole transporting layer;

a light generating layer disposed on the hole transporting layer; and a first electron transporting layer disposed on the light generating layer, wherein the first electron transporting layer includes a photoisomerized material and a first electron transporting material, wherein the photoisomerized material is a photo chromic material, wherein the upper electrode includes a first upper electrode provided in the first subpixel, a second upper electrode provided in the second subpixel, and a third upper electrode in the third subpixel, and wherein the first upper electrode, the second upper electrode and the third upper electrode vertically overlap with one another in the bezel area and are electrically connected.

26. The method for manufacturing a display device according to claim 25, wherein the providing an upper electrode on the light emitting layer comprises:

exposing a specific area of the light emitting layer including the photoisomerized material to light; and depositing metal material on the specific area of the light emitting layer to provide the upper electrode on the light emitting layer.

27. The method for manufacturing a display device according to claim 26, wherein the providing an upper electrode on the light emitting layer further comprises ashing the light emitting layer on which the upper electrode is not formed using oxygen plasma.

\* \* \* \* \*